US006743673B2

(12) United States Patent
Watanabe et al.

(10) Patent No.: US 6,743,673 B2
(45) Date of Patent: Jun. 1, 2004

(54) SEMICONDUCTOR INTEGRATED CIRCUITRY AND METHOD FOR MANUFACTURING THE CIRCUITRY

(75) Inventors: Kozo Watanabe, Kokubunji (JP); Atsushi Ogishima, Tachikawa (JP); Masahiro Moniwa, Sayama (JP); Syunichi Hashimoto, Hitachi (JP); Masayuki Kojima, Kokubunji (JP); Kiyonori Ohyu, Ome (JP); Kenichi Kuroda, Tachikawa (JP); Nozomu Matsuda, Akishima (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 10/145,810

(22) Filed: May 16, 2002

(65) Prior Publication Data

US 2002/0137281 A1 Sep. 26, 2002

Related U.S. Application Data

(62) Division of application No. 09/381,345, filed on Sep. 20, 1999, now Pat. No. 6,503,794.

(30) Foreign Application Priority Data

Apr. 10, 1997 (JP) .............................................. 9-092607
Apr. 10, 1997 (JP) .............................................. 9-092608

(51) Int. Cl.[7] ............................................ H01L 21/8242
(52) U.S. Cl. ........................................ 438/253; 438/197
(58) Field of Search ................................ 438/197, 210, 438/239, 241, 253, 381, 396, 624, 738, 739

(56) References Cited

U.S. PATENT DOCUMENTS 5,364,804 A 11/1994 Ho et al. .................... 438/595
5,389,558 A * 2/1995 Suwanai et al. ............ 438/396
6,037,207 A * 3/2000 Asano et al. ............... 438/241
6,169,324 B1 1/2001 Sugiura et al. ............. 257/678
6,503,794 B1 * 1/2003 Watanabe et al. ........... 438/253

FOREIGN PATENT DOCUMENTS

JP 3-276729 12/1991
JP 8-139314 5/1996

* cited by examiner

*Primary Examiner*—David Nhu
(74) *Attorney, Agent, or Firm*—Antonelli, Terry, Stout & Kraus, LLP

(57) ABSTRACT

A technology for a semiconductor integrated circuitry allows each of the DRAM memory cells to be divided finely so as to be more highly integrated and operate faster. In a method of manufacturing such a semiconductor integrated circuit, at first, gate electrodes 7 are formed via a gate insulating film 6 on the main surface of a semiconductor substrate 1, and on side surfaces of each of the gate electrodes there is formed a first side wall spacer 14 composed of silicon nitride and a second side wall spacer 15 composed of silicon oxide. Then, in the selecting MISFET Qs in the DRAM memory cell area there are opened connecting holes 19 and 21 in a self-matching manner with respect to the first side wall spacers 14 and connecting portion is formed connecting a conductor 20 to a bit line BL. In addition, in the N channel MISFETs Qn1 and Qn2, and in the P channel MISFET Qp1 in areas other than the DRAM memory cell area, high density N-type semiconductor areas 16 and 16*b* are formed, as well as a high density P-type semiconductor area 17 is formed in a self-matching manner with respect to the second side wall spacers 15.

11 Claims, 84 Drawing Sheets

SEMICONDUCTOR INTEGRATED CIRCUITRY AND METHOD FOR MANUFACTURING THE CIRCUITRY

This is a divisional of application Ser. No. 09/381,345, filed Sep. 20, 1999, now U.S. Pat. No. 6,503,794 the entire disclosure of which is hereby incorporated by reference.

TECHNICAL FIELD

The present invention relates to semiconductor integrated circuitry and to a technology for manufacturing semiconductor integrated circuitry; and more particularly, the present invention relates to a technology effectively applicable for realizing higher integration and higher performance of a DRAM (Dynamic Random Access Memory) or an electrically reloadable nonvolatile memory, or for a highly integrated semiconductor circuit provided with a logic circuit and a DRAM or an electrically reloadable nonvolatile memory.

BACKGROUND OF THE INVENTION

There is a DRAM used as a semiconductor memory representing a large capacity memory. The memory capacity of this DRAM is increasing more and more, and, under the circumstances, it has become necessary to reduce the area occupied by the memory cells to improve the degree of integration of the DRAM.

However, the storage capacity of an information storing capacity element (capacitor) in DRAM memory cells must be fixed to a certain value regardless of the generation when in taking the DRAM operation margin, software errors, etc. into consideration. Generally, it is known that the storage capacity cannot be reduced proportionally.

This is why there is now under development a capacitor structure that can secure a storage capacity necessary in a limited small occupation area. As such a capacitor structure, for example, there has been adopted a three-dimensional capacitor, such as a so-called stacked capacitor composed of two-layer electrodes composed of polysilicon, etc. and stacked via a capacity insulating film.

A stacked capacitor is generally composed of capacitor electrodes disposed in the upper layer of a memory cell selecting MISFET (Metal Insulator Semiconductor Field Effect Transistor). In this case, a small occupied area can secure a large storage capacity, as well as only a small storage capacity, as needed.

As such a stacked capacitor structure, for example, there are a so-called capacitor over bit-line (hereafter, to be abbreviated as COB) structure, in which a capacitor is disposed over the bit-line, and a capacitor under bit-line (hereafter, to be abbreviated as CUB) structure, in which a capacitor is disposed under the bit-line.

In a DRAM having such a COB/CUB structure, capacitor connecting holes must be formed so that a conductor film or a bit-line in each capacitor connecting hole is not short-circuited with a word-line. Thus, the interval between adjacent word-lines must be widened to cope with connecting hole positioning failures. And, this hinders improvement of the degree of integration of elements, as well as a reduction of the chip sizes. In order to realize high integration, therefore, high technology of positioning and alignment, as well as process management, are needed.

In order to solve these problems and meet certain requirements, there is proposed a technology for forming capacitor connecting holes and bit-line connecting holes by etching in a self-matching manner with respect to the word-lines by covering the top and side surfaces of the word-lines using an insulating material different in type from an interlaminar insulating film, such as a nitride film, etc.

In the case of such a technology, when capacitor connecting holes and bit-line connecting holes are formed by etching, it is possible to prevent the word-lines from being exposed from the connecting holes, even when the connecting holes overlap the word-lines, since the nitride film around the word-lines functions as an etching stopper. Thus, the connecting holes can be formed properly.

The technology for forming capacitor connecting holes and bit-line connecting holes in a self-matching manner with respect to the word-lines is disclosed in the official report of Unexamined Published Japanese Patent Application No. 9-55479.

Under the circumstances, the present inventor has examined the technology for forming the capacitor connecting holes and bit-line connecting holes in a self-matching manner with respect to the word-lines. The following technologies are not well-known, but have been examined by the present inventor. An outline of those technologies will be described below.

The DRAM described above is formed in the following process flow. At first, a conductor layer is formed on a semiconductor substrate via a gate insulating film. On the conductor film there is deposited a first nitride film. Then, the first nitride film and the conductor film are patterned using the same mask to form gate electrodes of the memory cell selecting MISFET and gate electrodes of the peripheral circuit MISFET. At this time, the gate electrodes of plural memory cells disposed in the row direction of the memory cell array are formed unitarily and function as a DRAM word line. Next, a low density semiconductor area is formed for the memory cell selecting MISFET and the peripheral circuit MISFET, respectively, in a self-matching manner with respect to the memory cell selecting MISFET and the peripheral circuit MISFET, respectively. Then, a second nitride film is deposited on the semiconductor substrate and anisotropic etching is carried out to form nitride film side wall spacers on side walls of the gate electrodes of both the memory cell selecting MISFET and the peripheral circuit MISFET. Then, a high density semiconductor area is formed for the peripheral circuit MISFET in a self-matching manner with respect to the side wall spacers. Thereafter, on the semiconductor substrate there is deposited an interlaminar insulating film composed of an oxide film, and bit-line and capacitor connecting holes are opened in the memory cell area in a self-matching manner with respect to word-lines. This process for opening the bit-line and capacitor connecting holes in this interlaminar insulating film is performed on conditions to increase the etching selection ratio of the nitride film composing side walls to the oxide film composing the interlaminar insulating film, so that the bit-line and capacitor connecting holes can be formed without exposing the word-lines.

On the other hand, in order to improve the degree of integration of the DRAM memory cells, the interval between word-lines must be minimized. When the second nitride film is deposited on the word-lines disposed at minimized intervals up to a specified film thickness or more, every space between word-lines in the memory cell area is filled completely with the second nitride film, so that the surface of the semiconductor substrate is not exposed even after anisotropic etching is carried out for the nitride film to form side wall spacers. Otherwise, a problem that the exposed area is very small and the contact resistance generated between the exposed area and each bit-line or capacitor electrode is increased significantly arises.

In addition, side wall spacers formed on side walls of the gate electrodes of both the memory cell selecting MISFET and the peripheral circuit MISFET determine the length of the low density semiconductor area of the peripheral circuit MISFET having an LDD structure. And, when this side wall spacer is reduced in width, problems arise in that the short channeling effect of the peripheral circuit MISFET becomes remarkable and the punched-through dielectric strength between source and drain is lowered. This is why the second nitride film for forming side wall spacers must have a thickness greater than a specified value.

In other words, in order to secure a specified performance of a MISFET, the LDD structure must be optimized. When the DRAM memory cell selecting MISFET is divided finely to reduce the width of the side wall spacer, the side wall spacer width must be greater than a specified value to prevent the high density semiconductor area of the peripheral circuit MISFET from being distributed over the low density semiconductor area. This means that the width of each side wall spacer has a lower limit.

On the other hand, when the memory array is divided finely, the interval between gate electrodes, that is, the interval between adjacent memory cell selecting MISFETs is narrowed accordingly. Thus, every portion to be connected in a self-matching manner is also reduced in width. When such a connecting area is narrowed, the contact resistance in the area is also increased significantly. Thus, the side wall spacer must be minimized in width. Such a requirement conflicts with a requirement for optimizing the LDD structure. And, in the worst case, when the LDD structure is optimized, adjacent side wall spacers are overlapped in the memory array area so that self-matching connections are disabled.

Under the circumstances, it is an object of the present invention to provide semiconductor integrated circuit technology for dividing DRAM memory cells finely so as to be more highly integrated and to make the operation faster in the semiconductor integrated circuitry provided with a DRAM.

It is another object of the present invention to provide a semiconductor integrated circuit technology for dividing memory cells finely so as to be more highly integrated and make the operation faster in the semiconductor integrated circuitry provided with a DRAM and an electrically reloadable nonvolatile memory.

It is still another object of the present invention to provide a technology for realizing a high performance semiconductor integrated circuit having a DRAM which exhibits excellent refreshing characteristics.

It is still another object of the present invention to provide a technology for realizing a semiconductor integrated circuit that can prevent the element isolating area on the semiconductor substrate from over-etching when opening the connecting holes to improve the reliability of the semiconductor integrated circuitry.

It is still another object of the present invention to provide a technology for simplifying the method of manufacturing a semiconductor integrated circuit provided with a DRAM and an electrically reloadable nonvolatile memory.

It is still another object of the present invention to provide a technology for realizing a semiconductor integrated circuit, which can divide DRAM cells finely so as to be more highly integrated and improve the reliability of the peripheral circuit MISFET.

It is still another object of the present invention to provide a technology for forming connecting holes in a self-matching manner even in a highly integrated DRAM memory cell area and to prevent the element isolating area at the bottom of each of the connecting holes from over-etching.

It is still another object of the present invention to provide a technology for improving the connecting hole treatment margin when the connecting holes are formed in a self-matching manner and for preventing the element isolating area at the bottom of each connecting hole from over-etching.

It is still another object of the present invention to provide a technology for suppressing an increase in the number of processes required when the connecting holes are formed in a self-matching manner and the element isolating area at the bottom of each connecting hole is prevented from over-etching.

It is still another object of the present invention to provide a technology for integrating a semiconductor integrated circuit more highly and for improving the refreshing characteristics of the DRAM and the transistor characteristics of the memory cell area.

The above and other objects and novel features of the present invention will fully appear from the description provided by this specification and from the accompanying drawings.

SUMMARY OF THE INVENTION

Of the various aspects of the present invention disclosed in this specification, representative ones will be summarized as follows.

(1) The semiconductor integrated circuit of the present invention comprises a first MISFET including gate electrodes formed on the main surface of a semiconductor substrate via a gate insulating film and a semiconductor area which is in contact with a channel area on the main surface of the semiconductor substrate under the gate electrodes; and a second MISFET including gate electrodes formed on the main surface of a semiconductor substrate via a gate insulating film and a low density semiconductor area in contact with a channel area on the main surface of the semiconductor substrate under the gate electrodes and a high density semiconductor area formed outside the low density semiconductor area, wherein a cap insulating film is formed on top of the first and second MISFET gate electrodes, first side walls composed of a first insulating film are formed on side surfaces of the second MISFET gate electrodes, and second side walls composed of a second insulating film, which is of a different material from that of the first insulating film, are formed outside the first side walls. Then, a conductor portion connecting the first MISFET semiconductor area to a member formed in the upper layer of the first MISFET is formed in a self-matching manner with respect to third side walls formed with the first insulating film, and the second MISFET high density semiconductor is formed in a self-matching manner with respect to the second side walls formed with the second insulating film.

According to the above-described semiconductor integrated circuitry, since the first and second insulating films are formed on side surfaces of the gate electrodes, the connecting portion connecting a member formed in the upper layer of the first MISFET is formed in a self-matching manner with respect to the third side walls formed with the first insulating film, and the second MISFET high density semiconductor area is formed in a self-matching manner with respect to the second side walls formed with the second insulating film, the degree of integration and the performance of the semiconductor integrated circuitry can be improved significantly.

In other words, the third side walls formed with the first insulating film can secure the self-matching properties of the conductor portion used to connect the first MISFET semiconductor area to the member formed in the upper layer of the first MISFET, while the second side walls formed with the second insulating film can optimize the position of the high density semiconductor area necessary to form a so-called LDD of the second MISFET, so that the second MISFET can maintain a high performance satisfactorily. In other words, the first insulating film may be, for example, a silicon nitride film, which is a material having an etching selection ratio for the silicon oxide film, which is a material of general interlaminar insulating films, and the second insulating film may be a silicon oxide film that can block implanted ions necessary for forming an LDD. And, the second insulating film does not disturb self-matching connection for the first MISFET. On the other hand, the first and second insulating films can function as effective spacers for forming the LDD. Consequently, as for the first insulating film, there is no need to take any space into consideration when designing an LDD structure and it is only necessary to make the second insulating film thick enough to realize the self-matching connection. Thus, the second insulating film can be reduced in thickness to allow the first MISFET to be integrated more highly. On the other hand, as for the second insulating film, there is no need to take the interval between gate electrode wirings in the first MISFET forming area into consideration. Thus, side wall spacers can be formed with a film thickness sufficient to maintain the second MISFET performance, so that the performance of the second MISFET can be improved more significantly.

The first insulating film can be used for the first and third side wall spacers composed of a silicon nitride film formed on side surfaces of the gate electrodes, and the second insulating film can be used for the second side wall spacers composed of a silicon oxide film formed on side surfaces of the gate electrodes with a first side wall spacer disposed therebetween, respectively.

The first insulating film can be a silicon nitride film formed on the semiconductor substrate including side surfaces of the gate electrodes, and the second insulating film can be used for side wall spacers composed of a silicon oxide film formed on side surfaces of the gate electrodes with a silicon nitride film disposed therebetween, respectively. In such a case, when the connecting holes are opened for connecting each MISFET, the etching process can be divided into a first etching process for etching a silicon nitride film and a second etching process for etching a silicon nitride film, so that a silicon nitride film can be used as an etching stopper for the first etching process. When the etching process is divided into two stages in such a way, connecting holes can be opened surely in the first etching, and over-etching can be prevented in the second etching process.

Furthermore, the semiconductor integrated circuitry of the present invention includes an N channel MISFET and a P channel MISFET in the second MISFET and can have a C (Complementary) MISFET structure. According to such semiconductor integrated circuitry, a higher performance and a lower power consumption can be realized due to the MISFET structure, so that it is possible to form not only DRAM peripheral circuits, but also logic circuits using the second MISFET. Thus, the semiconductor integrated circuitry can have memory and logic circuits together.

(2) The semiconductor integrated circuitry of the present invention is as described in section (1), and the first MISFET is a DRAM selecting MISFET disposed in the DRAM cell memory array area and the member formed in the upper layer of the first MISFET is a DRAM storage capacitor or a bit line.

According to the semiconductor integrated circuitry, the DRAM memory cell integration degree is improved and the performance of the peripheral circuits formed with the second MISFET is improved, so that it is possible to realize a high speed high performance DRAM integrated circuit.

In addition, phosphorus is doped in the selecting MISFET semiconductor area as an impurity and at least arsenic can be doped in the low density or high density semiconductor area of the N channel MISFET of the second MISFET. In addition, the N channel MISFET can include the first N channel MISFET and a second N channel MISFET, and the first N channel MISFET can include an arsenic doped low density semiconductor area, a phosphorus doped high density semiconductor area, and a arsenic doped high density semiconductor area. In addition, the first N channel MISFET can include a semiconductor in which boron is doped in an area in contact with the high density semiconductor area under the low density semiconductor area, and the second N channel MISFET does not include any boron doped semiconductor area.

When phosphorus is doped in the selecting MISFET semiconductor area as an impurity in such a way, the selecting MISFET dielectric strength can be improved and the leakage current between the source and drain can be reduced to improve the refreshing characteristics of the DRAM. Furthermore, when arsenic is doped in both low density and high density semiconductor areas of the first N channel MISFET, the first N channel MISFET channel length can be shortened, and when phosphorus is doped in the low density semiconductor area and arsenic is doped in the high density semiconductor area of the second N channel MISFET, the dielectric strength of the second N channel MISFET can be improved significantly. Furthermore, since a boron-doped semiconductor area is formed in the first N channel MISFET so as to function as a punched-through stopper, the channel length can further be shortened, and since no punched-through stopper is provided in the second N channel MISFET, the dielectric strength of the MISFET can further be improved.

Furthermore, it can be expected that no silicide layer is formed on the surface of the selecting MISFET semiconductor area and that a silicide layer is formed on the surface of the high density semiconductor area. Since no silicide layer is formed on the surface of the selecting MISFET semiconductor area, the leakage between channels can be suppressed to form a DRAM having excellent refreshing characteristics, and since a silicide layer is formed on the surface of the high density semiconductor area, the resistance in the second MISFET connecting holes and the sheet resistance of the semiconductor area can be reduced to make the MISFET operation faster and improve the performance of the semiconductor integrated circuitry.

The selecting MISFET gate insulating film can be thicker than the second MISFET gate insulating film. Since the second MISFET gate insulating film is thinned in this way, the second MISFET channel length can be shortened, and since the selecting MISFET gate insulating film is thickened in this way, the dielectric strength of the MISFET can be improved to form a DRAM having excellent refreshing characteristics. Furthermore, when the second MISFET channel length is shortened, the semiconductor integrated circuitry can increase the MISFET driving current and enable its performance to be higher and its operation to be faster.

(3) The semiconductor integrated circuitry of the present invention is as described in section (1), and the first MISFET gate can be a floating gate type MISFET, where the insulating film is a tunnel insulating film. The floating gate type MISFET is disposed in the memory array area for nonvolatile memory cells including the gate electrodes, floating gates, and control gates formed on the floating electrodes via an insulating film.

According to this semiconductor integrated circuitry, just like the DRAM described in section (2), the memory array area for the nonvolatile memory cells can be highly integrated and the performance of the peripheral circuit MISFET of the nonvolatile memory composed of the second MISFET can be improved significantly.

The second MISFET gate insulating film can be thicker than the first MISFET gate insulating film. Since the second MISFET gate insulating film is thickened, the dielectric strength of the peripheral circuit MISFET of the nonvolatile memory driven with a general high voltage can be increased more significantly.

(4) The semiconductor integrated circuitry of the present invention includes both the DRAM and the nonvolatile memory as described in sections (2) and (3). In other words, the first MISFET includes both the selecting MISFET and the floating gate type MISFET.

According to this semiconductor integrated circuitry, the DRAM and the nonvolatile memory array area can be highly integrated and the peripheral or logic circuit area can also be highly integrated.

The DRAM bit line and the wiring formed in the upper layer of the floating gate type MISFET can be formed in the same process. Consequently, the number of processes can be reduced.

The insulating films of the selecting MISFET, the floating gate type MISFET, the peripheral circuit or logic circuit MISFET that drives the DRAM, and the peripheral circuit MISFET that drives the floating gate type MISFET differ in thickness from each other. And, it can be expected that the gate insulating film of the peripheral circuit MISFET that drives the floating gate type MISFET is thicker than that of the floating gate type MISFET, and the gate insulating film of the floating gate type MISFET is thicker than that of the selecting MISFET, and the selecting MISFET gate insulating film is thicker than the gate insulating film of the peripheral circuit or logic circuit MISFET that drives the DRAM. Consequently, the gate insulating films of the selecting MISFET, the floating gate type MISFET, and the peripheral circuit or logic circuit MISFET that drives the DRAM, and the peripheral circuit MISFET that drives the floating gate type MISFET, can be optimized in thickness for each MISFET.

In the semiconductor integrated circuitry as described in any of sections (1) to (4), it can be expected that a silicon nitride film is formed in the second MISFET formed area so as to cover the second MISFET and the semiconductor substrate.

According to this semiconductor integrated circuitry, since a silicon nitride film is formed in the peripheral circuit or logic circuit area on the semiconductor substrate, the element isolating area can be prevented from over-etching even when connecting holes are formed in the element isolating area on the semiconductor substrate. Thus, no leakage occurs from between elements. And, accordingly, the semiconductor integrated circuitry can prevent generation of defects, thereby improving both reliability and performance.

(5) The method of manufacturing the semiconductor integrated circuitry of the present invention includes processes: (a) for forming a gate insulating film on the main surface of a semiconductor substrate; (b) for forming gate electrodes and a cap insulating film on the gate insulating film; (c) for forming a low density semiconductor area of the first and second MISFETs in a self-matching manner, respectively, with respect to the gate electrodes; (d) for forming the first side wall spacers on side surfaces of each of the gate electrodes; (e) for forming the second side wall spacers outside the first side wall spacers; (f) for forming a high density semiconductor area in a self-matching manner with respect to the second side wall spacers of the second MISFET; (g) for depositing an interlaminar insulating film composed a silicon oxide film all over the semiconductor substrate; (h) for etching the interlaminar insulating film and the second side wall spacers and opening the connecting holes in a self-matching manner with respect to the first side wall spacers of the first MISFET; and (i) for forming a conductor portion in each of the connecting holes.

Furthermore, the method of manufacturing the semiconductor integrated circuitry of the present invention includes processes: (a) for forming a gate insulating film on the main surface of a semiconductor substrate; (b) for forming gate electrodes and a cap insulating film on the gate insulating film; (c) for forming a low density semiconductor area of the first and second MISFETs in a self-matching manner, respectively, with respect to the gate electrodes; (d) for depositing a silicon nitride film all over the surface of the semiconductor substrate including the side surfaces of each of the gate electrodes; (e) for forming side wall spacers on side surfaces of the gate electrodes with a silicon nitride film formed therebetween; (f) for forming a high density semiconductor area in a self-matching manner with respect to the side wall spacers of the second MISFET; (g) for depositing an interlaminar insulating film composed of a silicon oxide film all over the semiconductor substrate; (h) for etching the interlaminar insulating film and the side wall spacers to form openings in a self-matching manner with respect to the silicon nitride film, and etching the silicon nitride film at the bottom of each opening to open the connecting holes; and (i) for forming a conductor portion in each of the connecting holes.

According to the semiconductor integrated circuitry, it is possible to form a semiconductor integrated circuitry as described in section (1).

(6) In the process (c), the manufacturing method of the present invention can implant phosphorus in the first MISFET semiconductor area and implant arsenic in at least one or more low density n-type semiconductor areas of the second MISFET. According to this manufacturing method, the dielectric strength of the first MISFET can be improved, and when arsenic is implanted in the low density semiconductor area of the second MISFET, the second MISFET channel length can be shortened.

Furthermore, in the process (a), both the first MISFET gate insulating film and the second MISFET gate insulating film can be formed in the same process. In such a case, the gate insulating film forming process can be shortened and simplified.

Furthermore, the process (a) for forming an insulating film can include a process for forming the first gate insulating film in an area where the first and second MISFETs are formed, a process for removing the first insulating film selectively from the area where the second MISFET is formed, and a process for forming the second insulating film in an area where the second MISFET is formed. When those additional processes are included in the process (a), since the first and second MISFET gate insulating films can be formed differently in thickness from each other, and after the first gate insulating film is formed, the second insulating film is formed, the second gate insulating film can be thinner than the first gate insulating film.

The method of manufacturing the semiconductor integrated circuitry according to the present invention is as described in section (5), and the gate insulating film can be a tunnel insulating film of the floating gate type MISFET composing a nonvolatile memory and the process for forming gate electrodes can include a process for forming the floating gate electrodes of the floating gate type MISFET and a process for forming the control gate electrodes of the floating gate type MISFET. According to the manufacturing method of the semiconductor integrated circuitry, it is possible to form a nonvolatile memory in which the memory array area can be highly integrated and the performance of the peripheral circuit area can be improved significantly.

(8) The method of manufacturing the semiconductor integrated circuitry according to the present invention is as described in sections (5) or (6), and prior to the process (a), there are included a process for forming the tunnel insulating film of the floating gate type MISFET composing a nonvolatile memory on the main surface of the semiconductor substrate and a process for forming the floating gate electrodes of the floating gate type MISFET on the tunnel insulating film.

According to the manufacturing method of the present invention, it is possible to manufacture a semiconductor integrated circuit provided with both a DRAM and a nonvolatile memory in which the memory array area is highly integrated and the performance of the peripheral circuit area is improved significantly.

The gate electrodes formed in the process (b) and the control gates of the floating gate type MISFET can be formed in the same process to simplify the process.

Furthermore, the tunnel insulating film can be thicker than the gate insulating film formed in the process (a).

(9) The method of manufacturing the semiconductor integrated circuitry is as described in sections (5) to (8), and prior to the process (g), there can be included a process for depositing the second silicon nitride film in the area where the second MISFET is formed, etching the interlaminar insulating film in the area where the conductor portion connecting the second MISFET to a member is formed in the upper layer of the second MISFET conditions determined so that an etching selection ratio can be taken for the second silicon nitride film to form openings, and furthermore etching the second silicon nitride film at the bottom of each opening to open connecting holes to form a conductor portion.

According to the manufacturing method of the present invention, since etching of the interlaminar insulating film is stopped by the second silicon nitride film, then the second silicon nitride film can be thinned much more than the interlaminar insulating film can be etched, over-etching will be sufficient if it is made up to ½ of the second silicon nitride film. And, even when connecting holes overlap on the element isolating area on the semiconductor substrate, the element isolating area can be prevented from over-etching. Consequently, a proper etching process margin can be secured, the element isolating function of the element isolating area can be kept, and the performance and reliability of the semiconductor integrated circuitry can be secured.

The second silicon nitride film and the silicon nitride film formed as the first insulating film can be formed in the same process.

Hereunder, the effects to be obtained by the representative aspects of the invention as set forth above will be described briefly.

(1) The present invention can provide semiconductor integrated circuitry technology for dividing the memory cells of a DRAM or a nonvolatile memory finely so as to be integrated more highly and to make the operation faster in a semiconductor integrated circuit provided with a DRAM or a nonvolatile memory.

(2) The present invention can provide semiconductor integrated circuitry technology for dividing memory cells finely so as to be integrated more highly and make the operation faster in a semiconductor integrated circuit provided with a DRAM or an electrically reloadable nonvolatile memory.

(3) It is possible to provide a technology for realizing a high performance semiconductor integrated circuit with excellent DRAM refreshing characteristics.

(4) It is possible to provide a technology for realizing a highly reliable semiconductor integrated circuit that can prevent an element isolating area on the semiconductor substrate from over-etching when connecting holes are opened.

(5) It is possible to simplify the manufacturing processes for a semiconductor integrated circuit provided with a DRAM and an electrically reloadable nonvolatile memory.

BRIEF DESCRIPTION OF DRAWINGS

FIG. 50(*b*) is a cross sectional view of a peripheral circuit area of the DRAM in the sixth embodiment.

FIG. 52(*b*) is a cross sectional view taken along the line IIIb—IIIb in FIG. 51.

BEST MODE FOR CARRYING OUT THE INVENTION

Hereunder, examples embodiments of the present invention will be described with reference to the accompanying drawings. In all of the drawings of the various embodiments, the same numerals will be used to identify members having the same functions, and a redundant explanation thereof will be omitted.

(1st Embodiment)

Figure 1:
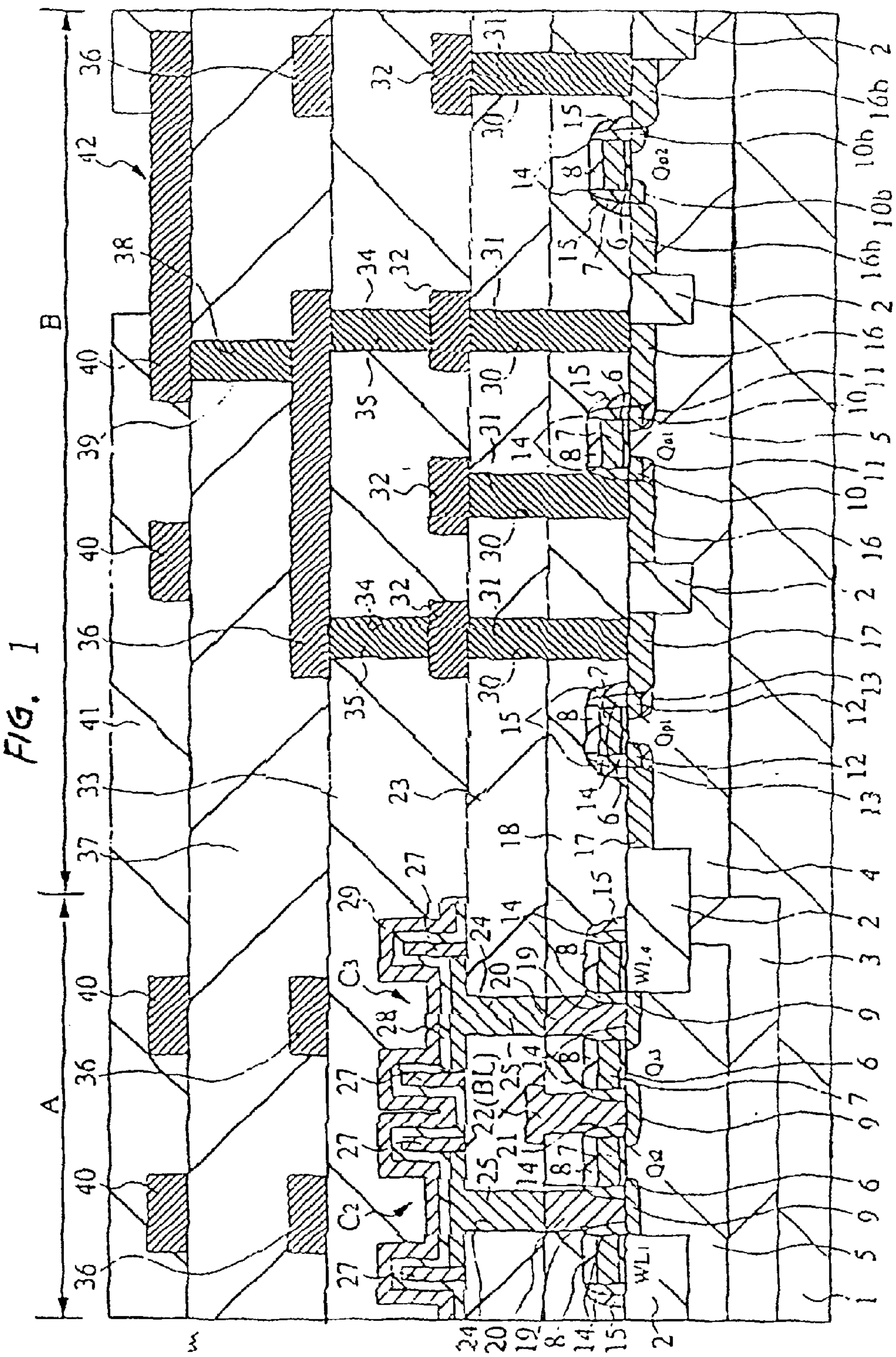
FIG. 1 is a cross sectional view of the major portion of a semiconductor integrated circuit representing a first embodiment of the present invention.
Figure 2:
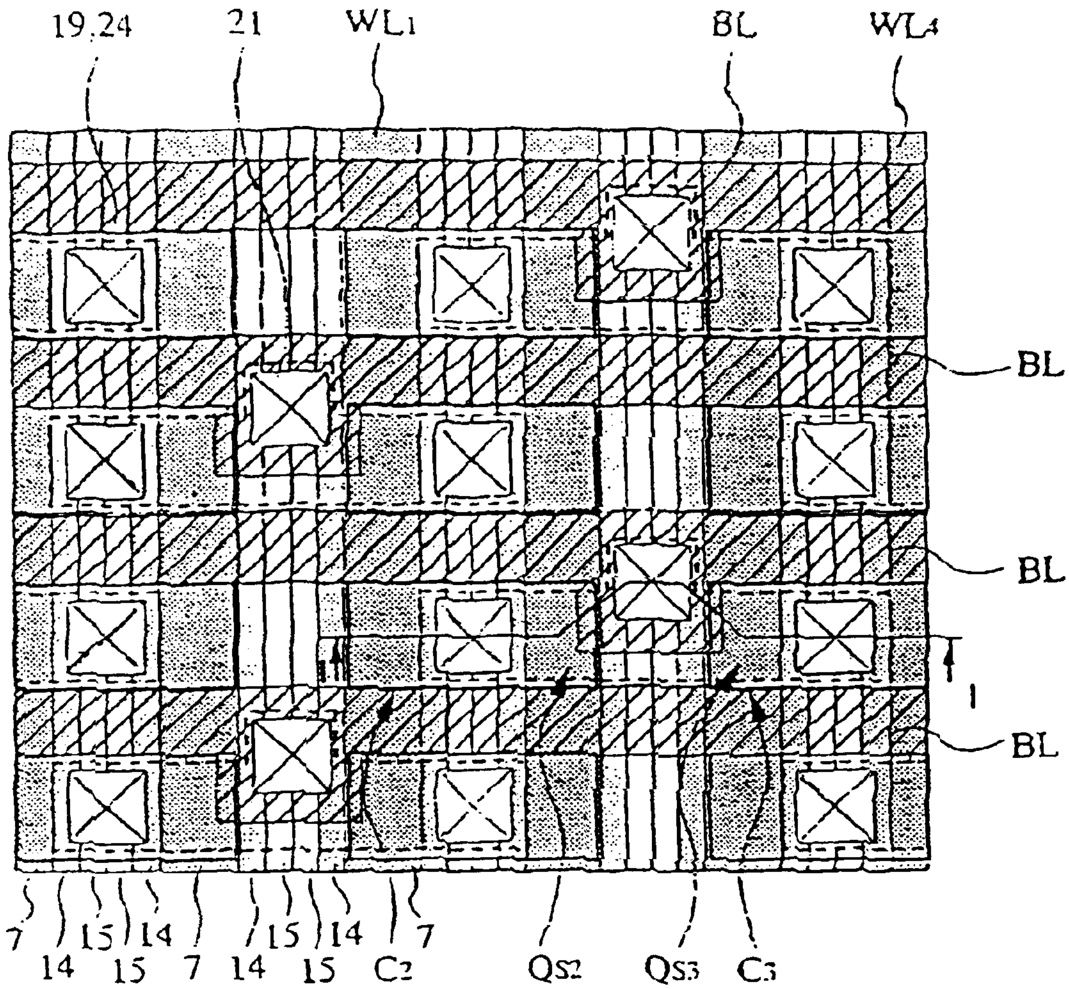
FIG. 2 is a top view of a DRAM in a memory cell area, included in the semiconductor integrated circuit of the first embodiment of the present invention.
Figure 3:
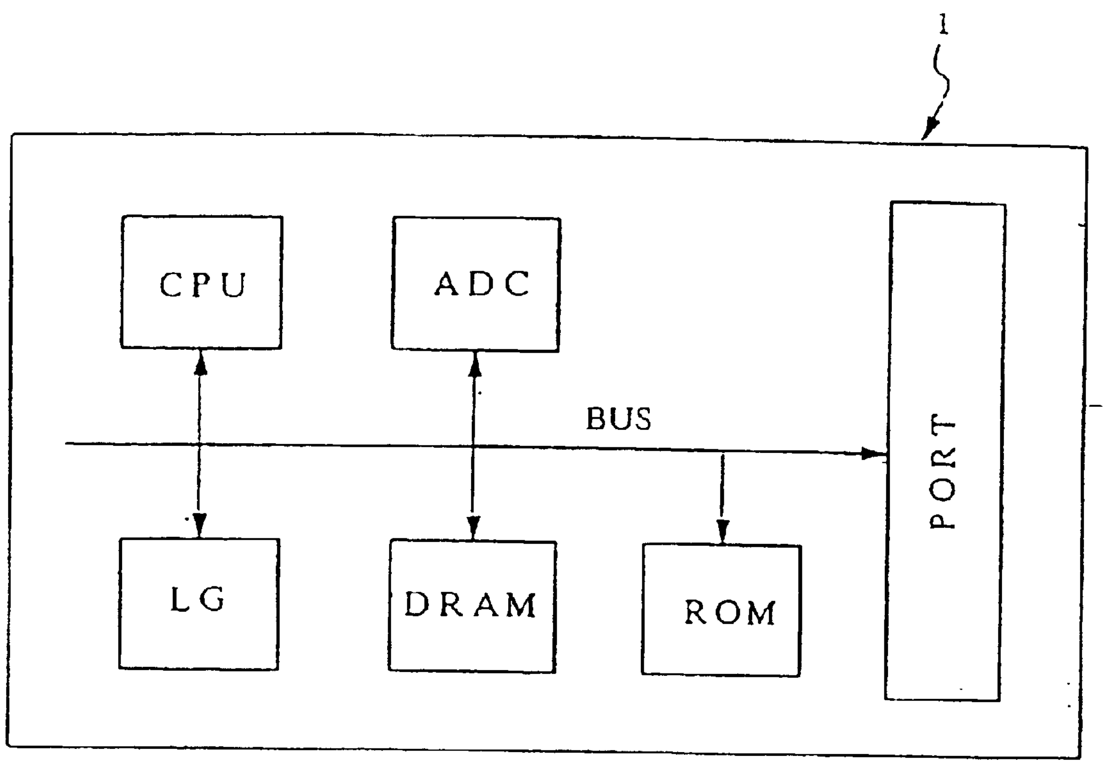
FIG. 3 is a block diagram of the semiconductor integrated circuitry in the first embodiment of the present invention.
Figure 4:
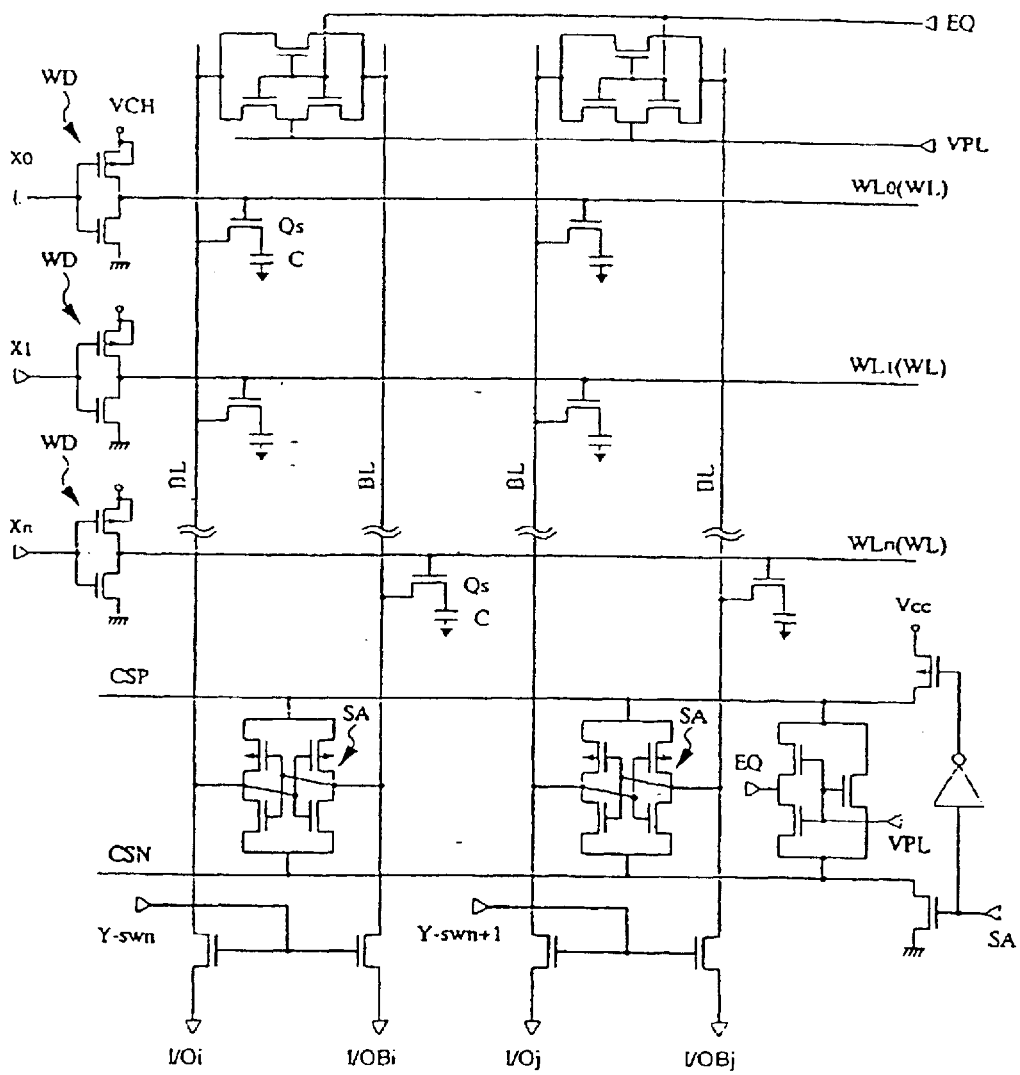
FIG. 4 is an equivalent circuit diagram of the DRAM included in the semiconductor integrated circuitry in the first embodiment of the present invention.

FIG. 1 is a cross sectional view of the major portion of a semiconductor integrated circuit representing an embodiment of the present invention. FIG. 2 is a top view of a DRAM memory cell area included in the semiconductor integrated circuit of the first embodiment of the present invention. FIG. 3 is a block diagram of the semiconductor integrated circuit of the first embodiment of the present invention. FIG. 4 illustrates an equivalent circuit of a DRAM included in the semiconductor integrated circuit of the first embodiment of the present invention.

The semiconductor integrated circuitry in the first embodiment of the present invention, as shown in the area A in FIG. 1, includes storage capacity elements (capacitors) C2 and C3 for storing information and forming DRAM memory cells; selecting MISFETs Qs2 and Qs3 connected to the storage capacity elements C2 and C3; and word lines WL1 and WL4 adjacent to the selecting MISFETs Qs2 and Qs3. The cross section of the DRAM shown in FIG. 1 is as seen on the I-I line in the top view of the DRAM memory cell area shown in FIG. 2. The semiconductor integrated circuitry in the first embodiment, as shown in the area B in FIG. 1, includes an N channel MISFET Qn1, a P channel MISFET Qp1, and the second N channel MISFET Qn2 used to form peripheral circuits other than DRAM memory cells, as well as other logical circuits.

The semiconductor integrated circuitry in the first embodiment, as shown in FIG. 3, is a microcomputer formed on a semiconductor substrate 1 together with an information processing CPU; input and output ports; an analog digital circuit ADC; a timer, as well as a logical circuit LG; a ROM for storing OS, etc.; and a DRAM used as a memory. The circuits of the microcomputer are connected to each other via a bus BUS. The N channel MISFET Qn1 and the P channel MISFET Qp1 can be used for logical configuration such as the information processing CPU.

As shown in the equivalent circuit in FIG. 4, a single bit memory cell is comprised of the storage capacity element C for storing information and the selecting MISFET Qs (Qs2 and Qs3). The storage capacity element C and the selecting MISFET Qs are connected serially. The gate electrode of the selecting MISFET Qs is connected electrically to word lines WL (WKO, WL1, and WLn) and is formed integrally. The word line WL is connected to a word line driver WD. One of the source or drain area of the selecting MISFET Qs is connected electrically to one of the electrodes of the storage capacity element C. The other electrodes of the source or drain area of the selecting MISFET are connected to a bit line BL and the bit line BL is connected to a sense amplifier SA. In this way, the single bit memory cell is disposed at an intersection point of the word line WL and the bit line BL. As will be described later, the word line WL is extended in a first direction and the bit line BL is extended vertically in a second direction.

The sense amplifier SA is not specified specially, but it can be comprised of the N channel MISFET Qn1 and the P channel MISFET Qp1. The N channel MOSFET used to form the word line driver WD, as will be described later, can be comprised of the N channel MISFET Qn2 containing different impurities in a low density semiconductor area from those of the N channel MISFET Qn1. In addition, this N channel MISFET Qn2 is used for a circuit of a charger pump circuit, as well as input and output ports as needed, which are operated with a higher voltage than that of the N channel MISFET Qn1.

Next, each part of the configuration will be described with reference to FIG. 1, which represents a cross sectional view of the major portion of the semiconductor integrated circuit according to the first embodiment of the present invention.

The single bit memory cell is comprised of the storage capacity element C for storing information (C2 and C3) and the selecting MISFET Qs (Qs2 and Qs3). The selecting MISFET Qs is formed in a P-type well area 5 formed on the main surface of the P-type semiconductor substrate 1. The P-type well area 5 of the memory cell is separated electrically from the P-type semiconductor substrate in the N-type semiconductor area 3. Consequently, in order to prevent noises from other circuits mounted on the same semiconductor substrate 1 and reduce the DRAM bit line storage capacity, a substrate bias can be applied to the P-type well area 5, which is a channel area of the selecting MISFET Qs.

The selecting MISFET Qs is formed in an activating area 5*b* limited by a field insulating film 2 in the P-type well area 5. The selecting MISFET Qs is comprised of a P-type well area 5 (channel forming area); a gate insulating film 6; a gate electrode 7; and a pair of low density N-type semiconductor areas 9 forming source/drain areas, into which impurities are doped at a low density. To reduce the resistance, the gate electrode 7 may be structured with multiple layers of a silicon film containing impurities of phosphorus (P), etc. or a silicon film on which silicide such as tungsten silicide (WSi) or a metallic film such as tungsten (W) is formed.

The top of the gate electrode 7 is covered with a silicon nitride film 8, and on the side surfaces of the gate electrode 7 and the silicon nitride film 8 are formed the first side wall spacers 14 composed of silicon nitride and the second side wall spacers 15 composed of silicon oxide are formed. The silicon nitride film 8 is formed so that the same pattern is also formed on the gate electrodes 7.

In the low density N-type semiconductor area 9, for example, phosphorus can be doped as an impurity. Consequently, the strength of the electrical field (strength of the electrical field at the end portion of the drain) between the end portion of the gate electrodes 7 and the P-type well area 5 can be lowered, and further it is possible to prevent generation of defective crystallization when impurities are implanted to reduce the leakage current and extend the refreshing time.

Figure 6:
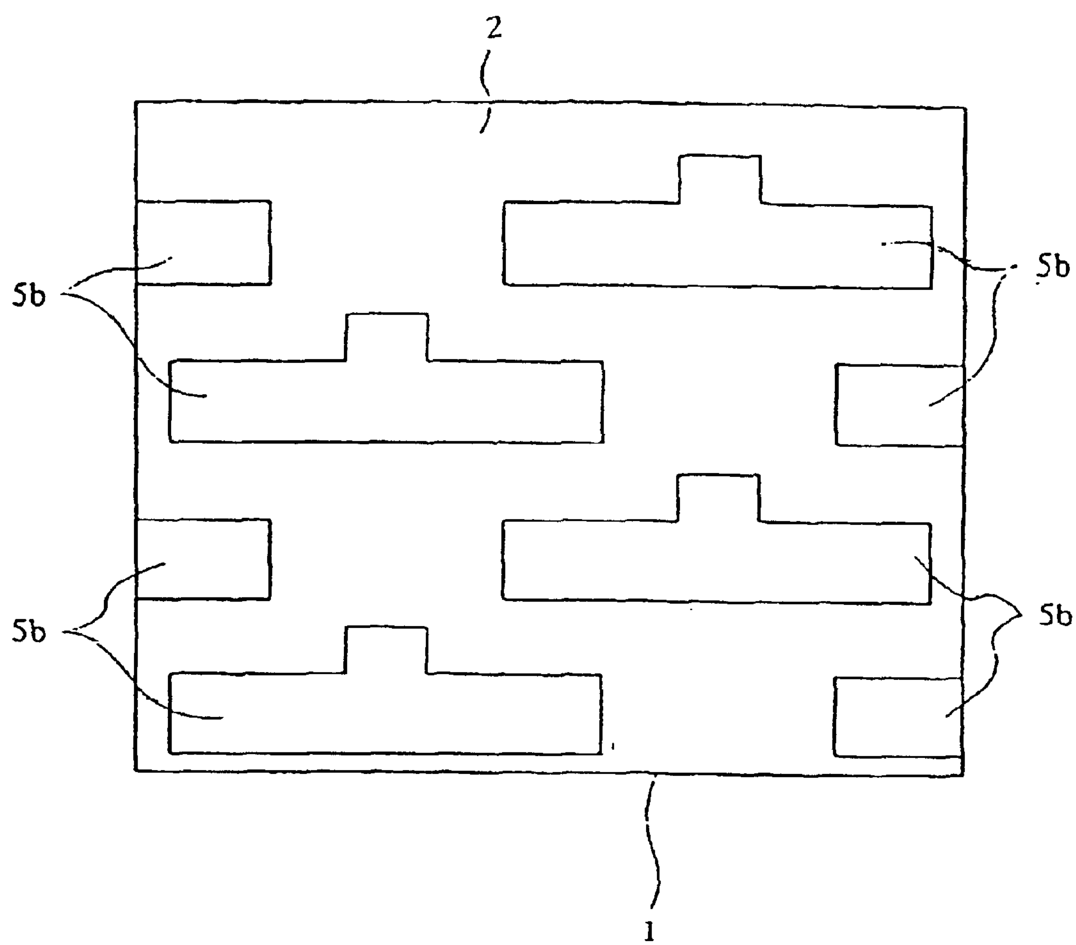

As shown in FIG. 6 to be described later, the selecting MISFET Qs is separated electrically from the memory cells (in units of a pair of memory cells) by a field insulating film 2 and the active area 5*b* is limited by the field insulating film 2.

One low density N-type semiconductor area 9 of the selecting MISFET Qs is connected to an electric conductor 20 via connecting holes 19 and the electric conductor 20 is connected to one of the electrodes of the storage capacity element C for storing information.

The electric conductor 20 is formed in a self-matching manner with respect to the first side wall spacers 14 composed of silicon nitride. In other words, the connecting holes 19 are formed in a self-matching manner with respect to the first side wall spacers 14 composed of silicon nitride and formed on side surfaces of the gate electrodes 7. Since the second side wall spacers 15 are formed with silicon oxide, which is the same material as that of the insulating film 18 to be described later, and the second side wall spacers 15 and the insulating film 18 are formed with a material whose etching rate is different from that of the first side wall spacers 14, the electric conductor 20 can be connected to the low density N-type semiconductor area 9 in a self-matching manner with respect to the first side wall spacers 14. In other words, when the insulating film 18 and the second side wall spacers 15 are to be etched, the first side wall spacers 14 are etched under more strict etching conditions than those of the silicon oxide. Consequently, when the connecting holes 19 are to be formed, the connecting holes 19 are opened widely and a proper large margin is secured, so that the interval between gate electrodes 7 can be reduced to improve the degree of integration. This is because the electric conductor 20 is connected in a self-matching manner with respect to the first side wall spacers 14. In other words, as will be described with reference to FIG. 8, even when the interval between adjacent word lines in the second direction, that is, the interval between gate electrodes 7, is reduced to improve the integrating degree, the connecting holes 19 can be opened widely and the contact resistance of each hole can be lowered. In addition, when the connecting holes 19 are formed by lithography, the margin of alignment in the second direction can be reduced, so that the interval in the second direction can be reduced.

In the first embodiment, the connecting holes 19 are formed so as not to be positioned on top of the gate electrodes 7. On top of the gate electrodes 7, however, a silicon nitride film 8 is also formed, so that the connecting holes 19 may be opened so as to be positioned on the gate electrodes 7. Consequently, a larger margin of alignment can be secured.

The other low density N-type semiconductor area of the selecting MISFET Qs is formed integrally with the bit line BL and is connected to an electric conductor 22 via the connecting holes 21.

Just like the electric conductor 20, the electric conductor 22 is also formed in a self-matching manner with respect to the first side wall spacers formed with silicon nitride on side surfaces of the gate electrodes 7. In addition, just like the connecting holes 19, the connecting holes 21 which lead to the bit line BL may be extended so as to be positioned on top of the gate electrodes 7. Consequently, like the connecting holes 19, the connecting holes 21 can be opened widely and take a large margin of alignment. The interval between gate electrodes 7 (interval between word lines WL) can thus be reduced to improve the density of integration. In other words, as will be described later with reference to FIG. 20, even when the interval between adjacent memory cell selecting MISFETs Qs in the second direction, that is, the interval between gate electrodes, is reduced to improve the degree of integration, the connecting holes 21 can be opened widely and the contact resistance of each hole can be lowered. And, when the connecting holes 21 are to be formed by lithography, the margin of alignment in the second direction can be reduced, so that the interval between gate electrodes 7 in the second direction can also be reduced.

The electric conductors 20 and 22 may be formed with silicon containing impurities, such as phosphorus, etc. or silicide, such as WSi to lower the resistance.

The storage capacity element C for storing information is composed of electric conductors 25 and 27 composing one of the electrodes (lower electrodes), a dielectric material 28 and upper electrodes 29 composing the other electrodes. As will be described later with reference to FIG. 22, the electric conductors 25 and 27 are connected to the electric conductor 20 via connecting holes 24 and are isolated electrically from one of the respective electrodes of the other storage capacity element C for storing information. Each of the one electrodes is connected to one low density N-type semiconductor area of one selecting MISFET Qs corresponding to the electrode. Each of the other electrodes of the storage capacity element C for storing information are connected electrically to plural memory cells. In an area (not illustrated), for example, those electrodes are connected to a plate potential generator circuit whose voltage is ½ of the supply voltage.

The electric conductors 25 and 27, and the upper electrodes 29 are formed with a silicon film containing impurities such as phosphorus to reduce, for example, the resistance thereof. The dielectric material film 28 is formed with a laminated film composed of, for example, a silicon nitride film and a silicon oxide film, or a laminated film composed of a tantalum oxide film, etc.

The N channel MISFET Qn1 is formed in the P-type well area 5 and is composed of: the P-type well area 5 (channel forming area); a gate insulating film 6; gate electrodes 7; and a pair of low density semiconductor areas 10 forming a source and a drain. Under the low density semiconductor areas 10 there is formed a P-type semiconductor area 11 to obtain an N channel MISFET (short channel) whose gate is shorter than that of the N channel MISFET Qn1. The P-type semiconductor area 11 functions as a so-called punched-through stopper of the MISFET.

Just like the DRAM selecting MISFET Qs, a silicon nitride film 8 is formed on the gate electrodes 7, and on side surfaces of the gate electrodes 7, there are formed the first side wall spacer 14 made of silicon nitride and the second side wall spacers 15 made of silicon oxide. The high density N-type semiconductor area 16, as will be described later, is formed in a self-matching manner with respect to the second side wall spacers 15 formed of silicon oxide. Since the high density N-type semiconductor area 16 is formed in a self-matching manner with respect to the second side wall spacers 15, the thickness of the second side wall spacers 15 can be optimized to improve the performance of the N channel MISFET Qn1.

The low density N-type semiconductor area 10 is implanted, for example, with arsenic (As) as an impurity to obtain a long-gate and short-channel N channel MISFET. Since the thermal diffusion coefficient of arsenic is smaller than that of phosphorus, the horizontal diffusion of impurity can be shortened. It is thus possible to obtain a long-gate and short-channel N channel MISFET. In addition, since the thermal diffusion coefficient is small, the density of the low density semiconductor area 10 can be more greatly increased. The parasitic resistance can thus be reduced and a high performance N channel MISFET can be obtained. The low density N-type semiconductor area 10 is formed in a self-matching manner with respect to the gate electrodes 7 and the silicon nitride film 8.

Under the low density semiconductor area 10 there is formed a P-type semiconductor area 11 that functions as a punched-through stopper. Boron (B) is implanted into the area P-type semiconductor area 11 as an impurity. Since this P-type semiconductor area 11 is provided, the extension of a barrier layer can be suppressed, and accordingly the short channel characteristics can be improved.

The P channel MISFET Qp1 is formed in the N type well area 4. The MISFET Qp1 is composed of: the N type well area 4 (channel forming area); a gate insulating film 6; gate electrodes 7, and a pair of low density P-type semiconductor areas 12 forming a source and a drain. The low density P-type semiconductor area 12 is formed between the channel forming area and the high density P-type semiconductor area 17. Under the low density P-type semiconductor area 12 there is formed an N-type semiconductor area 13 to obtain a short-gate and short-channel P channel MISFET, which can be obtained by shortening the gate length of the P channel MISFET Qp1. The N-type semiconductor area 13 functions as a so-called punched-though stopper of the MISFET. Just like the DRAM selecting MISFET Qs, a silicon nitride film 8 is formed on the gate electrodes 7. On the side surfaces of both the gate electrodes 7 and the silicon nitride film 8, the first side wall spacers 14 made of silicon nitride and the second side wall spacers 15 made of silicon oxide are formed. The high density P-type semiconductor area 17, to be described later, is formed in a self-matching manner with respect to the second side wall spacers 15 made of silicon oxide. Since the high density P-type semiconductor area 17 is formed in a self-matching manner with respect to the second side wall spacers 15, the thickness of the second side wall spacer 15 can be optimized to improve the performance of the P channel MISFET Qp1. Consequently, the high density P-type semiconductor area 17 can be prevented from diffusion over the low density P-type semiconductor area 12.

Boron is implanted into the low density P-type semiconductor area 12 as an impurity. Under the low density P-type semiconductor area 12 there is formed an N-type semiconductor area 13, which functions as a punched-through stopper. The N-type semiconductor area 13 is implanted with arsenic or phosphorus as an impurity. Since the N-type semiconductor area 13 is provided, the extension of the barrier layer can be suppressed and further the short channel characteristics can be improved.

The N channel MISFET Qn2 is formed in the P type well area 5 and is composed of: the P type well area 5 (channel forming area); a gate insulating film 6; gate electrodes 7; and a pair of low density semiconductor areas 10*b* forming a source and a drain; and the high density N-type semiconductor area 16*b*. The pair of low density semiconductor areas 10*b* are formed between the channel forming area and the high density N-type semiconductor area 16*b*. Just like the DRAM selecting MISFET Qs, on the gate electrode 7 there is formed a silicon nitride film 8, and on the side surfaces of the gate electrodes 7 the first side wall spacer 14 made of silicon nitride and the second side wall spacers 15 made of silicon oxide are formed. And, the low density semiconductor area 10*b* is formed in a self-matching manner with respect to the gate electrodes 7 and the silicon nitride film 8. The high density N-type semiconductor area 16*b*, to be described later, is formed in a self-matching manner with respect to the second side wall spacers 15 composed of silicon oxide. Since the high density N-type semiconductor area 16*b* is formed in a self-matching manner with respect to the second side wall spacers 15, the high density N-type semiconductor area 16*b* can be prevented from diffusion over the low density semiconductor area 10*b* and the strength of the electrical field in the low density semiconductor area 10*b* can be reduced. In addition, the thickness of each second side wall spacer 15 can be optimized so as to have a specified resistance value and to improve the performance of the N channel MISFET Qn2. In other words, even when the thickness of the second side wall spacer 15 is optimized to improve the performance of the N channel MISFET Qn2, the interval between word lines WL in the second direction in the memory cell array, that is, the interval between gate electrodes of the selecting MISFET Qs, can be reduced and the connecting holes 19 and 20 can be opened widely to take a large margin of alignment. Thus, the contact resistance of each hole can be lowered.

For example, phosphorus is implanted into the low density N-type semiconductor area 10*b* as an impurity, and under the low density N-type semiconductor area 10*b* a punched-through stopper of the P type semiconductor area is not provided. Since the low density N-type semiconductor area 10*b* of the N channel MISFET Qn2 contains phosphorus as an impurity, the withstand voltage can be set higher than that of the N channel MISFET Qn1 in which the same low density semiconductor area 10 is formed with arsenic. In addition, since no punched-through stopper is provided, the withstand voltage can be set higher. This N channel MISFET Qn2 can be used for a circuit such as a DRAM word line driver WD, a charge pump circuit, or an input/output port, which must operate with a higher voltage than that of the N channel MISFET Qn1.

The semiconductor area forming each source/drain of the N channel MISFET Qn1, the N channel MISFET Qn2, and the P channel MISFET Qp1 is connected to a connecting member 31 connected to the first wiring 32, via connecting holes 30. The connecting member 31 can be formed in a self-matching manner with respect to the first side wall spacers 14 composed of silicon nitride on side surfaces of the MISFET gate electrodes 7 when necessary. In FIG. 1, the side surfaces of the gate electrodes 7 mentioned here are the left connecting area of the P channel MISFET Qp1.

In addition, each line of the first wiring 32 is connected to a connecting member 35 connected to the second wiring 36, via a connecting hole 34. Each line of the second wiring 36 is connected to a connecting member 39 connected to the third wiring 40, via a connecting hole 38. And, on those first, second, and third wirings there is formed a passivation film 41 on which a bonding area 42 is formed.

The material of the connecting members 31, 35, and 39 for connecting upper and lower wirings is not specified specially, but may be composed of tungsten (W). The material of the wirings 32, 36, and 40 is not specified specially, but may be composed of an integrated film of titanium nitride (TiN) and aluminum (Al) containing copper (Cu).

Each line of the wirings 32, 36, and 40 is insulated by insulating films 18, 23, 33, and 37, respectively, and the insulating films 18, 23, 33, and 37 can be formed with a silicon oxide film or a silicon oxide film into which either of boron or phosphorus, or both of them, are doped. The passivation film 41 can be formed with a silicon oxide film or a silicon oxide film into which either of boron or phosphorus, or both of them, are doped, or a silicon nitride film formed on the film.

Next, a method of manufacturing the semiconductor integrated circuitry in the first embodiment will be described with reference to FIGS. 5 to 25. FIGS. 5 to 25 are cross sectional or top views indicating a method for manufacturing the semiconductor integrated circuitry in the first embodiment in the order of the processes.

Figure 5:
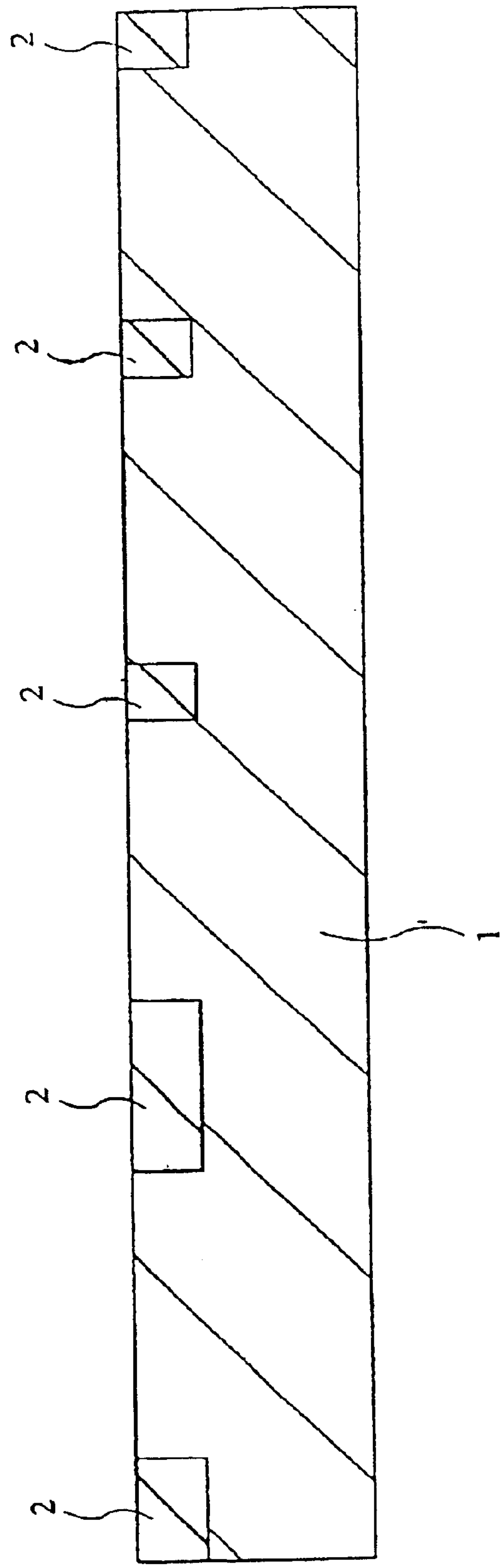
FIGS. 5 to 25 are cross sectional or top views showing an example of how to manufacture the semiconductor integrated circuitry in the first embodiment in the order of the processes.

At first, as shown in FIGS. 5 and 6, field insulating films 2 are formed in specified areas on the P type semiconductor substrate 1. The field insulating films 2 can be formed with silicon nitride using the LOCOS (Local oxidation of Silicon) method that uses a well-known selective oxidation method or a shallow groove isolation method, which will be explained briefly below.

The shallow isolation method forms a silicon oxide film (not illustrated) and a silicon nitride film sequentially on the main surface of a P type semiconductor substrate 1. Then, the silicon oxide film and the silicon nitride film are removed with photo resist, etc. from the area where the field; insulating film 2 is formed. Thereafter, a 0.3 to 0.4 $\mu$m groove is formed in the depth direction of the P type semiconductor substrate 1. Then, a thermal silicon oxide film is formed on the side surfaces and at-the bottom surface of the groove using the silicon nitride film as an oxidation mask. And, a silicon oxide film is deposited all over the thermal silicon oxide film with the CVD (Chemical Vapor Deposition) method, any then the silicon oxide film is removed from the area except for the groove with the CMP (Chemical Mechanical Polishing) method or the dry etching method, silicon oxide embedding selectively in the groove. The silicon oxide film is densified (thermal treatment for densifying) with the CVD method in an acid atmosphere. Then, the silicon nitride film is removed, so that the field insulating film 2 is formed with the shallow groove isolation method. The residual portions are formed as active areas 5*b*.

Figure 7:
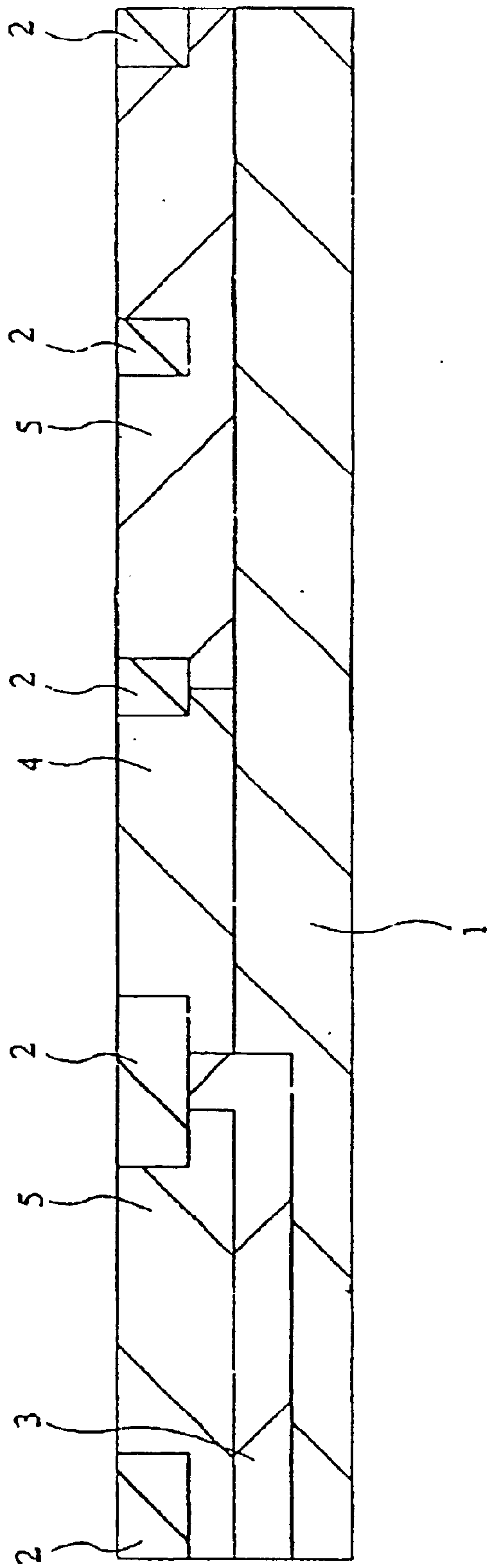

Next, an N type semiconductor area 3 is formed as shown in FIG. 7. The N type semiconductor area 3 can be formed, for example, using photo resist as a mask and by ion implantation of phosphorus, under the conditions (accelerating energy cLf 500 to 1000 keV and a dosing amount of about 1×10^12 atoms/cm$^2$) The phosphorus is implanted once or a few times by changing the conditions each time. Thereafter, impurities of the area are activated with a thermal treatment of about 1000° C. In this case, the thermal treatment can be performed for 20 to 30 min in an atmosphere of nitrogen including about 1% of oxygen. Preferably, the RTA (Rapid Thermal Annealing) method that uses an infrared light for heating should be used to finish the thermal treatment within a short time to enable the distribution of impurities to be controlled.

Next, an N type well area 4 and a P type well area 5 are formed. The N type well area 4 can be formed, for example, using photo resist as a mask and by ion-implantation of phosphorus, which implantation is performed once or a few times by changing the conditions each time, under the conditions (an accelerating energy of 300 to 500 keV and a dosing amount of about $1\times10^{13}$ atoms/cm$^2$). The P type well area 5 can be formed, for example, using photo resist as a mask and by ion-implantation of boron, under the conditions (an accelerating energy of 200 to 300 keV and a dosing amount of about $1\times10^{13}$ atoms/cm$^2$). The phosphorus is implanted once or a few times by changing the conditions each time. Thereafter, a thermal treatment of about 1000° C. is performed to activate the impurities. In this case, the thermal treatment can be performed for 20 to 30 min in an atmosphere of nitrogen including about 1% of oxygen. Preferably, the RTA (Rapid Thermal Annealing) method should be used to finish the thermal treatment within a short time to enable the distribution of impurities to be controlled.

Figure 8:
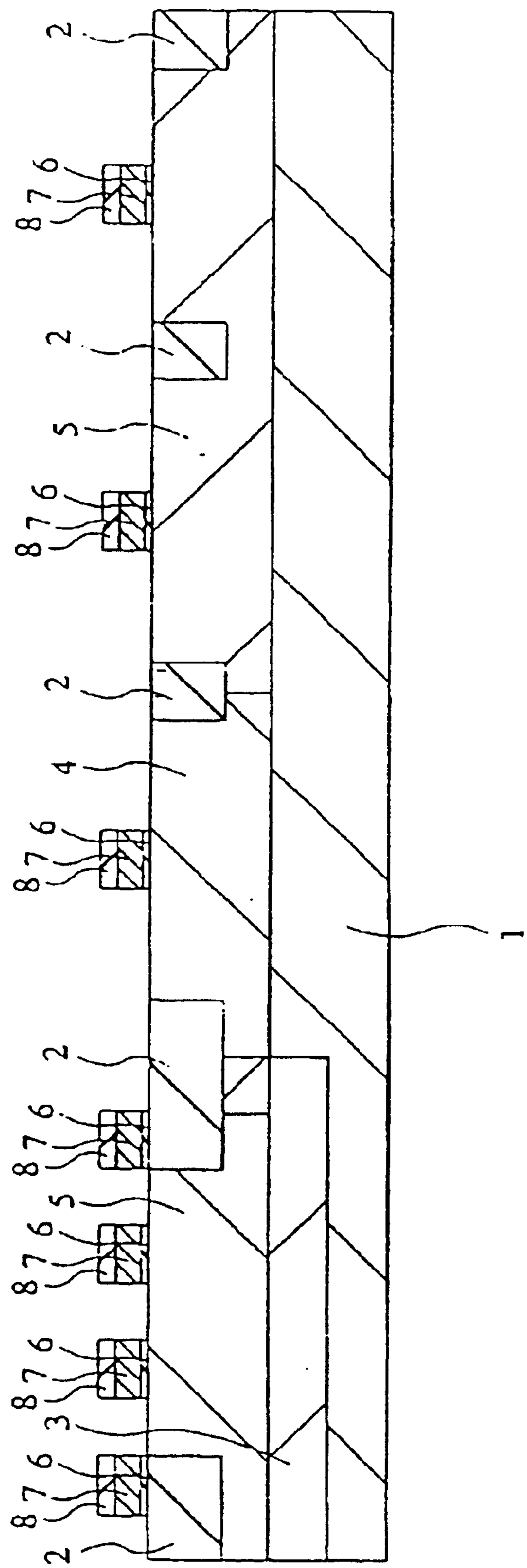
Figure 9:
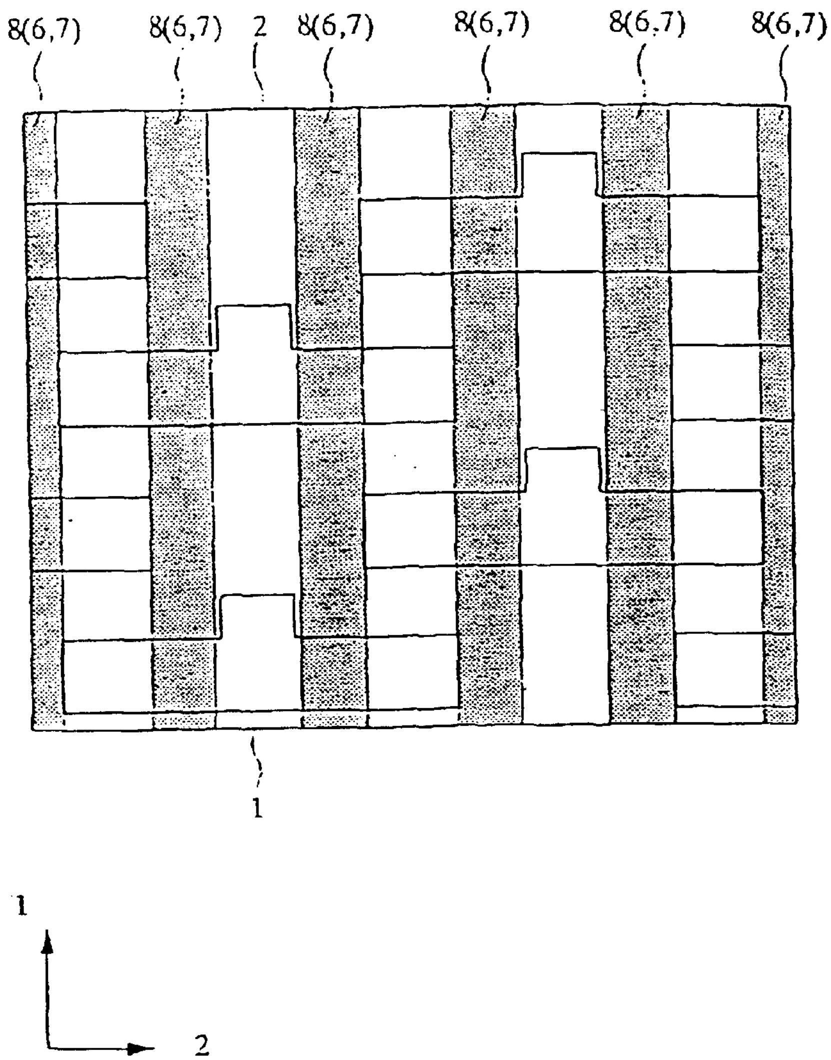

Then, as shown in FIGS. 8 and 9, the silicon oxide film is removed from the P type semiconductor substrate 1 and a clean gate insulating film 6 is newly formed. A silicon oxide is formed with a thermal oxidation method of 700 to 800° C., then a gate insulating film 6 made of silicon oxide containing nitrogen by a thermal treatment in an atmosphere of nitrogen oxide composed of NO or $N_20$ is formed. In the atmosphere of NO, the thermal treatment in the atmosphere of nitrogen oxide can be performed at 900 to 1000° C. In the atmosphere of N20, the thermal treatment can be performed at 1000 to 1100° C. for 20 to 30 min, respectively. Otherwise, the RTA method can be used to finish the thermal treatment within a short time at 1000 to 1100° C. With this thermal treatment, the phase boundary between the gate insulating film 6 and the P type semiconductor substrate 1 is formed satisfactorily, so that the gate insulating film 6 can be suppressed from degradation due to the hot carrier generated by a MISFET operation. The reason why this phase boundary is formed satisfactorily is based on the presumption that Si—N binding that is stronger than the Si—O binding is formed on the phase boundary between the gate insulating film 6 and the semiconductor substrate 1.

The thickness of the gate insulating film 6 is set so that the maximum electrical field becomes 5 MeV/cm or less in operation. For example, when in an operation at 3.3V, the thickness can be set to 7 to 9 nm. When in an operation at 2.5V, the thickness can be set to 5 to 7 nm, and when in an operation at 1.8V, the thickness can be set to 4 to 5 nm.

Next, the gate electrodes 7 and the silicon nitride film 8 are formed sequentially. Each gate electrode 7 is formed with a silicon film containing impurities such as phosphorus or with a multi-layer structure formed with silicide such as WSi or a metal such as W is formed on a silicon film. Those conductor films are deposited all over the surface with the CVD method or spattering method. Then, a silicon nitride film 8 is deposited all over the film with the CVD or plasma CVD method, and, for example, a silicon nitride film and a conductor film are patterned sequentially as specified using photo a resist as a mask. With this, the gate electrodes such as the DRAM memory cell selecting MISFET Qs, the N channel MISFET Qn1, the N channel MISFET Qn2, and the P channel MISFET Qp1, as well as the word lines WL extending in the first direction are formed. The channel length of each gate electrode 7 is formed so as to be 0.2 to 0.4 $\mu$m. On the gate electrodes 7 and the word lines WL there is formed a silicon nitride film 8 so as to have the same flat pattern.

Channel impurities for controlling the MISFET threshold value (Vth) can be implanted by ion implantation before the gate insulating film 6 is formed or after the gate electrodes 7 are formed.

Figure 10:
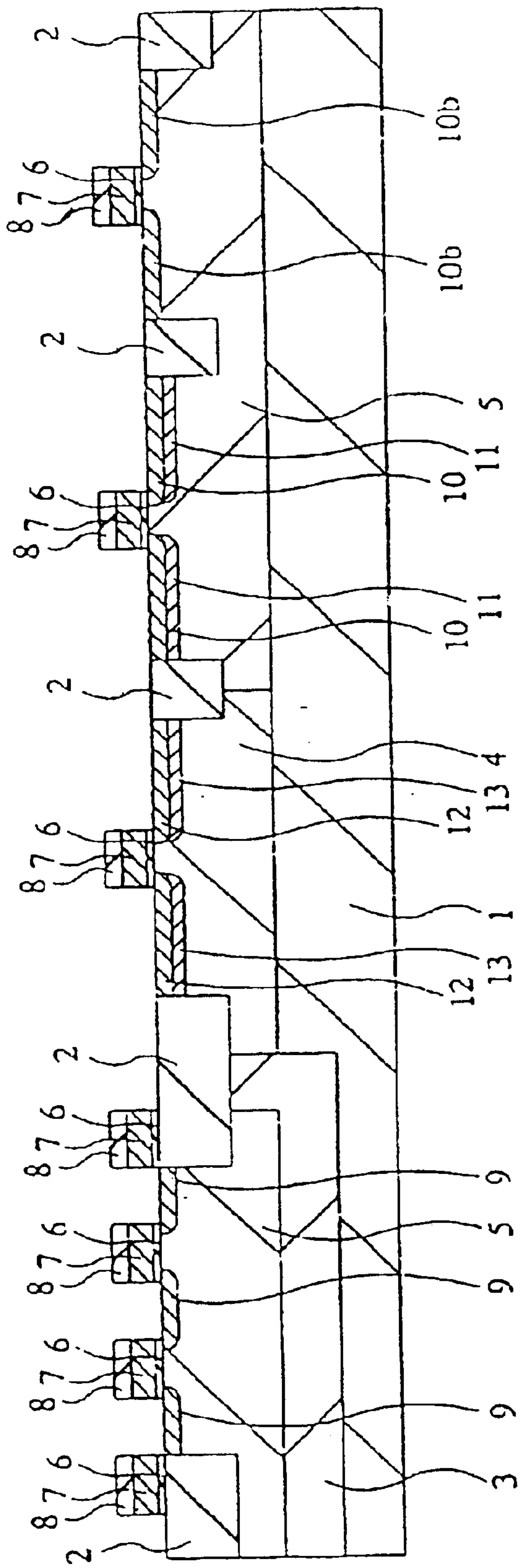
Figure 11:
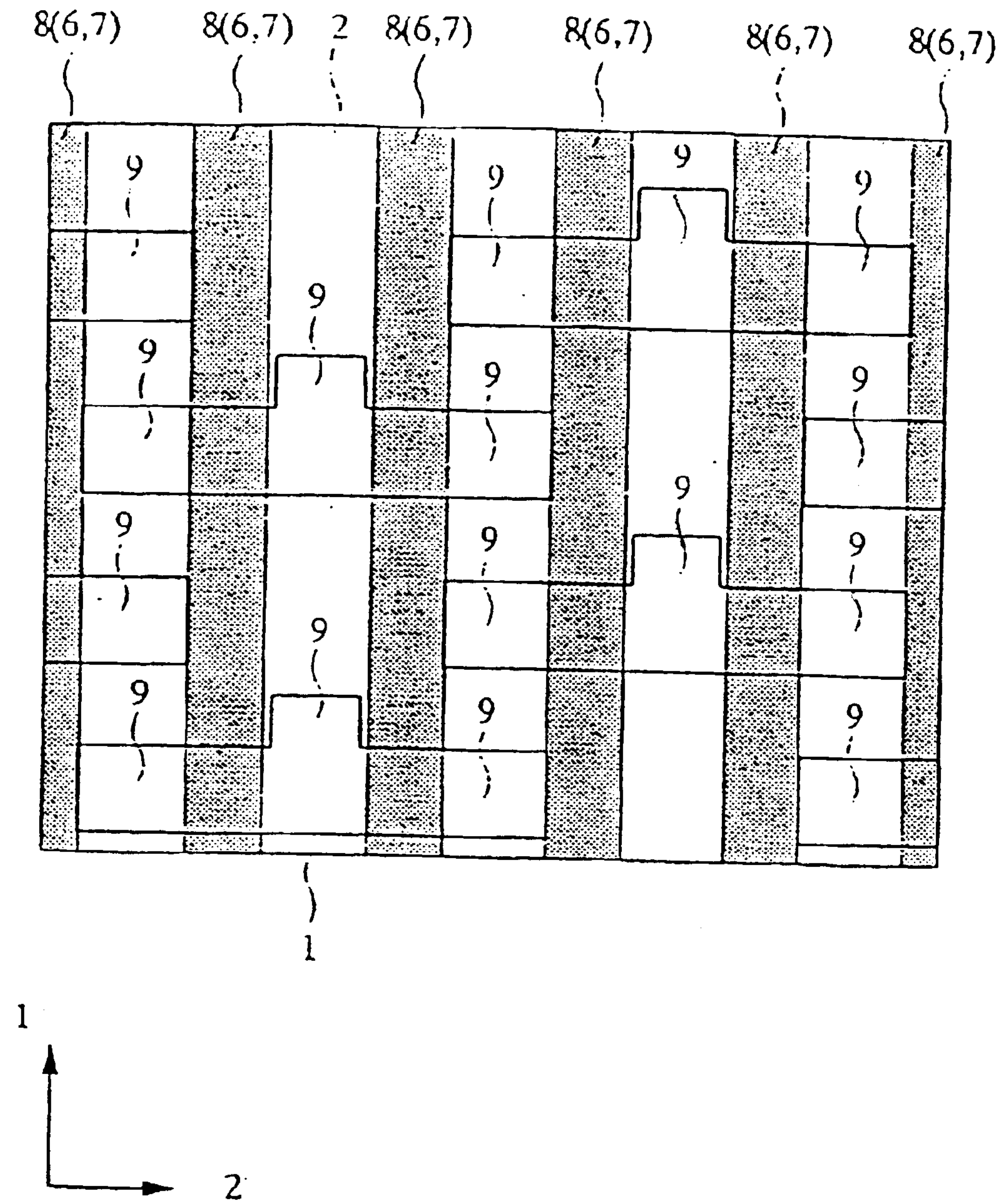

Next, a low density N-type semiconductor area 9 of the selecting MISFET Qs and a low density N-type semiconductor area 10*b* of the N channel MISFET Qn2 are formed selectively as shown in FIGS. 10 and 11 busing a photo resist as a mask. The low density N-type semiconductor areas 9, 10*b* are formed by ion implantation of phosphorus at an acceleration energy of 20 to 40 keV and at a dosing amount of about $5\times10^{13}$ atoms/cm$^2$. The low density N-type semiconductor areas 9, 10*b* are formed by implanting impurities in a self-matching manner with respect to the gate electrodes 7 and the silicon nitride film 8. In other words, a low density N-type semiconductor areas 9, 10*b* are formed in a self-matching manner with respect to the gate electrodes 7 and the silicon nitride film 8.

Next, the low density semiconductor area 10 of the N channel MISFET Qn1 and the P type semiconductor area 11 under the area 10 are formed selectively using a photo resist as a mask. The low density semiconductor area 10 is formed, for example, by ion implantation of arsenic at an acceleration energy of 20 to 40 keV and at a dosing amount of about $1\times10^{14}$ atoms/cm$^2$. In this case, arsenic can be implanted at an angle of 30 to 50° to the side surface of each gate electrode 7 (at 30 to 50° to the perpendicular of the P type semiconductor area), although this is not specified specially. Consequently, the low density semiconductor area 10 is also formed under the gate electrodes 7, so that the hot carrier resistant properties can be improved. The low density N-type semiconductor area 10 is formed by implanting impurities in a self-matching manner with respect to the gate electrodes 7 and the silicon nitride film 8. In other words, the low density semiconductor area 10 is formed in a self-matching manner with respect to the gate electrodes 7 and the silicon nitride film 8.

The P-type semiconductor area 11 is formed, for example, by ion implantation of boron at an acceleration energy of 10 to 20 keV and a dose of about $1\times10^{13}$ atoms/cm$^2$. In this case, boron can be implanted at an angle of 30 to 50° to the side surface of each gate electrode (at an angle of 30 to 50° to the perpendicular of the P type semiconductor area), although this is not specified specially. Consequently, the boron can be supplied sufficiently under the low density semiconductor area 10, that satisfactory short channel characteristics can be obtained.

Furthermore, the low density P-type semiconductor area 12 of the P channel MISFET Qp1 and the N-type semiconductor area 13 under the Qp1 are formed. The low density P-type semiconductor area 12 is formed, for example, by ion implantation of boron at an acceleration energy of 5 to 10 keV and a dose of about $5\times10^{13}$ atoms/cm$^2$. In this case, boron can be implanted at an angle of 30 to 50° to the side surface of each gate electrode (at an angle of 30 to 50° to the perpendicular of the P type semiconductor area), although this is not specified specially. The N-type semiconductor area 13 is formed, for example, by ion implantation of phosphorus at an acceleration energy of 50 to 80 keV and a dose of about $1\times10^{13}$ atoms/cm$^2$. In this case, boron can be implanted at an angle of 30 to 50° to the side surface of each gate electrode (at an angle of 30 to 50° to the perpendicular of the P type semiconductor area). Consequently, the boron can be supplied sufficiently under the low density P-type semiconductor area 12, that satisfactory short channel characteristics can be obtained.

Thereafter, impurities are activated by a thermal treatment about 850°. In this case, the thermal treatment is performed for 20 to 30 min in an atmosphere of nitrogen containing about 1% of oxygen. Preferably, the RTA method should be used to finish the thermal treatment about 1000° C. within a short time to control the distribution of impurities.

The thermal treatment can also be performed at 700 to 800° C. in an atmosphere of oxidation before each of the low density semiconductor areas is formed. Consequently, the end portion of each gate electrode 7 that is thinned when in patterning can be reinforced, thus improving the withstand voltage of each gate.

Figure 12:
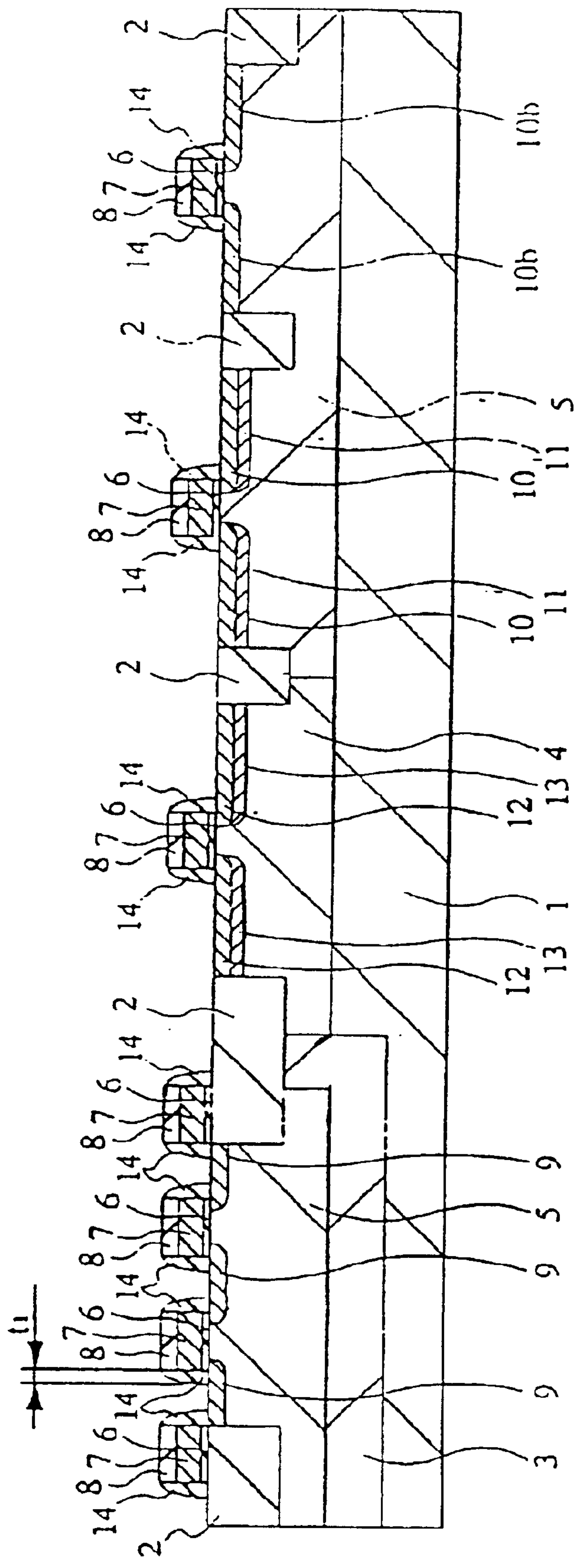
Figure 13:
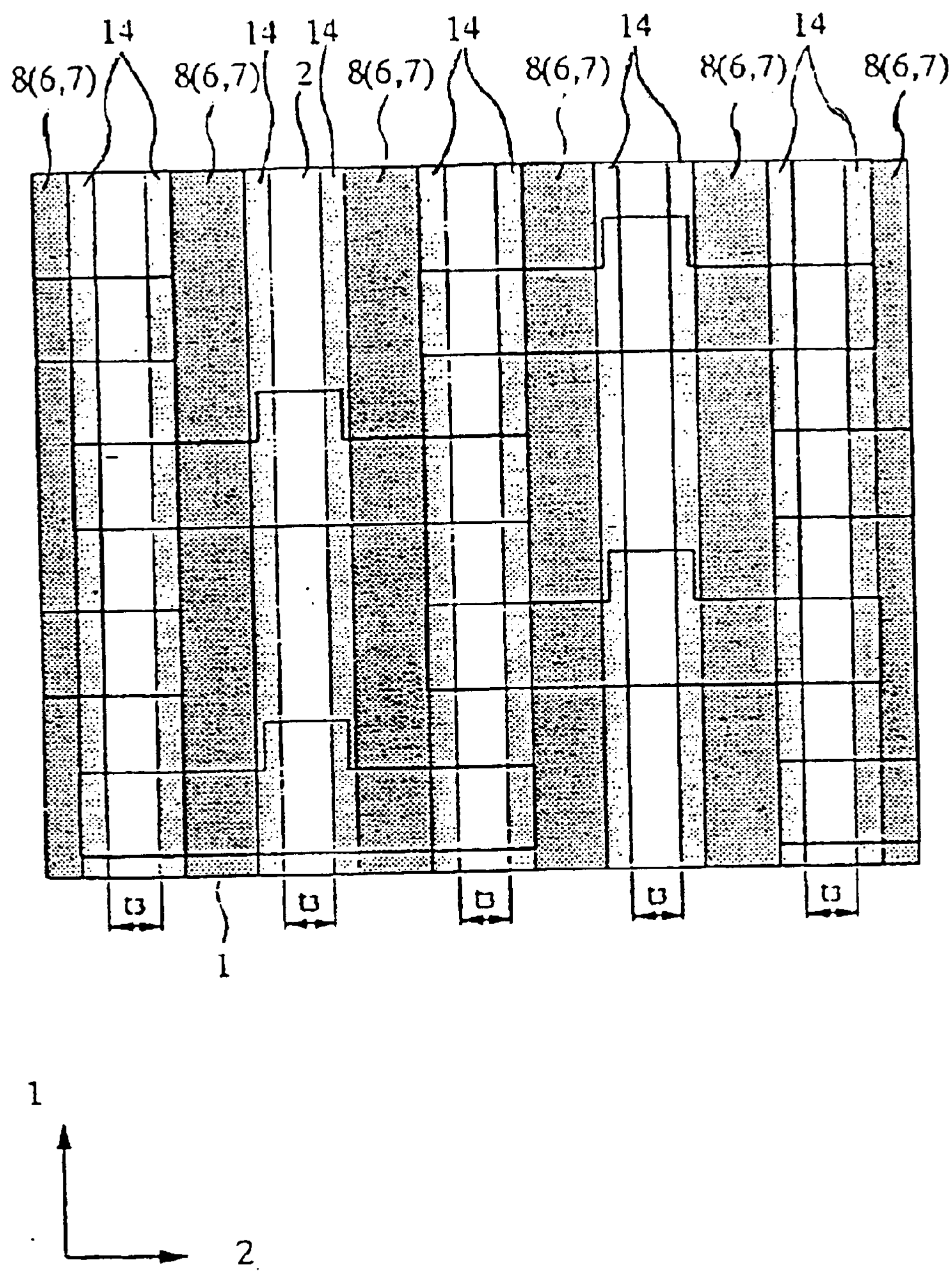

As shown in FIGS. 12 and 13, the first side wall spacers 14 composed of silicon nitride are formed on the side surfaces of the gate electrodes 7 and each silicon nitride film 8. The first side wall spacers 14 can be formed by depositing a silicon nitride film all over the surface using the CVD or the plasma CVD method, and then etching the film with anisotropic dry-etching. The thickness of each first side wall spacer 14 composed of silicon nitride should be 0.04 to 0.08 $\mu$m in the longitudinal direction (the second direction) under the gate electrode 7. Consequently, each gate electrode 7 is covered with the silicon nitride film 8 on its top surface and with the first side wall spacer 14 composed of silicon nitride on its side surfaces. Thus, connecting holes 19 and 21 to be explained later can be opened in a self-matching manner. In addition, since the thickness of the first side wall spacer 14 can be thinned to about 0.04 to 0.08 $\mu$m, the interval between gate electrodes 7 of the selecting MISFET Qs in the second direction can be reduced to improve the integrating degree of the semiconductor integrated circuitry of the present invention.

Figure 48:
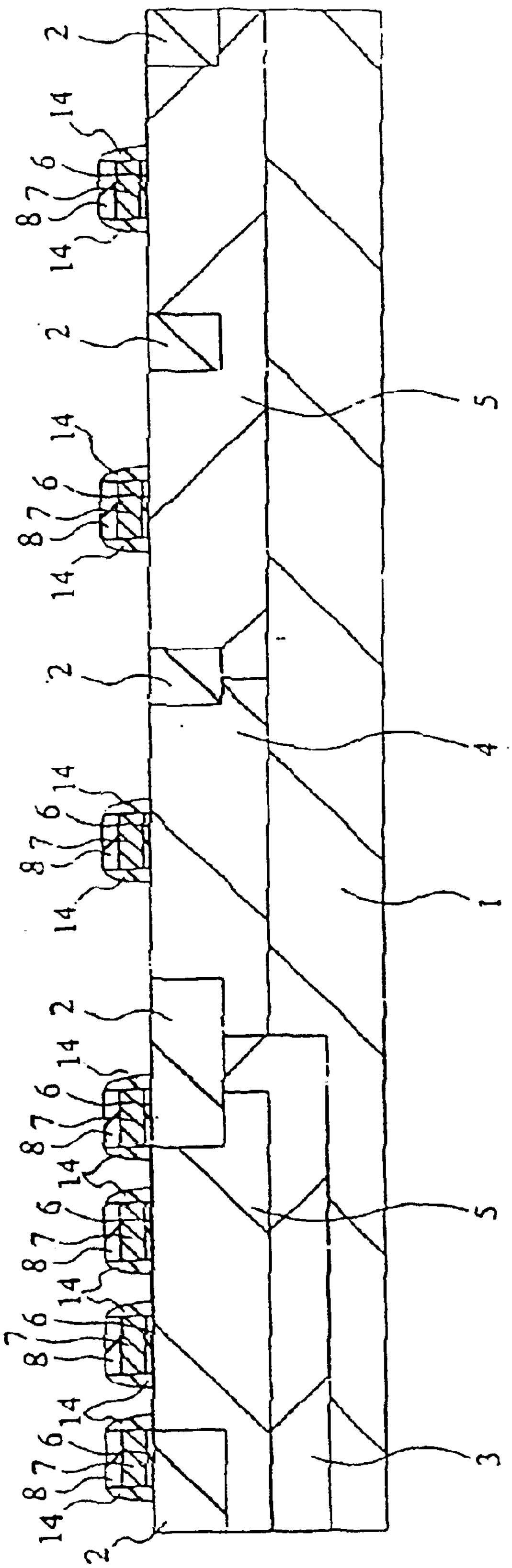
FIGS. 48 and 49 are cross sectional views of another example of how to manufacture the semiconductor integrated circuitry of the first embodiment of the present invention in the order of the processes.
Figure 49:
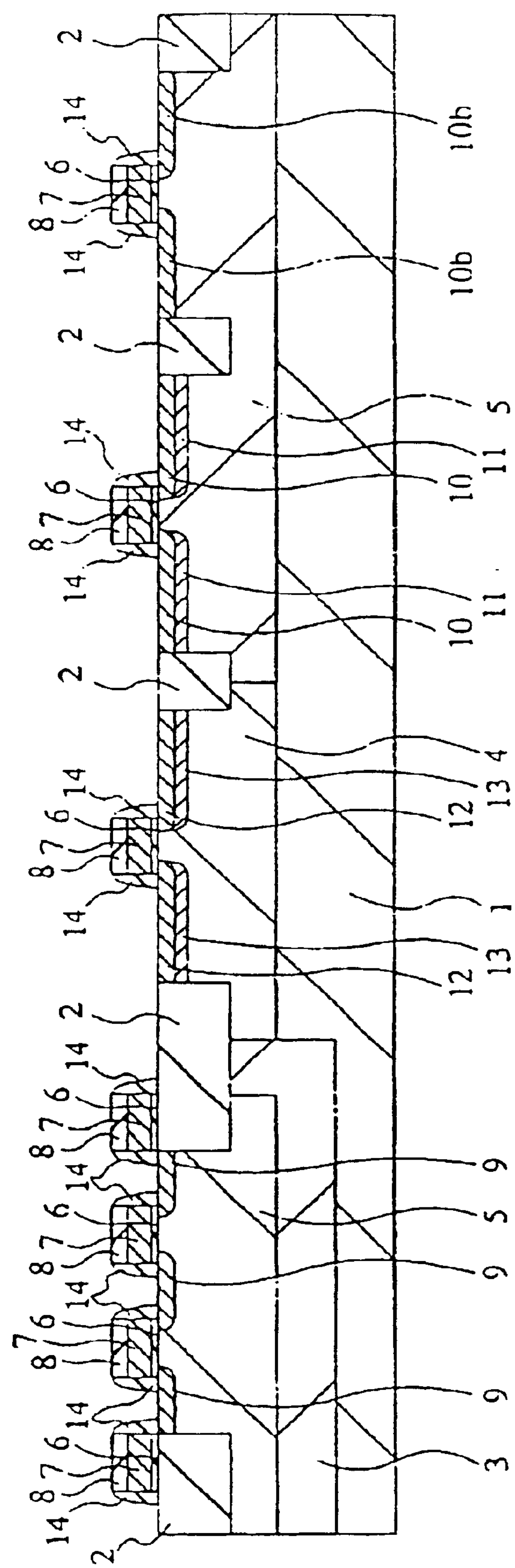

The first side wall spacers 14 composed of silicon nitride can also be thinned and the low density semiconductor area may be formed after the first side wall spacers 14 are formed. In this case, even shorter channel characteristics can be obtained. In other words, as shown in FIG. 48, after the first side wall spacers 14 are formed, low density N-type semiconductor areas 9, 10, and 10*b*, as well as a low density P-type semiconductor area 12 can be formed in a self-matching manner with respect to the first side wall spacers 14.

Figure 14:
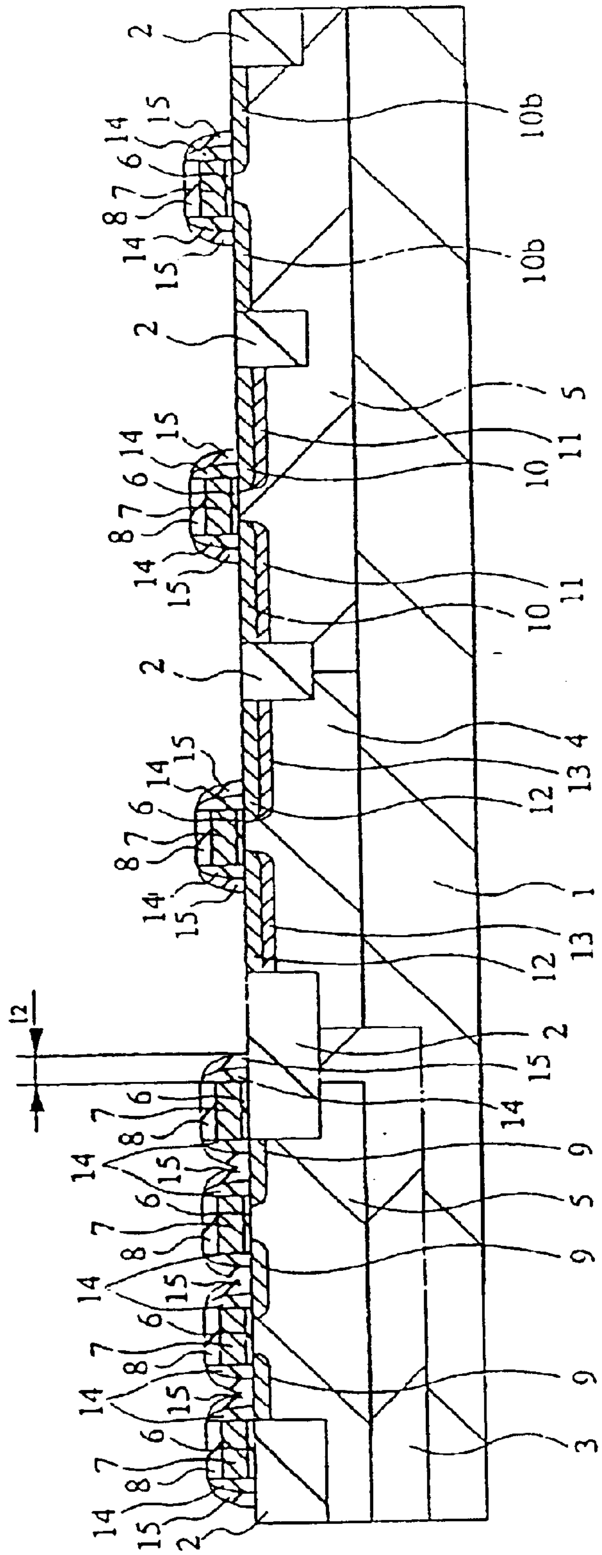
Figure 15:
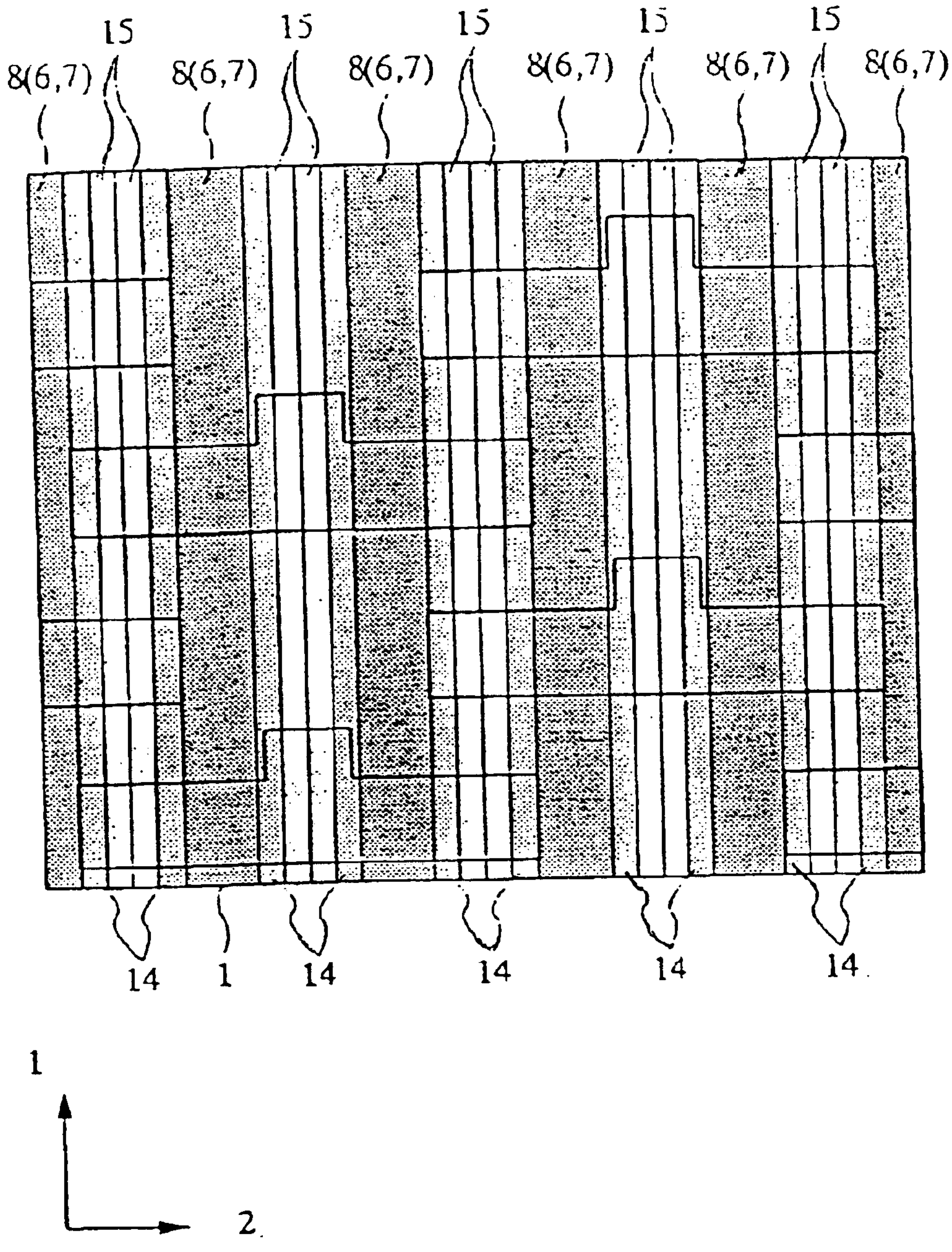

Next, as shown in FIGS. 14 and 15, the second side wall spacers 15 composed of silicon oxide are formed on the side surfaces of the first side wall spacers 14. The second side wall spacers 15 can be formed by depositing a silicon oxide film all over the, surface using the CVD or plasma CVD method, and then etching the film with anisotropic dry-etching. The thickness (width) of each second side wall spacer 15 should be greater than that of each first side wall spacer 14. The total thickness t2 of the first side wall spacer 14 composed of silicon nitride and the second side wall spacer 15 composed of silicon oxide should be 0.1 to 0.15 $\mu$m in the channel direction under the gate electrodes 7. At this time, even when a second side wall spacer 15 composed of silicon oxide fills the space between two gate electrodes 7 of the selecting MISFET Qs in the second direction, no problem will arise, as will be described later. In other words, only a space t3 of the first side wall spacer 14 composed of silicon nitride is needed between them. In other words, the connecting holes 19 and 21 can be opened in a self-matching manner with respect to the first side wall spacers 14, so the intervals t3 of the first side wall spacers 14 in the second direction are assumed to be openings of the connecting holes 19 and 21 respectively. In other words, the thickness t1 of the first side wall spacer 14 can be minimized in the second direction until a specified contact resistance is assumed in the intervals t3 of the first side wall spacers 14.

Figure 16:
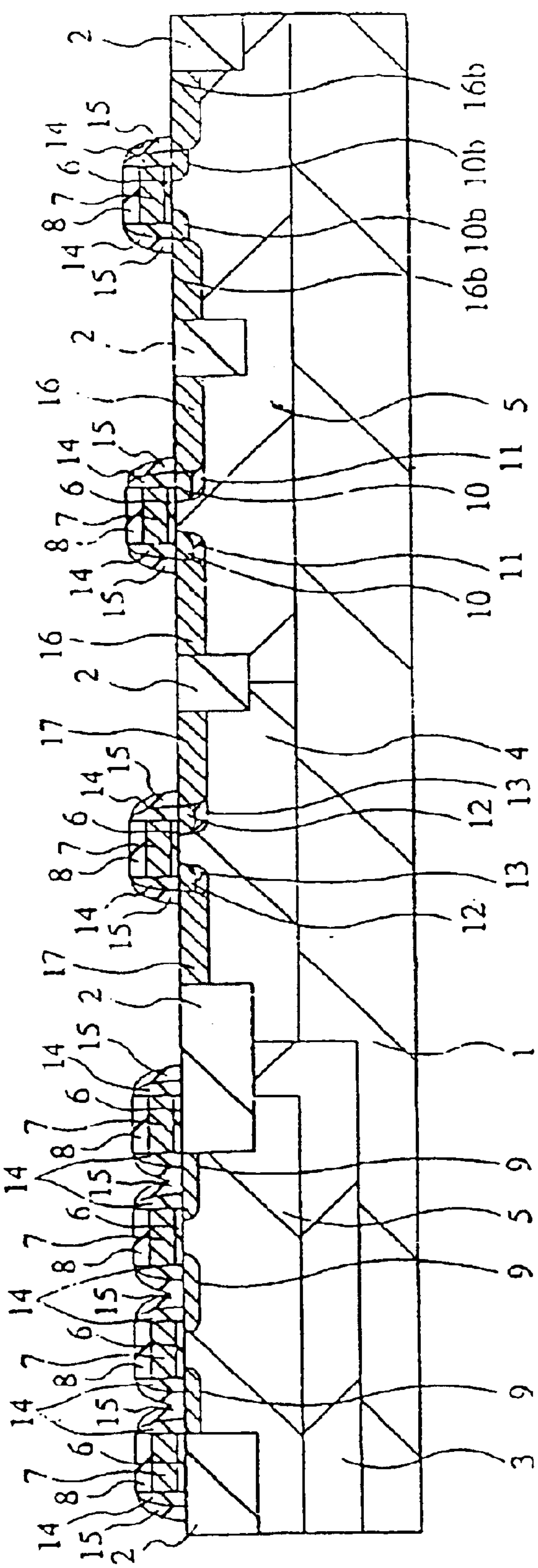

Next, the high density N-type semiconductor area 16 of the N channel MISFET Qn1 and the high density N-type semiconductor area 16*b* of the N channel MISFET Qn2 are formed as shown in FIG. 16. The high density N-type semiconductor areas 16, 16*b* of the N channel MISFET Qn1 and the high density N-type semiconductor area 16*b* of the N channel MISFET Qn2 can be formed, for example, by ion implantation by implanting arsenic at an acceleration energy of 20 to 60 keV and at a dose of about 1 to 5×10^15 atoms/$cm^2$. At this time, no high density semiconductor area is formed in the selecting MISFET Qs. Consequently, it is possible to suppress crystallization defects caused by ion implantation when forming a high density semiconductor area, and prevent a problem that the leakage current from a PN junction is increased to shorten the refreshing time.

Next, the high density P-type semiconductor area 17 of the P channel MISFET Qp1 is formed. The high density P-type semiconductor area 17 can be formed, for example, by ion implantation of boron at an acceleration energy of 10 to 20 keV and at a dose of about 1 to 5×10^15 atoms/$cm^2$. Thereafter, the impurities in the area are activated by a thermal treatment at about 850° C., which treatment is performed for 20 to 30 min in an atmosphere of nitrogen containing about 1% of oxygen. Preferably, the RTA method should be used to finish the thermal treatment at about 1000° C. within a short time to control distribution of the impurities.

Since the second side wall spacers 15 are provided and the high density semiconductor area can be formed with the optimal side wall spacer length t2, high performance N channel MISFETs Qn1 and Qn2, as well as a P channel MISFET Qp1 can be obtained. On the other hand, in the memory array, the thickness t1 of the first side wall spacers 14 and the interval t3 between the first side wall spacers 14 can be reduced and the interval in the second direction can be minimized. In addition, the opening margin of the connecting holes 19 and 21 can be taken widely to lower the contact resistance.

Figure 17:
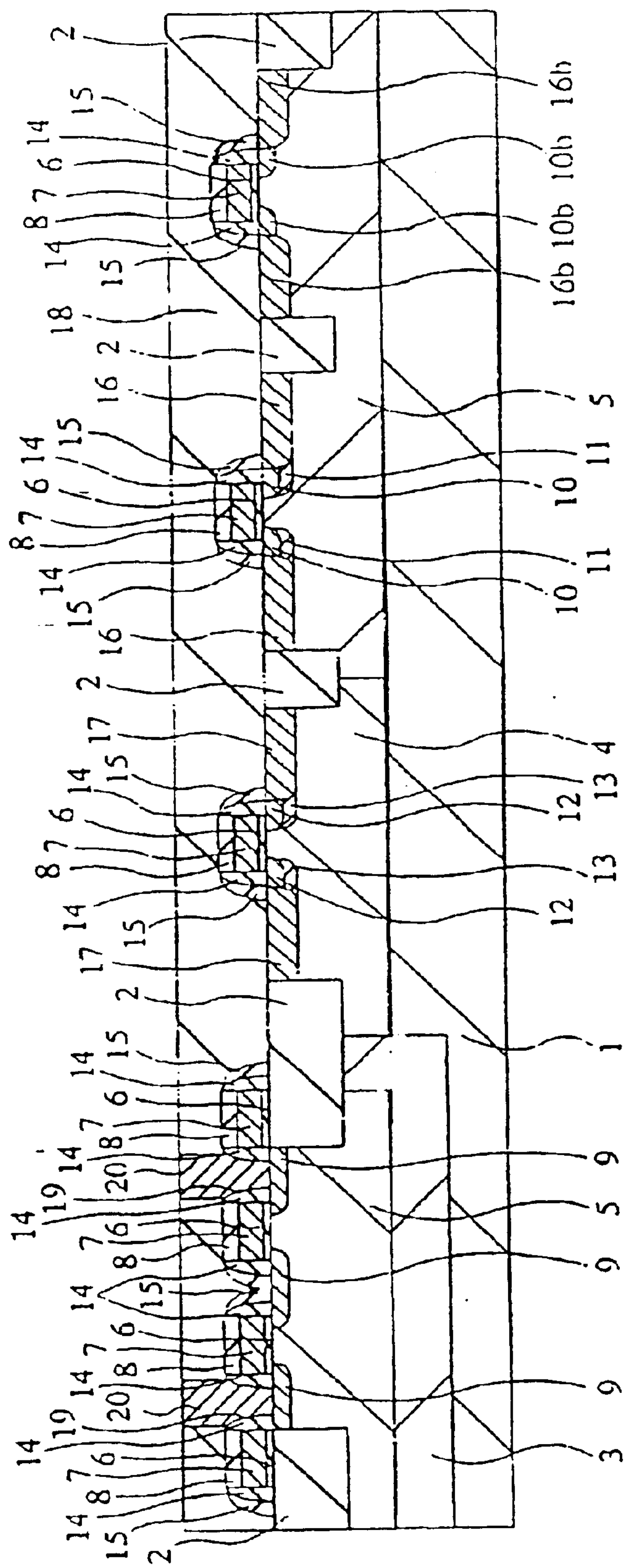
Figure 18:
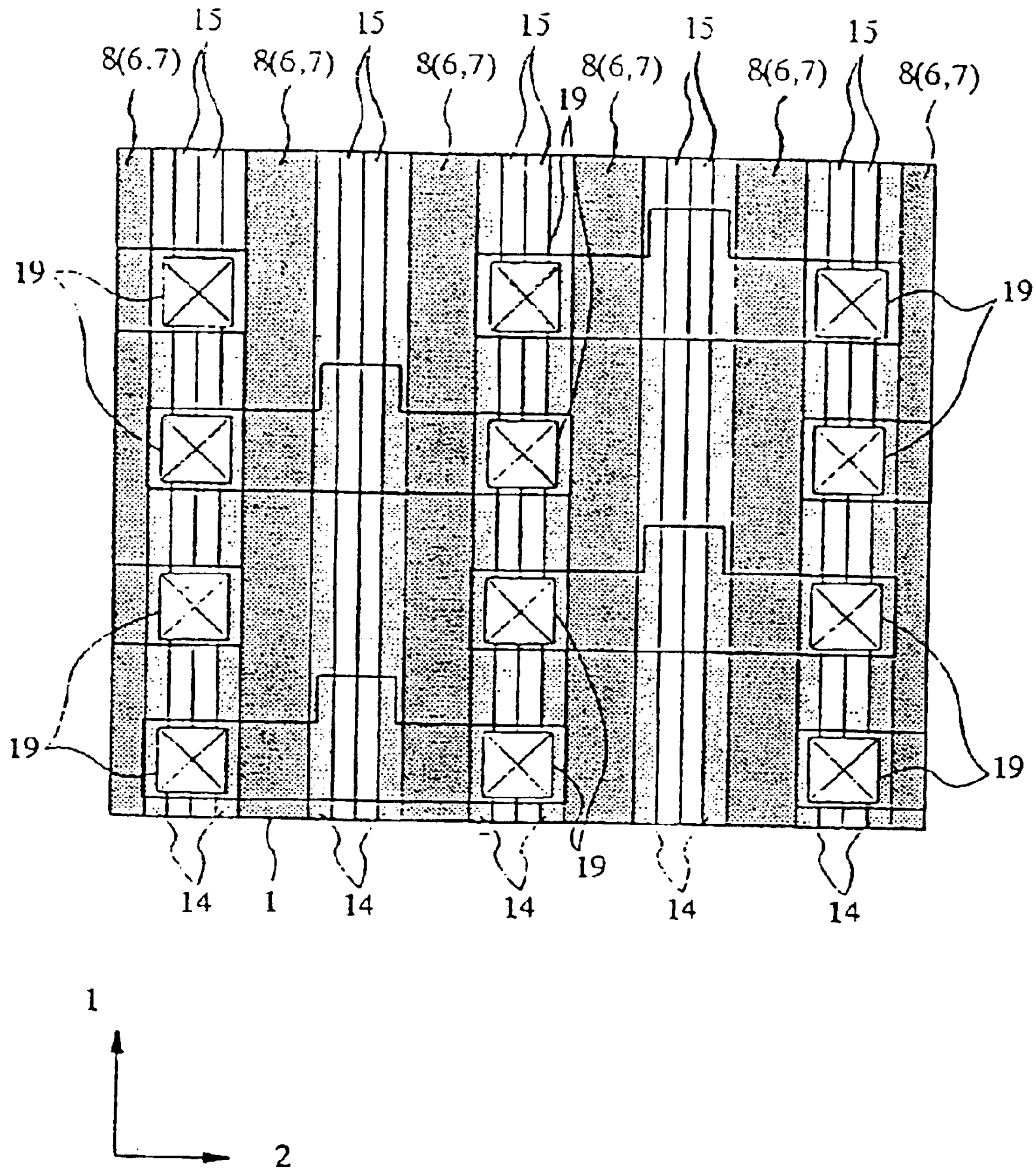

Next, an insulating film 18 is formed as shown in FIGS. 17 and 18. The film 18 is composed of a silicon oxide film or a silicon oxide film into which either or both of boron and phosphorus are doped. The insulating film 18 is formed by depositing a silicon oxide film or a silicon oxide film into which one or both of boron and phosphorus are doped all over the surface, for example, the CV-D or plasma CVD method, and then the film is smoothed using the reflowing method or the CMP method so that the height from the surface of the substrate is smoothed uniformly.

Furthermore, connecting holes 19 are formed so as to be connected to the one side electrodes of the storage capacity element C for storing information, for the DRAM memory cells. The connecting holes 19 are formed by dry-etching under the conditions determined so that the selection ratio of the silicon nitride film 8 on the gate electrodes 7 and the first side wall spacers 14 composed of silicon nitride to the second side wall spacers 15 composed of silicon oxide and the insulating film 18 composed of silicon oxide is set to be large. In other words, the etching conditions are set so that the etching speed (capacity) of the silicon nitride is slower and the etching speed (capacity) of the silicon oxide is faster. Such etching is possible when performed together with Ar spattering performed for the mixed gas of, for example, $C_4F_8$ and $O_2$. Etching is carried out under conditions to allow the connecting holes 19 to be opened in a self-matching manner with respect to the first side wall spacers 14. In other words, since light lithography technology is used to form the connecting holes 19, the margin of alignment in the second direction can be reduced and fine pitches can be assumed in the second direction.

Furthermore, a polycrystal silicon film containing impurities such as phosphorus is formed all over the semiconductor substrate 1 to lower the resistance. Then, anisotropic etching is performed to remove the polycrystal silicon film except for the connecting holes 19 to form an electric conductor 20 in each of the connecting holes 19.

Thereafter, an insulating film (silicon oxide film, not illustrated) is deposited to cover the electric conductor 20.

Figure 19:
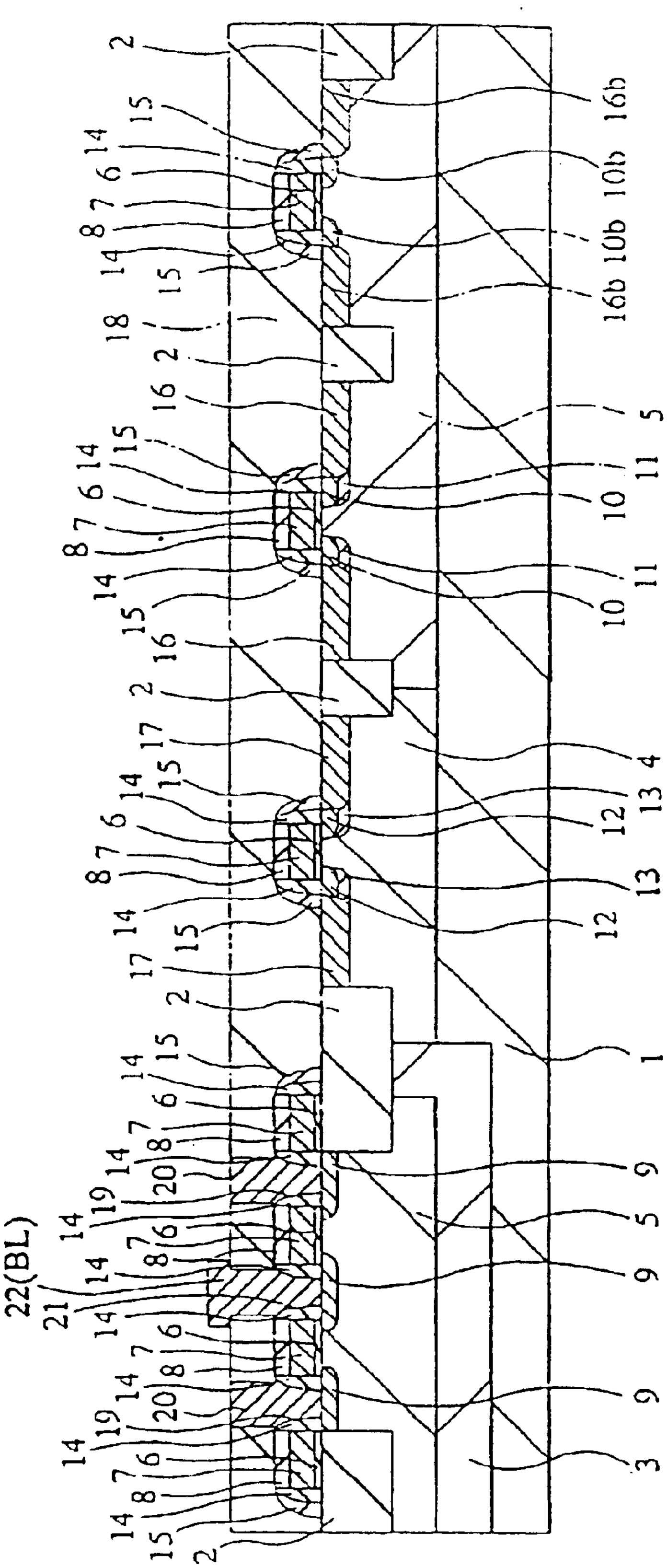
Figure 20:
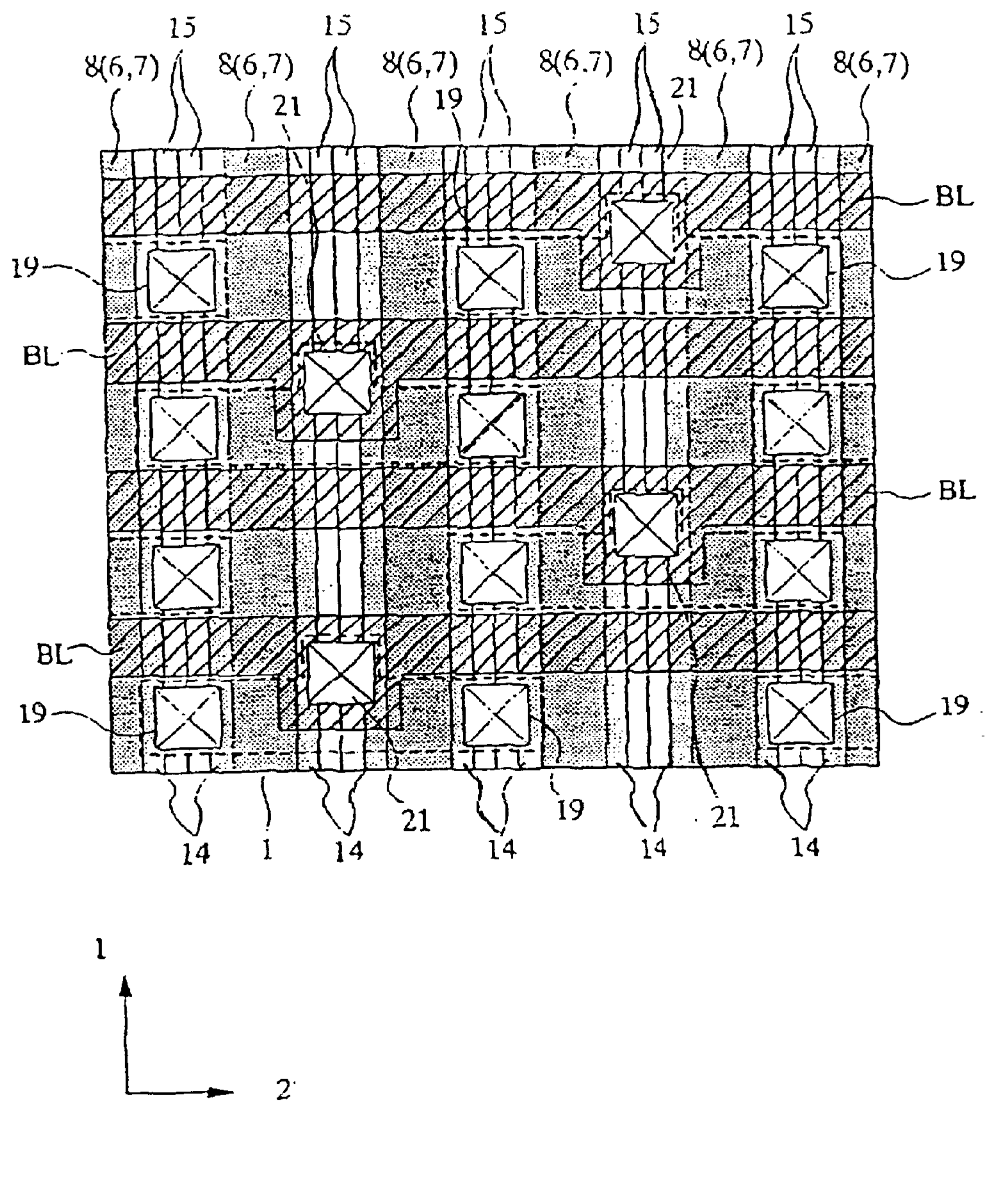

Next, connecting holes 21 to be connected to the DRAM memory cell bit lines BL are formed as shown in FIGS. 19 and 20. Dry etching is performed to form the connecting holes 21 under conditions in which a large selection ratio of silicon nitride to silicon oxide is taken, just like the connecting holes 19. Consequently, each of the connecting holes 21 can be opened in a self-matching manner with respect to the first side wall spacer 14. Thus, just like the connecting holes 19, when the light lithography is used to form the connecting holes 21, the margin of alignment in the second direction can be reduced and fine pitches of members can be assumed in the second direction.

Furthermore, a silicon film containing impurities such as phosphorus or a silicide film such as WSi is formed to lower the resistance. Then, an electric conductor 22 is formed in each connecting hole 21 using a photo resist as a mask and is patterned so that the electric conductor 22 is extended vertically (to second direction) to the word line WL to serve as a bit line BL.

Figure 21:
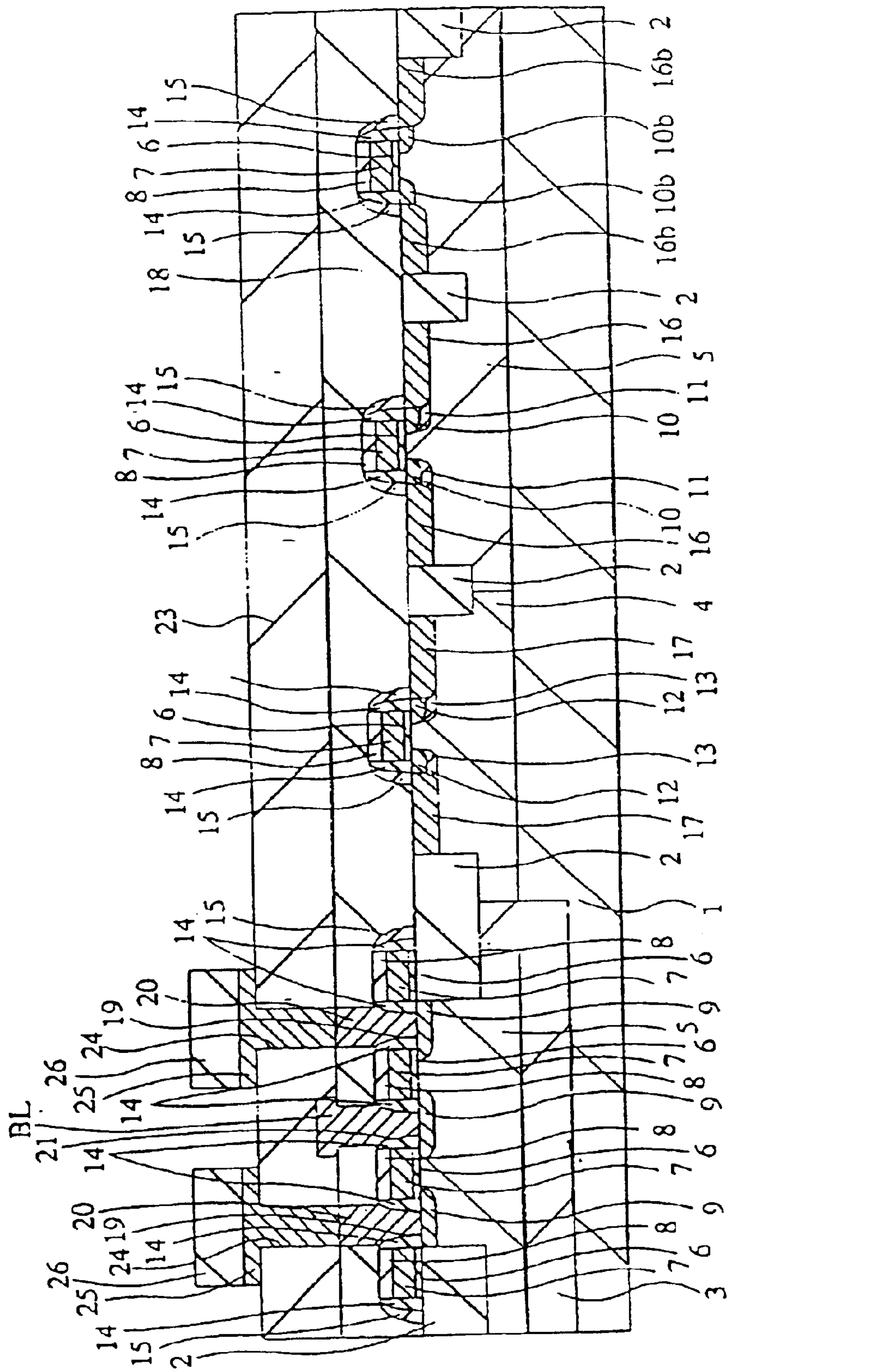
Figure 22:
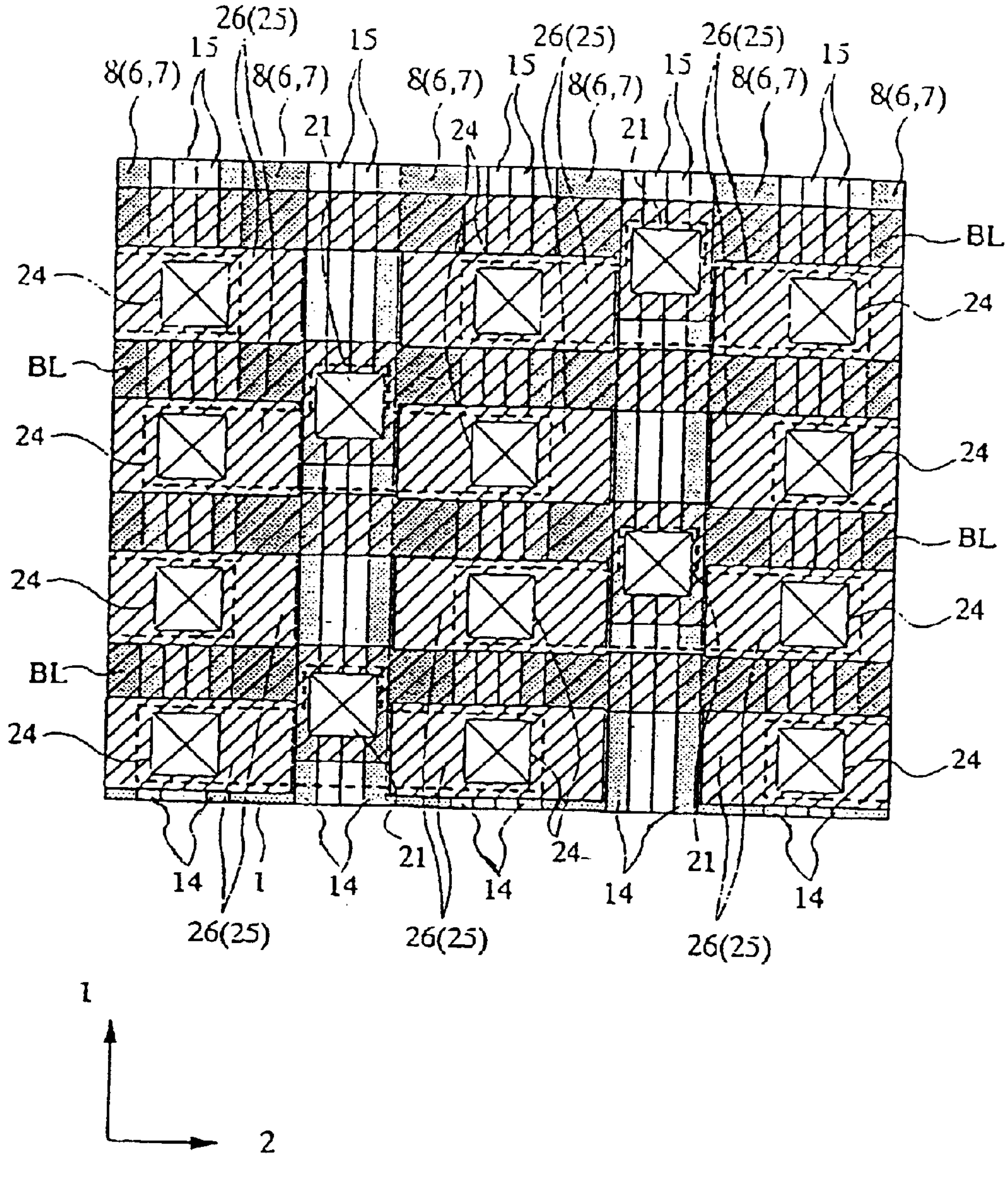

Next, as shown in FIGS. 21 and 22, an insulating film 23 composed of silicon oxide or silicon oxide into which one or both of boron and phosphorus are doped is formed. The insulating film 23 is formed just like the insulating film 18 using, for example, the CVD or plasma CVD method so that a silicon oxide film or a silicon oxide film in which one or both of boron and phosphorus are doped is deposited all over the surface, and then the film is flattened using the reflowing or CMP method so that the height from the surface of the substrate 1 is smoothed uniformly. Then, connecting holes 24 are formed so as to be connected to one of the electrodes of the storage capacity element C for storing information DRAM memory cells. The connecting holes 24 are dry-etched to form holes reaching the electric conductors 20. Such etching is possible when performed together with Ar spattering carried out with a mixed gas of $CF_4$ and $CHF_3$.

Furthermore, electric conductors 25 are formed. The electric conductors 25 are used as one of the electrodes of the storage element C for storing DRAM memory cell information. Each electric conductor is formed with a polycrystal silicon film containing impurities such as phosphorus, etc. or a silicide film such as WSi, etc. to reduce the resistance. Then, an insulating film 26 composed of, for example, silicon oxide, is formed and an electric conductor 25 is formed in each connecting hole using a photo resist as a mark. And, both the insulating film 26 and the electric conductors 25 are patterned so as to be used as one of the electrodes of the storage element C for storing information.

Figure 23:
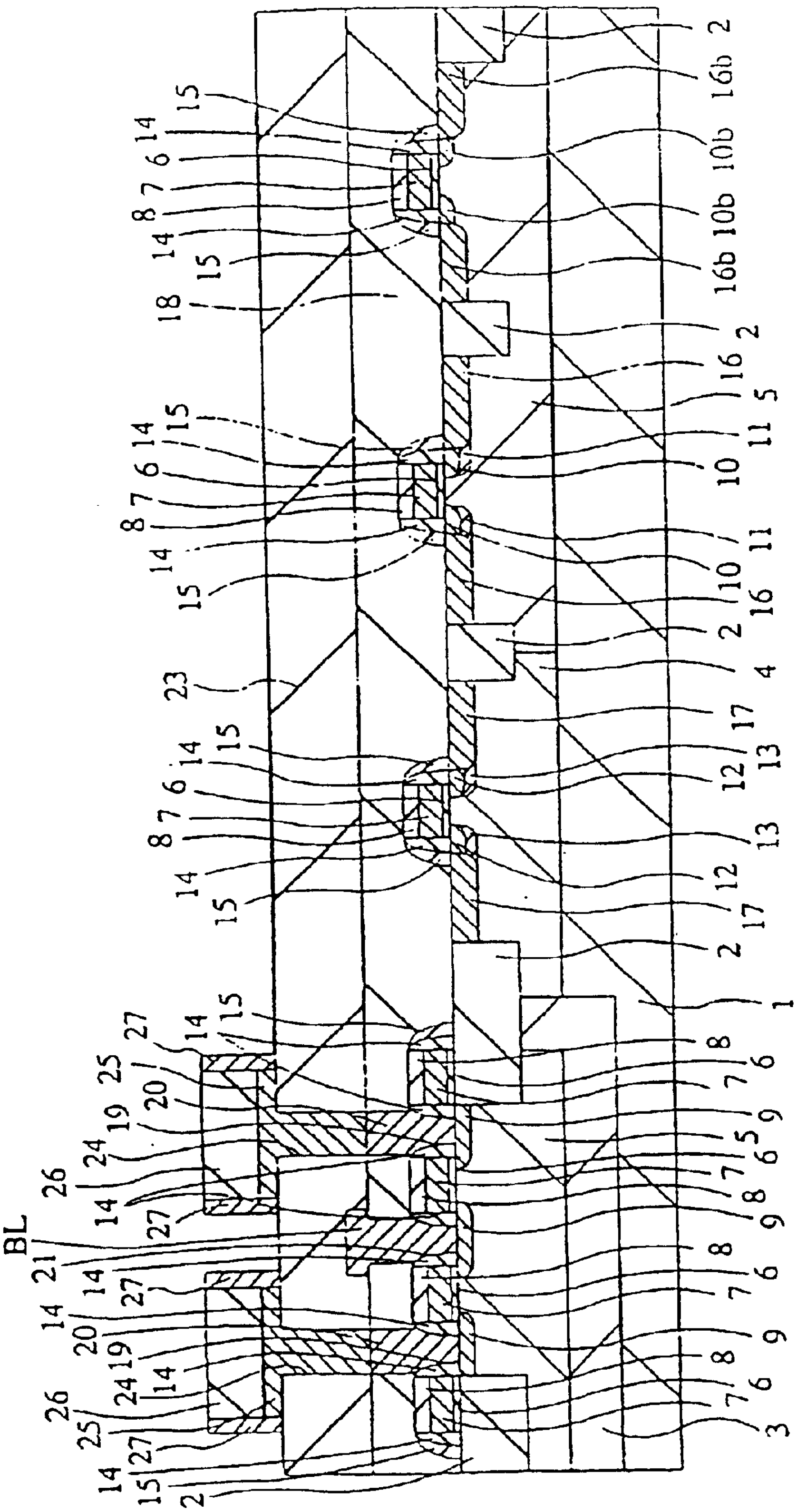

As shown in FIG. 23, a polycrystal silicon film containing impurities such as phosphorus or a silicide film such as WSi is formed to lower the resistance. Then, anisotropic dry etching is performed to form electric conductors 27 connected to the electric conductors 25 on the side surfaces of each insulating film 26. The electric conductors 25 and 27 are used to form one of the electrodes of the storage capacity element C for storing information.

Figure 24:
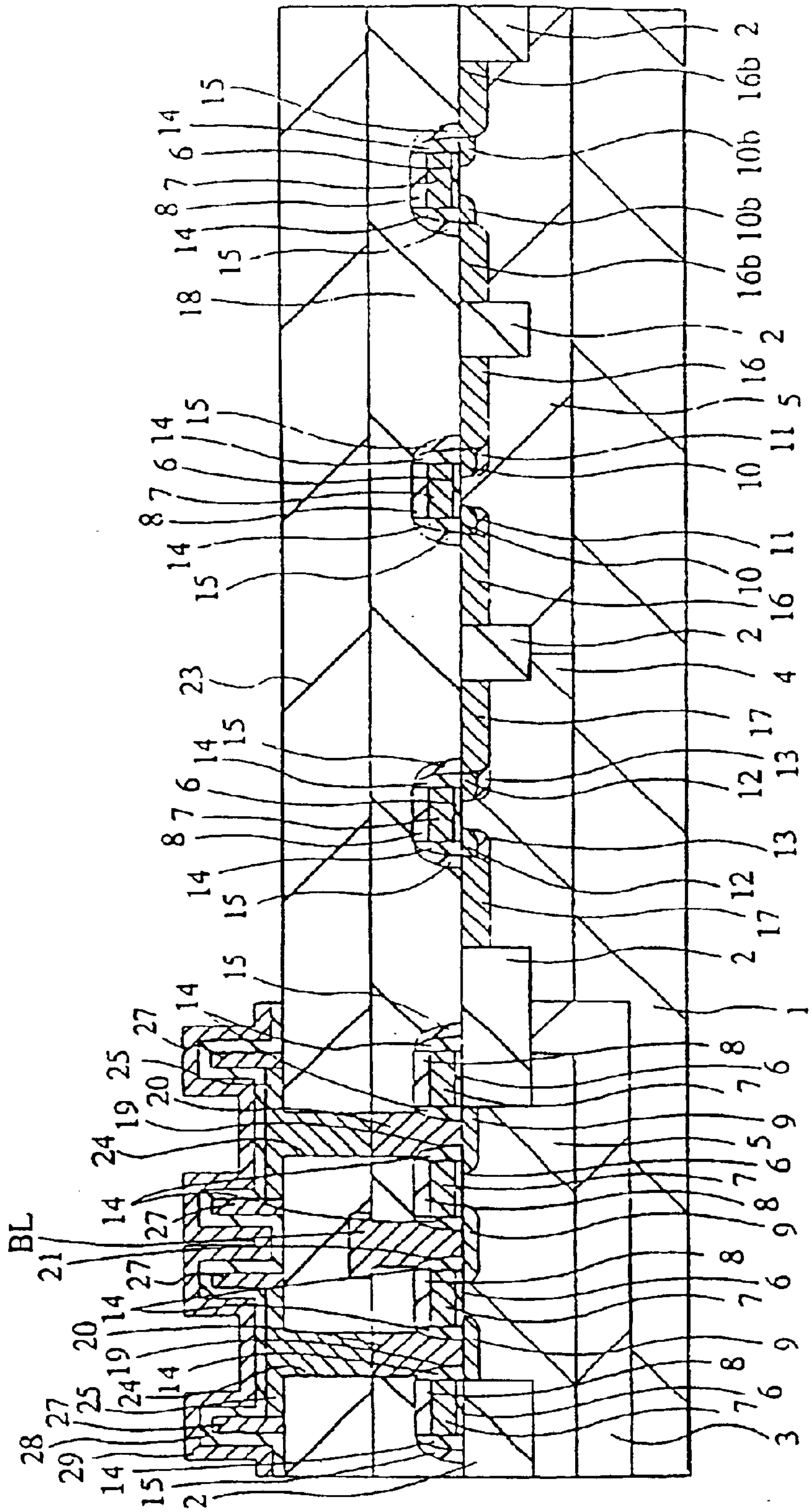

As shown in FIG. 24, after the insulating film 26 is removed, a dielectric material film 28 and upper electrodes 29 are formed sequentially for the storage capacitor element C for storing information. The dielectric material film 28 is formed with a laminated film composed of silicon oxide and silicon nitride or a tantalum oxide ($Ta_2O_3$) film. The upper electrodes 29 are formed with a polycrystal silicon film containing impurities such as phosphorus or a silicide film such as WSi to lower the resistance.

Figure 25:
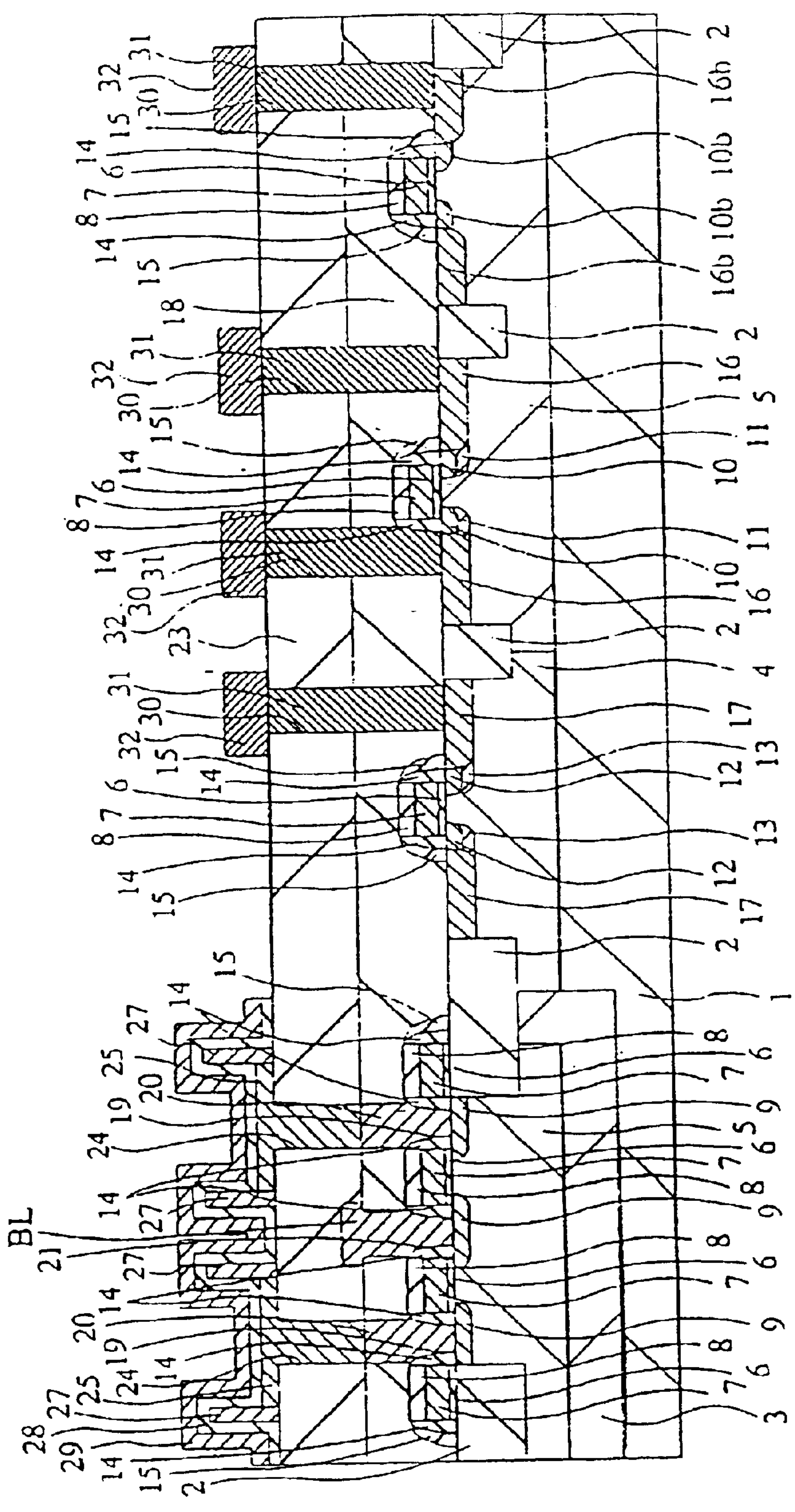

As shown in FIG. 25, connecting holes 30 are formed. The connecting holes 30 are used to connect the first wiring 32 to gate electrodes or a semiconductor area. Just like the connecting holes 19 and 21, the connecting holes 30 are formed under conditions where a large selection ratio is attained for the silicon nitride 8 and the first side wall spacers 14 composed of silicon nitride to the second side wall spacers 15 composed of silicon oxide and the insulating film 8 composed of silicon oxide. Then, a connecting member 31 is formed in each connecting hole 30. The connecting member 31 is formed by forming a titanium (Ti) film of 10 to 50 $\mu$m in thickness and titanium nitride (TiN) film of about 100 nm in thickness by the spattering method, and then removing the tungsten film from areas other than the connecting holes 30 using dry etching or the CMP method.

Furthermore, the first wiring 32 is formed. The first wiring can be formed with a laminated film made of a titanium nitrate (TiN) and an aluminum (AL) film containing copper (Cu).

Finally, an insulating film 33, connecting holes 34, connecting members 35, the second wiring 36, an insulating film 37, connecting holes 38, connecting members 39, and the second wiring 40 are formed sequentially. The insulating films 33 and 37 are formed just like the insulating film 23. The connecting holes 34 and 38 are formed just like the connecting holes 30. The connecting members 35 and 39 and the second and third wirings 36 and 40 are formed just like the connecting members 31 and the first wiring 32. And, a silicon nitride or a laminated passivation film 41 composed of silicon oxide is formed under the silicon nitride by the CVD method, and then a bonding area 42 is formed almost to complete the manufacturing of the semiconductor integrated circuitry shown in FIG. 1.

($2^{nd}$ Embodiment)

Figure 26:
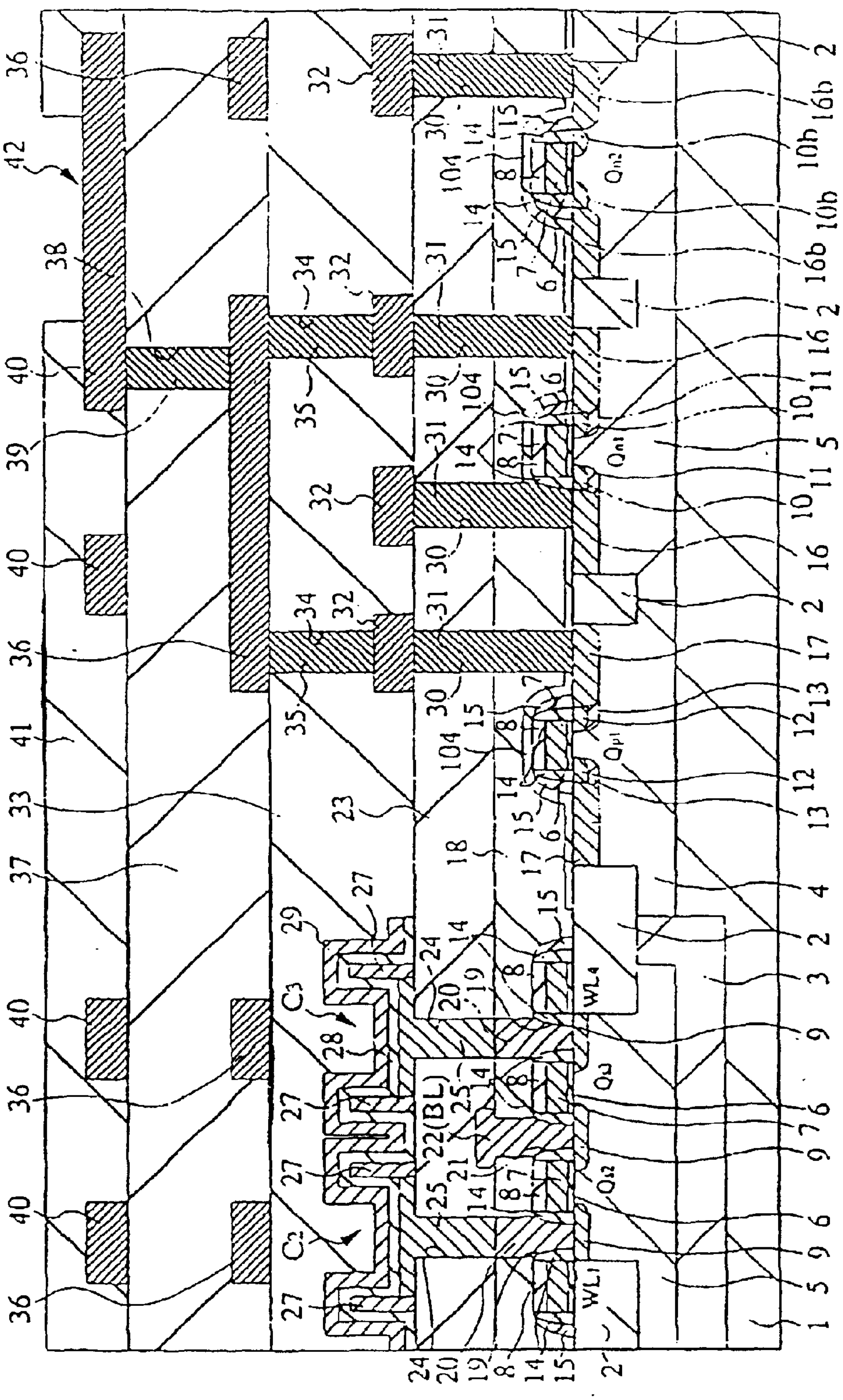
FIG. 26 is a cross sectional view of the major portion of a semiconductor integrated circuit representing a second embodiment of the present invention.

FIG. 26 is a cross sectional view of the major portion of a semiconductor integrated circuitry representing another embodiment of the present invention.

The semiconductor integrated circuitry in the second embodiment is the same as that in the first embodiment except that a silicon nitride film 104 is formed on the N channel MISFET Qn1, the N channel MISFET Qn2, and the P channel MISFET Qp1, and this silicon nitride film 104 is used as an etching stopper for forming connecting holes 30. Thus, since other structural features are the same as those in the first embodiment, an explanation thereof will be omitted. And, since a silicon nitride film 104 is provided in the semiconductor integrated circuitry in this second embodiment, even when some of the connecting holes 30 overlap the field insulating film 2, as shown on the right side of the P channel MISFET Qp1 in FIG. 26, the field insulating film 2 is prevented from over-etching when the connecting holes 30 are opened. Leakage current and other problems to be caused by over-etching can thus be suppressed, thereby maintaining the performance and reliability of the semiconductor integrated circuitry.

Figure 27:
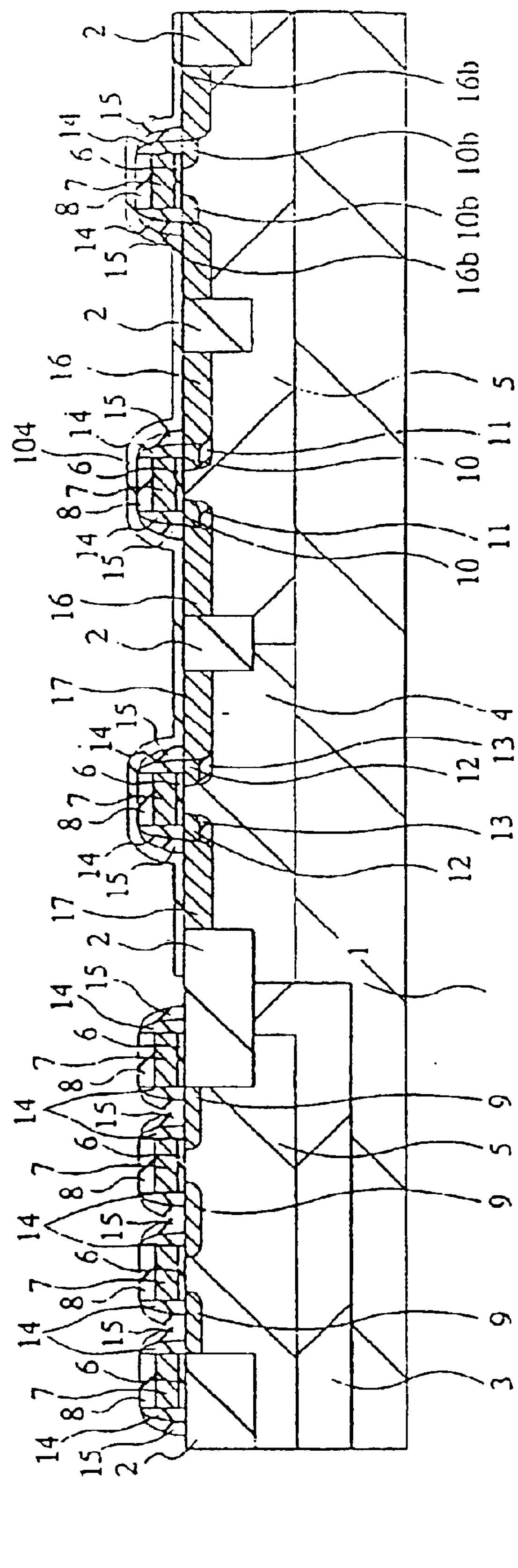
FIGS. 27 to 29 are cross sectional views showing a method of manufacturing the semiconductor integrated circuitry of the second embodiment in the order of the processes.
Figure 28:
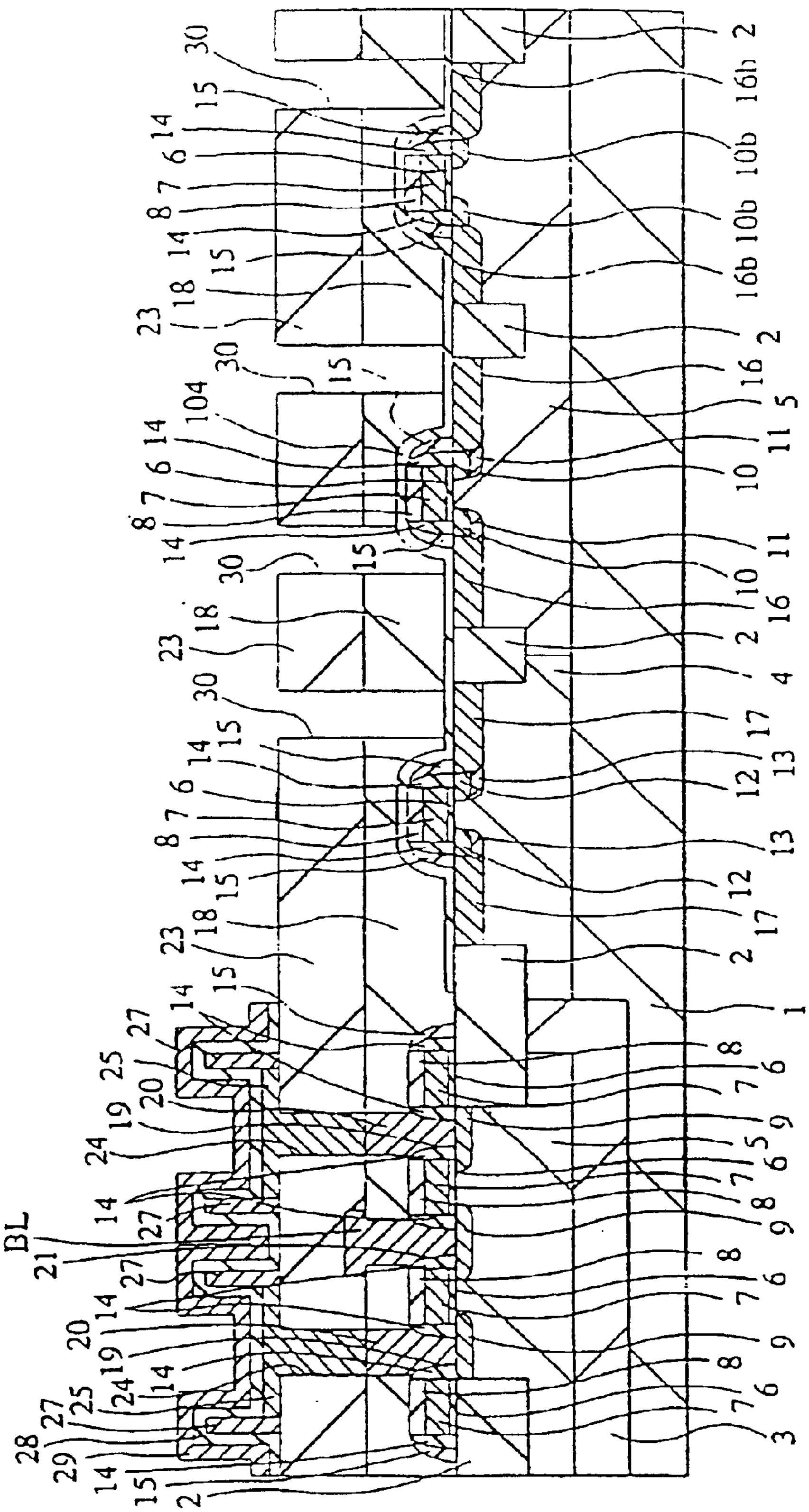
Figure 29:
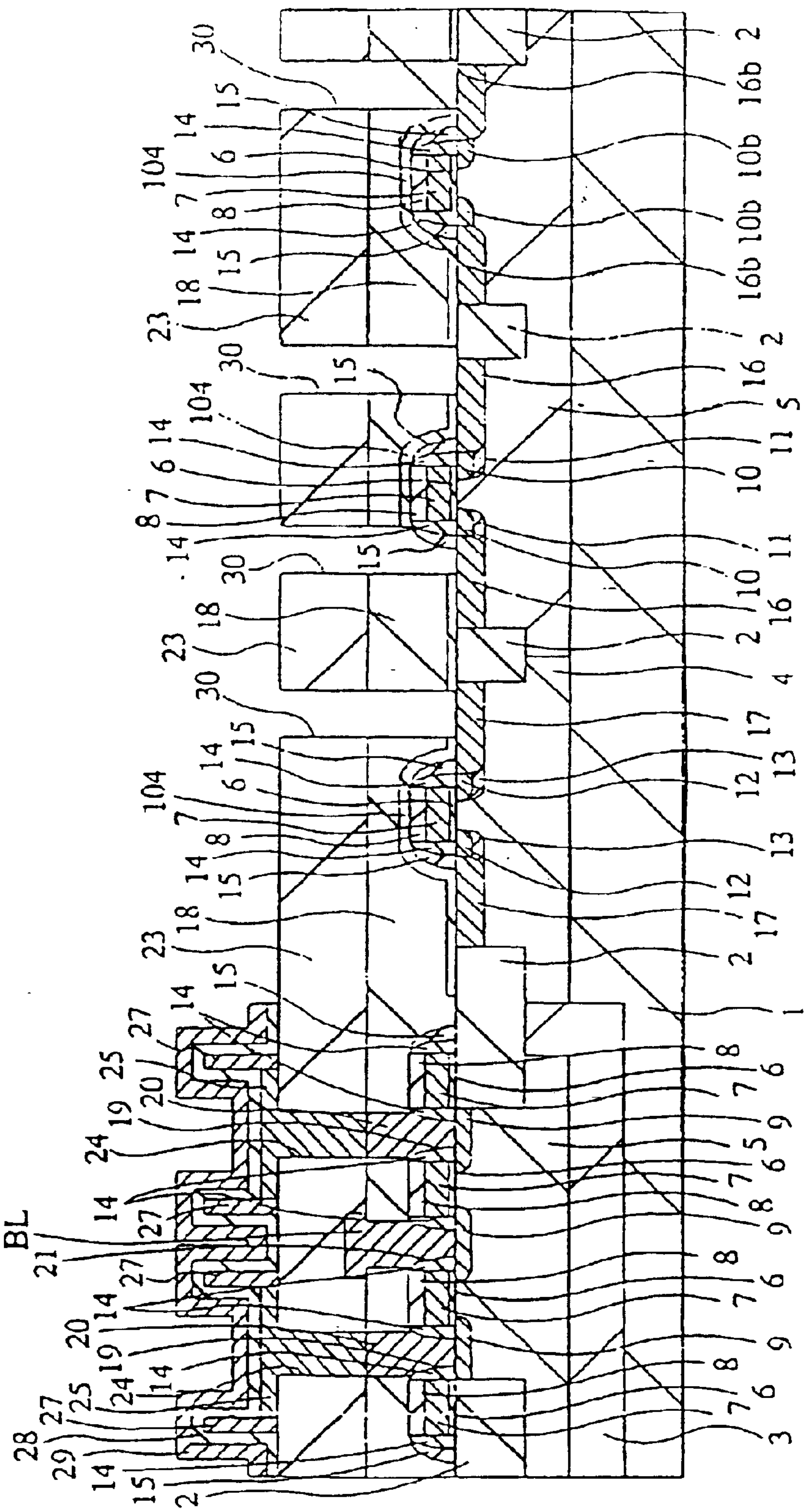

Hereunder, a method of manufacturing the semiconductor integrated circuitry in the second embodiment will be described with reference to FIGS. 27 to 29. FIGS. 27 to 29 are cross sectional views indicating how to manufacture the semiconductor integrated circuitry of the second embodiment in the order of the processes.

Just like the first embodiment, at first, the selecting MISFET Qs, the N channel MISFETs Qn1 and Qn2, and the P channel MISFET Qp1 are formed, and then a silicon nitride film 104 is deposited on the N channel MISFETs Qn1 and Qn2, and the P channel MISFET Qp1 with a thickness of about 50 nm. Then, the silicon nitride film 104 masked with photo resist is not removed by etching except for at least the area where the connecting holes 19 and 21 of the DRAM memory cells are formed. (FIG. 27).

Thereafter, just like in the first embodiment, the insulating film 18, the bit lines BL, and the storage capacity element C for storing information are formed. Then, when the connecting holes 30 are opened, the first stage etching is performed (FIG. 28). In this first stage etching, etching selection ratio is set so that the silicon oxide etching is faster than the silicon nitride etching, so to speak, under the condition of a high etching selection rate. Consequently, the connecting holes 30 can be opened surely up to the surface of the silicon nitride 104. In addition, in this first stage etching, since the silicon nitride film 104 functions as an etching stopper, the etching can be performed sufficiently to take a larger process margin without considering the peril of over-etching.

Next, the second stage etching is performed for the silicon nitride film 104 at the bottom of each connecting hole 30 (FIG. 29). This second stage etching is performed under conditions for etching silicon nitride, and there is no need to take an etching selection ratio for the silicon oxide. The etching at this time is to be a little deeper than the thickness of the silicon nitride film 104. For example, the etching depth is to be 110 to 130% of the thickness of the silicon nitride film 104. Such etching is possible when performed together with AR spattering with a mixed gas of CF4 and CHF3. As a result, the field insulating film 2 is hardly etched. This prevents the bottom of each etched connecting hole 30 from becoming deeper than the semiconductor area which forms a source and a drain. In other words, the silicon nitride film 104 is thinned sufficiently with respect to the field insulating film 2, so that even when the silicon nitride film 104 is over-etched, the field insulating film 2 is etched only by less than a half of the silicon nitride 104 in thickness, and the over-etching causes no problem to the processes.

Since the second stage etching is performed using such a silicon nitride film 104, the connecting holes 30 can be opened surely with an enough process margin. The performance and reliability of the semiconductor integrated circuitry can thus be maintained.

Hereafter, the manufacturing method of the second embodiment is entirely the same as that of the first embodiment, thus an explanation thereof will be omitted here.

($3^{rd}$ Embodiment)

Figure 30:
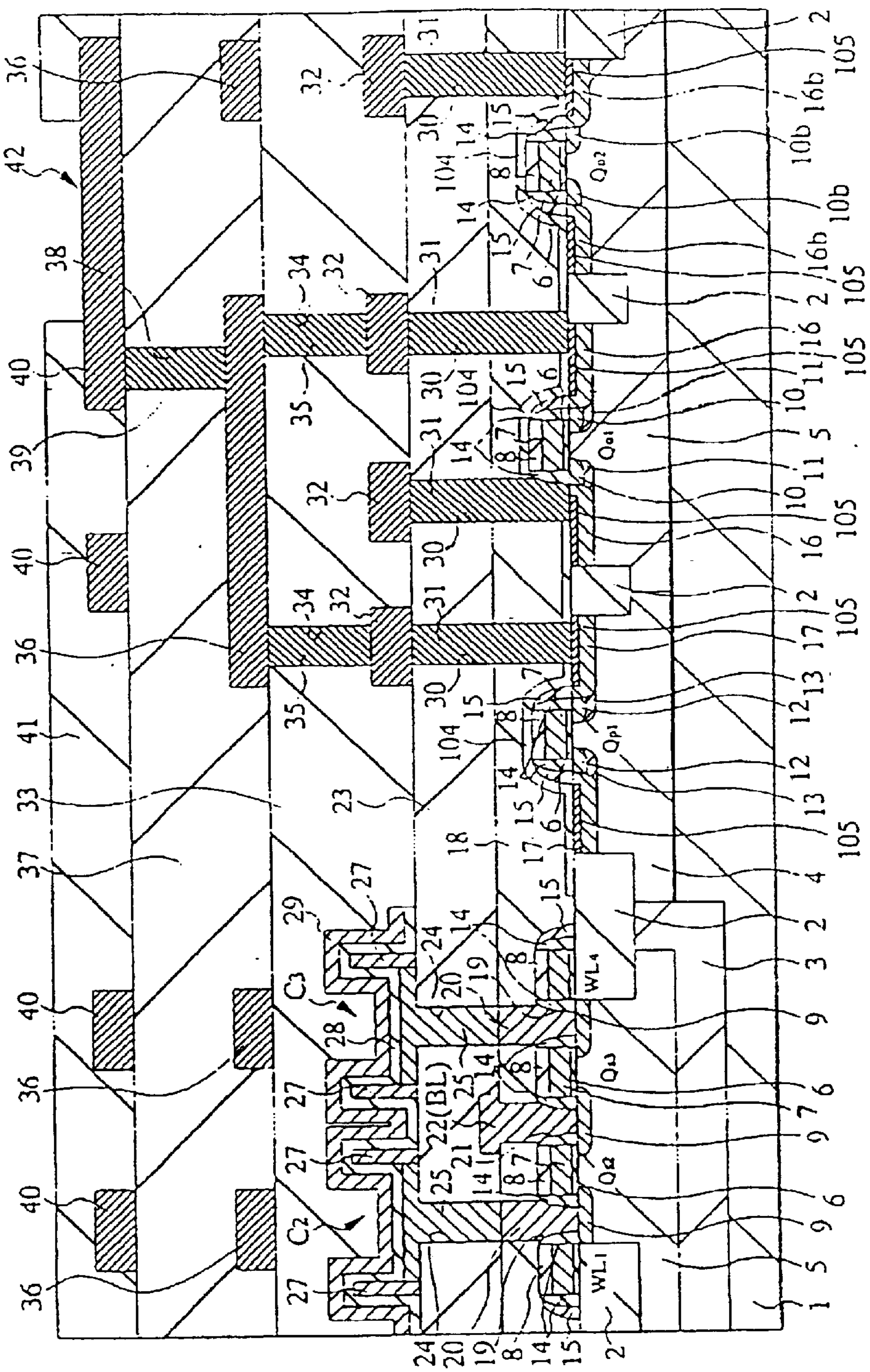
FIG. 30 is a cross sectional view of the major portion of a semiconductor integrated circuit representing a third embodiment of the present invention.

FIG. 30 is a cross sectional view of the major portion of a semiconductor integrated circuitry representing another embodiment of the present invention.

The semiconductor integrated circuitry in the third embodiment is the same as that in the first and second embodiments except that a silicide layer 105 is formed on the semiconductor areas except for at least the low density N-type semiconductor area which forms the source and the drain of the DRAM memory cell selecting MISFET Qs. In addition, in this third embodiment, a silicon nitride film 104 is also provided just like in the second embodiment. Consequently, the parasitic resistance of the semiconductor area which forms the sources and the drains of the MISFETs Qn1, Qn2, and Qp1 can be reduced to improve the performance of the MISFET Qn1, Qn2, and Qp1 significantly without increasing the leakage current from DRAM memory cells.

Figure 31:
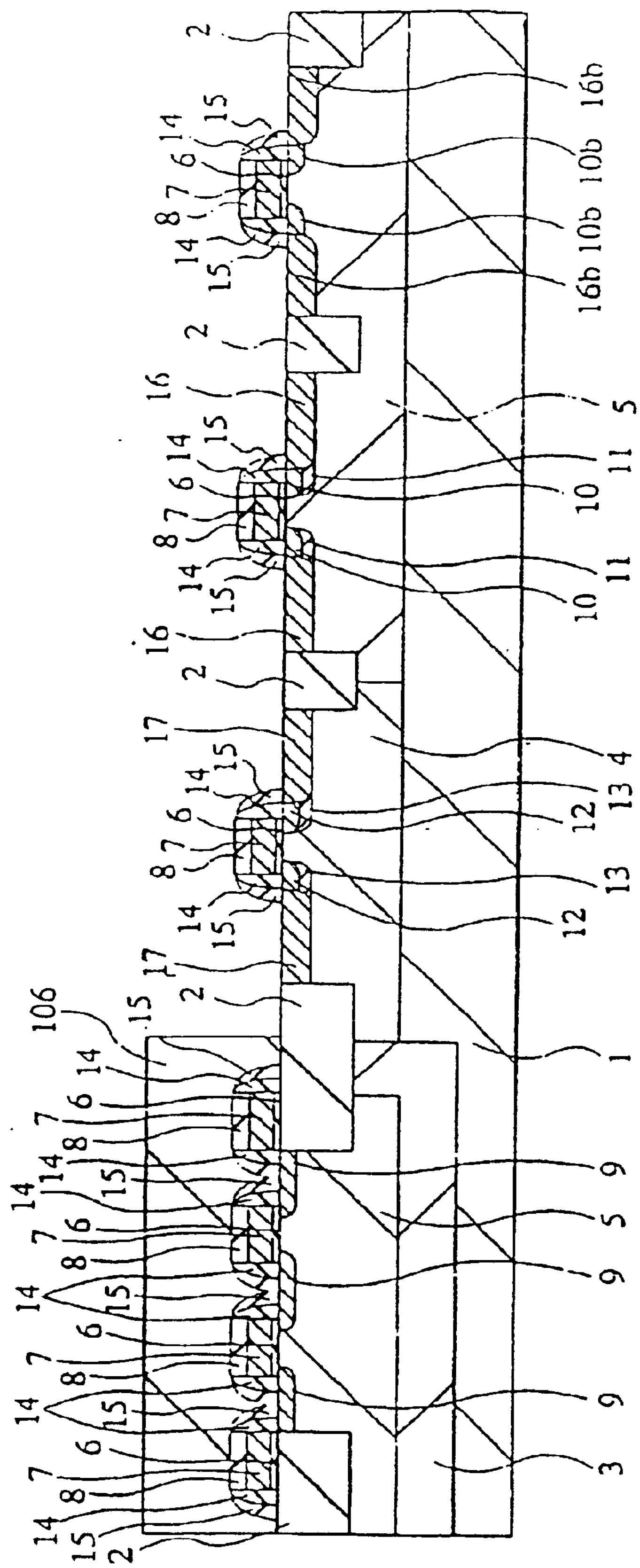
FIGS. 31 to 33 are cross sectional views showing a method of manufacturing the semiconductor integrated circuitry of the third embodiment in the order of the processes.
Figure 32:
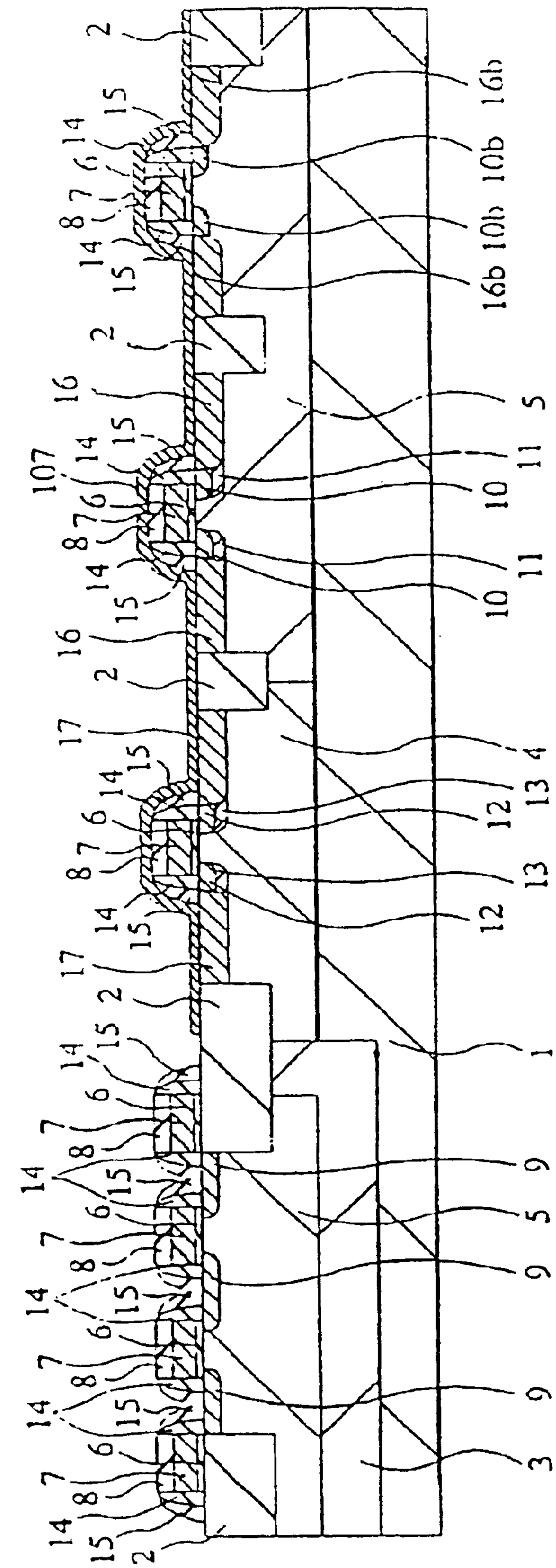
Figure 33:
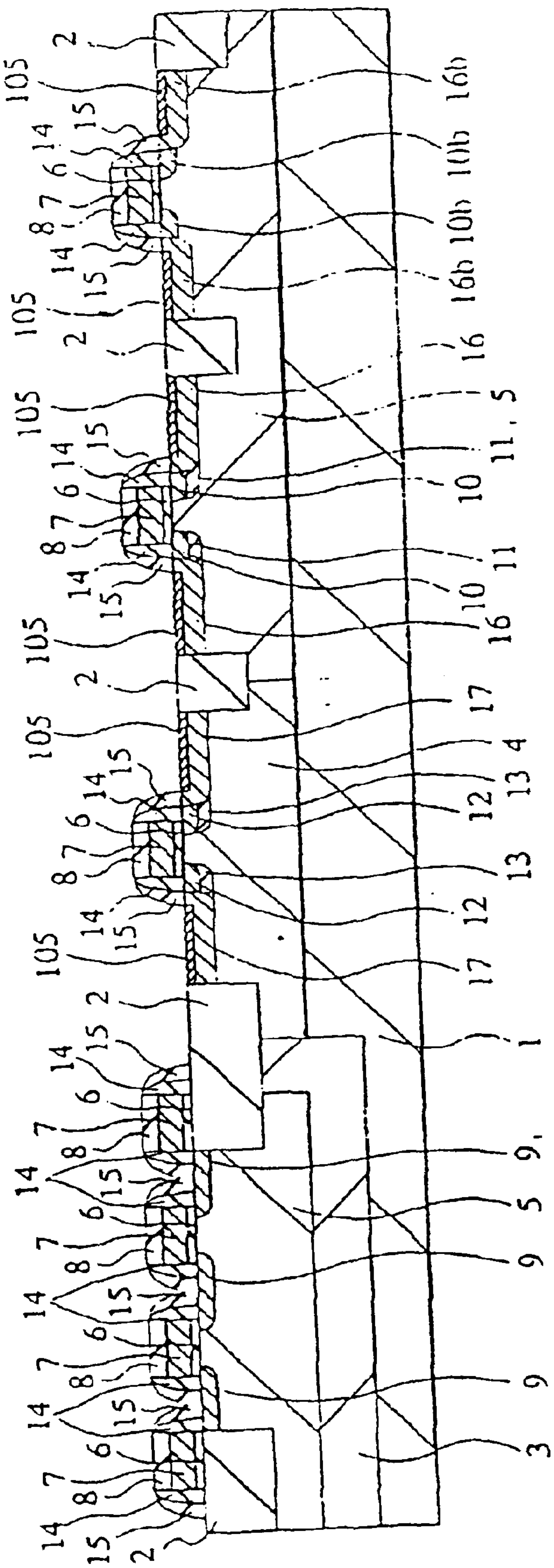

Next, a method of manufacturing the semiconductor integrated circuitry of the third embodiment will be described with reference to FIGS. 31 to 33. FIGS. 31 to 33 are cross sectional views showing the manufacturing method of the present invention.

At first, just like the first embodiment, the high density N-type semiconductor areas 16 and 16*b*, and a high density P-type semiconductor area 17 shown in FIG. 16 are formed. Then, an insulating film 106 is formed and the film 106 is removed by etching using a photo resist as a mask except for at least the area of the DRAM memory cells (FIG. 31). When an insulating film exists on the semiconductor area before the insulating film 106 is formed, the insulating film 106 is not formed, and instead, the insulating film mentioned above is removed selectively.

Next, a metallic film 107 composed of titanium (Ti) or cobalt (Co) is deposited all over the surface using the spattering method (FIG. 32). Then, the first silicide reaction is performed in an inactive atmosphere at about 500° C., and then non-reacted portions of the metallic film 107 except for the semiconductor area are removed. Thereafter, in an inactive atmosphere at about 700 to 900° C., the second silicide reaction is performed to reduce the resistance and form a silicide layer 105 (FIG. 33). A silicide layer 105 is thus formed on the semiconductor area which forms the sources and the drains of the MISFET Qn1, Qn2, and Qp1 except for the low density N-type semiconductor area 9 forming the source and the drain of the DRAM memory cell selecting MISFET Qs. No silicide layer 105 is needed on the semiconductor area forming sources and drains of the output circuit output MISFET and the input protection MISFET.

Thereafter, the processes are the same as those shown in FIG. 27 in the second embodiment, and so an explanation thereof will be omitted here.

(4th Embodiment)

Figure 34:
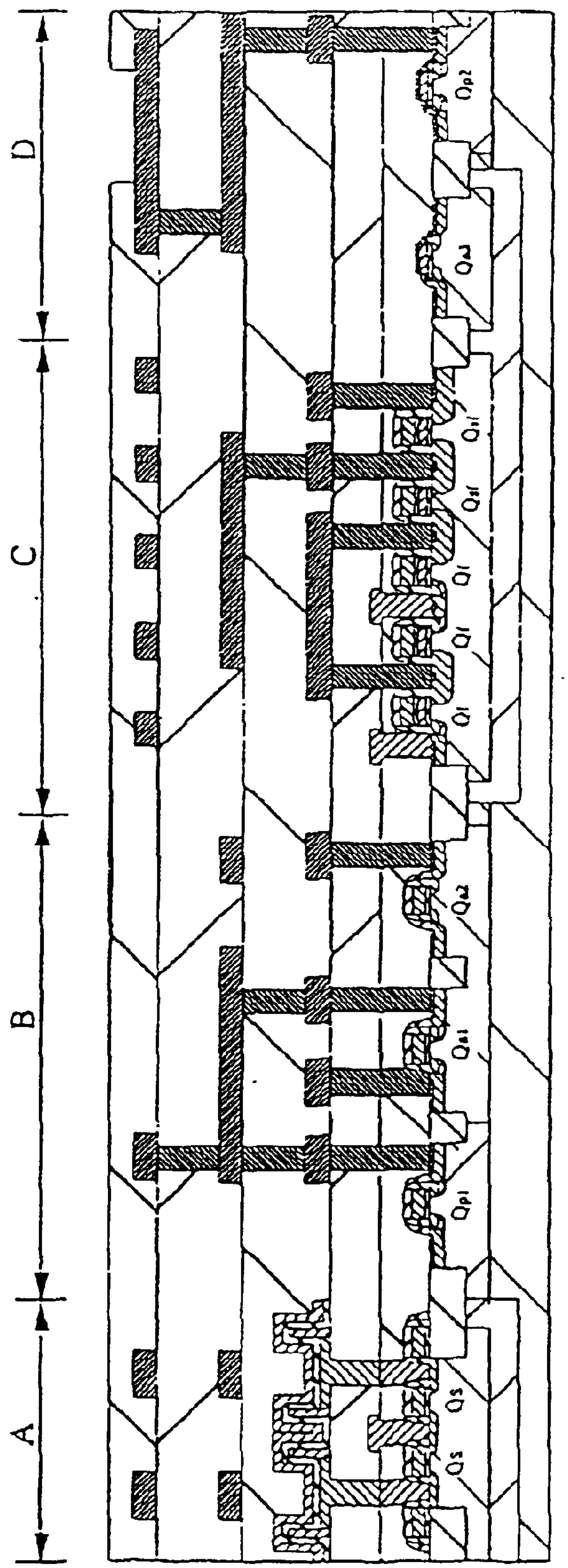
FIG. 34 is a cross sectional view of the major portion of a semiconductor integrated circuit representing a fourth embodiment of the present invention.

FIG. 34 is a cross sectional view of the major portion of a semiconductor integrated circuit representing in another embodiment of the present invention.

In the semiconductor integrated circuitry in the fourth embodiment, a flash memory is used as a ROM in the manner as shown in the block diagram in FIG. 3, which illustrates the first embodiment of the present invention. In FIG. 34, areas A and B are the same as those in the first embodiment. Thus, an explanation for those items will be omitted here.

Figure 35:
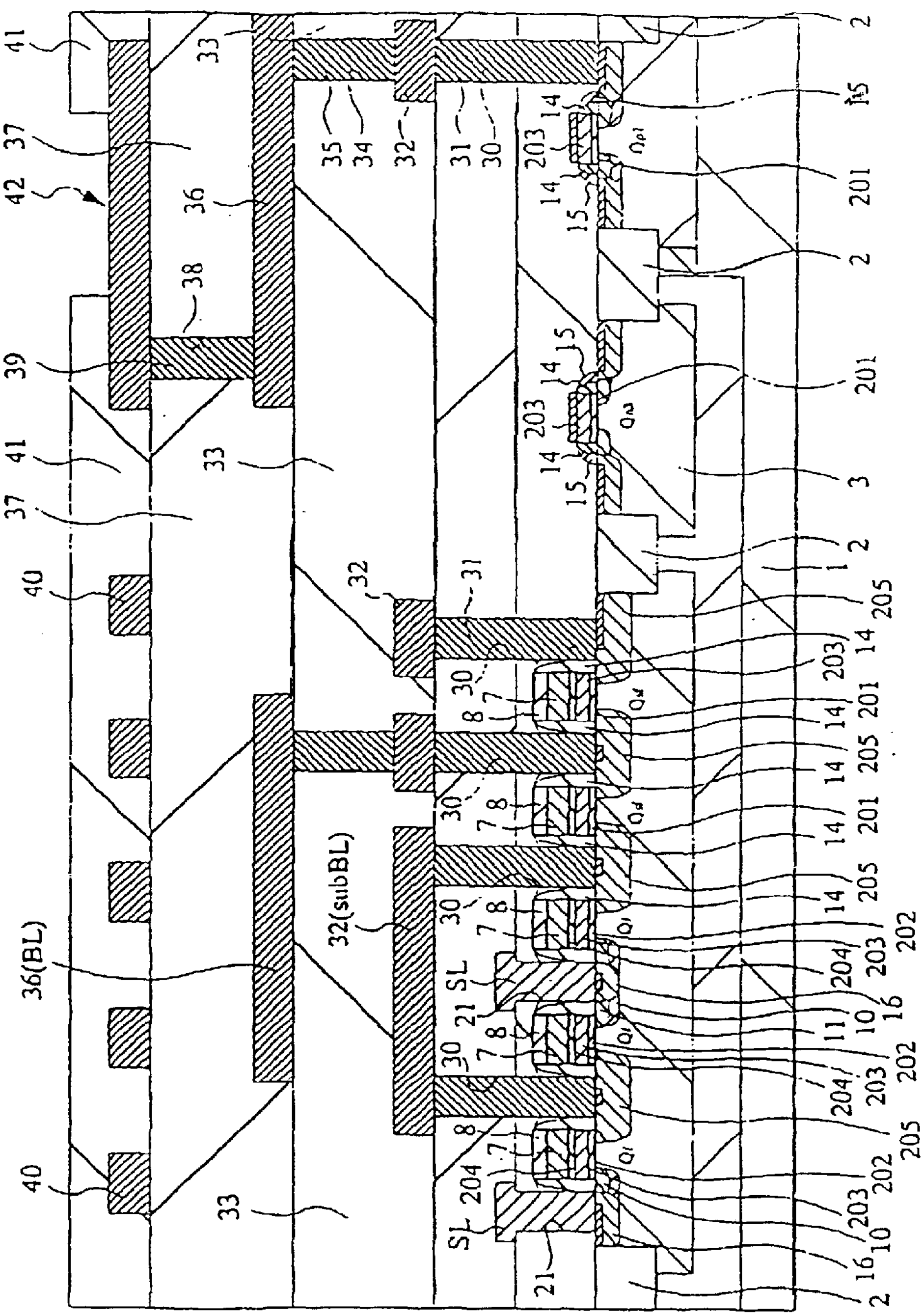
FIG. 35 is an expanded cross sectional view of the areas C and D shown in FIG. 34.
Figure 36:
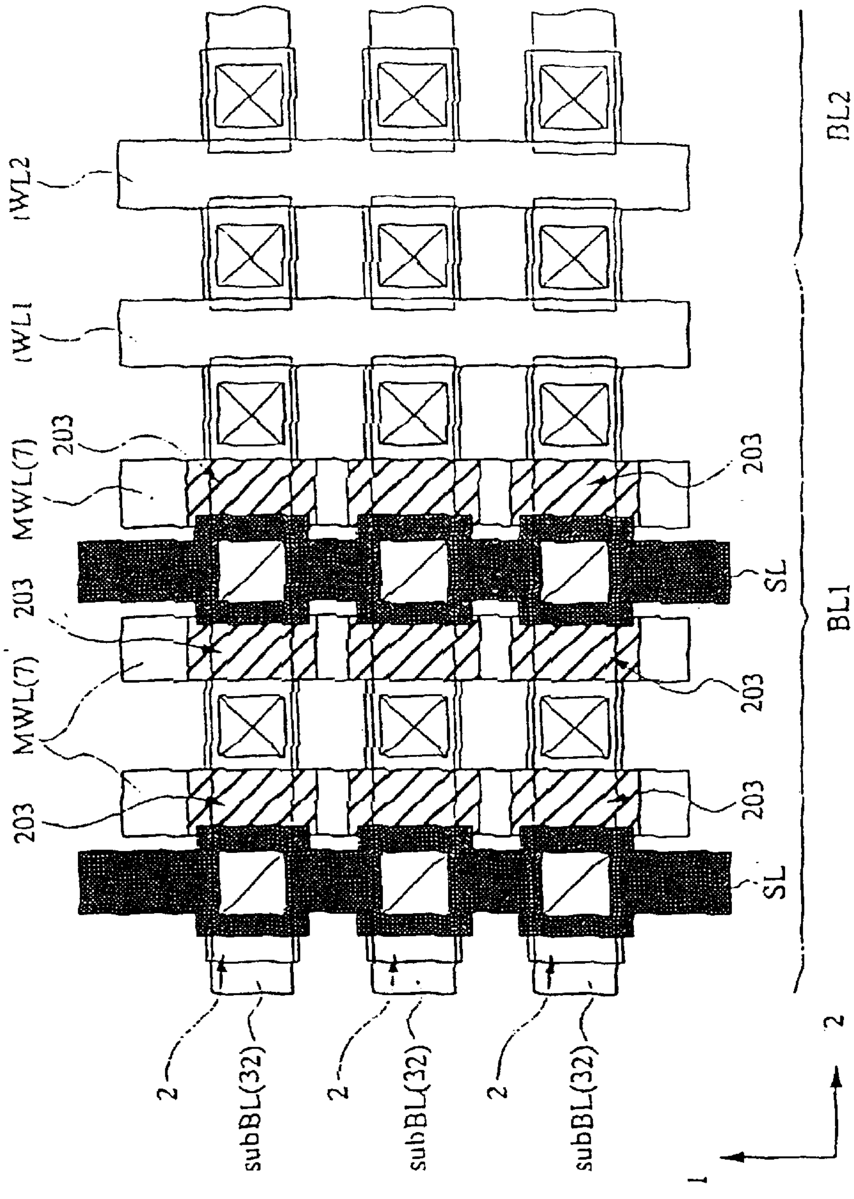
FIG. 36 is a top view of an electrically reloadable batch erasure type nonvolatile memory, a so-called flash memory array area included in the semiconductor integrated circuitry of the fourth embodiment.
Figure 37:
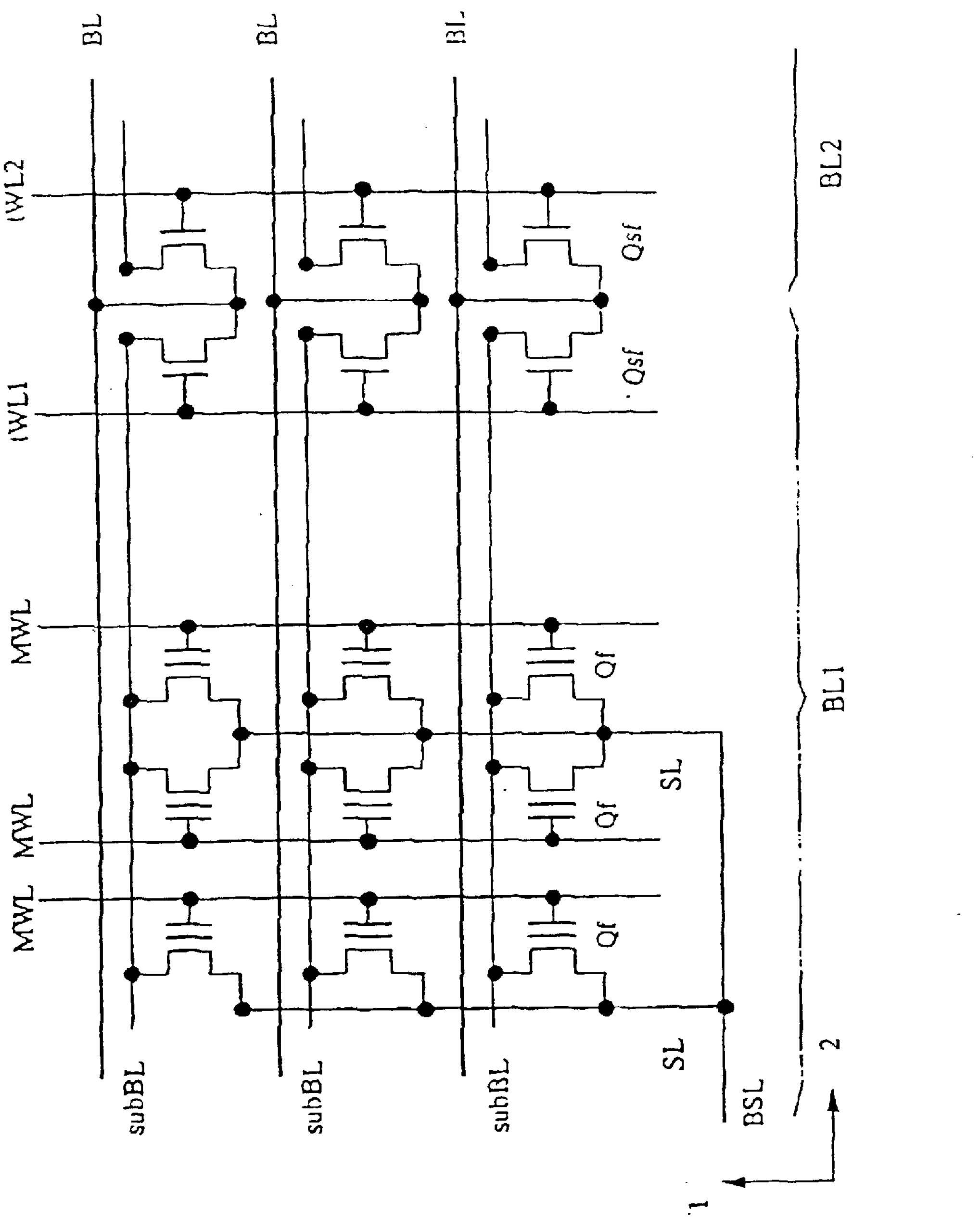
FIG. 37 is an equivalent circuit diagram of the flash memory portion.

FIG. 35 is an expanded view of the areas C and D shown in FIG. 34. FIG. 36 is a top view of the memory array area of an electrically reloadable batch erasure type volatile memory, that is, a flash memory included in the semiconductor integrated circuit of the fourth embodiment. FIG. 37 is an equivalent circuit diagram of the flash memory portion. Hereunder, an explanation of this embodiment will be made with reference to FIGS. 35 to 37.

In the flash memory of this fourth embodiment, a single bit memory cell is composed of: a tunnel insulating film 202; floating gate electrodes 203; an interlaminar insulating film 204; control gates 7 formed unitarily with word lines; P type well areas 5 (channel forming areas); and a floating gate MISFET Qf having a pair of N type semiconductor areas forming sources and drains.

Just like the N channel MISFET Qn1 in the first embodiment, the source of the floating gate type MISFET Qf is formed with a low density N-type semiconductor area 10 and a P-type semiconductor area 11 formed under the area 10, and a high density N-type semiconductor area 16. The drain of the floating gate type MISFET Qf is formed with a high density N-type semiconductor area 205. The thickness of the tunnel insulating film 202 is set to 9 to 10 nm. The high density N-type semiconductor area 205 has a impurity density higher than that of the low density N-type semiconductor area 10 and has a high impurity density sufficient to reduce a depression of the surface of the high density N-type semiconductor area 205 under the floating gate electrodes 203 when information is written.

The drain of the floating gate type MISFET Qf is connected to the first wiring 32 via a connecting hole 30. The first wiring 32 forms sub-bit lines subBL in the fourth embodiment. A memory cell composed of 16 to 64 bits is connected to a sub-bit line subBL and to the main bit line BL composed of the second wiring 36 via the selecting MISFET Qs. In other words, the flash memory in this fourth embodiment is divided into blocks by the selecting MISFET Qsf. The block selecting lines tWL1 and tWL2 are formed unitarily with the gate electrodes 203 of the selecting MISFET Qsf.

The memory cell source is connected to the source line SL via a connecting hole 21. The source is also connected to the source line BSL shared by all the divided blocks.

The selecting MISFET Qsf selects a block. In other words, the potential of the main bit line BL is supplied to memory cells via the selecting MISFET Qsf. As shown in FIG. 36, the word lines MWL (7), the block selection lines tWL1 and tWL2, and the source lines SL are extended in the first direction. The sub-bit lines subBL (32) are extended in the second direction.

The selecting MISFET Qsf is composed of: a gate insulating film 201; floating gate electrodes 203; gate electrodes 203 disposed in the same layer as the floating gate electrodes 203; and a high density N- type semiconductor area 205 composed of a source and a drain. In FIG. 34, each gate electrode has a two-layer structure, but in an area (not illustrated), a control gate electrode 7 formed unitarily with a word line is connected to the first wiring 32 and is shunted by the third wiring 40. The thickness of the gate insulating film 201 is set to about 20 nm.

Figure 45:
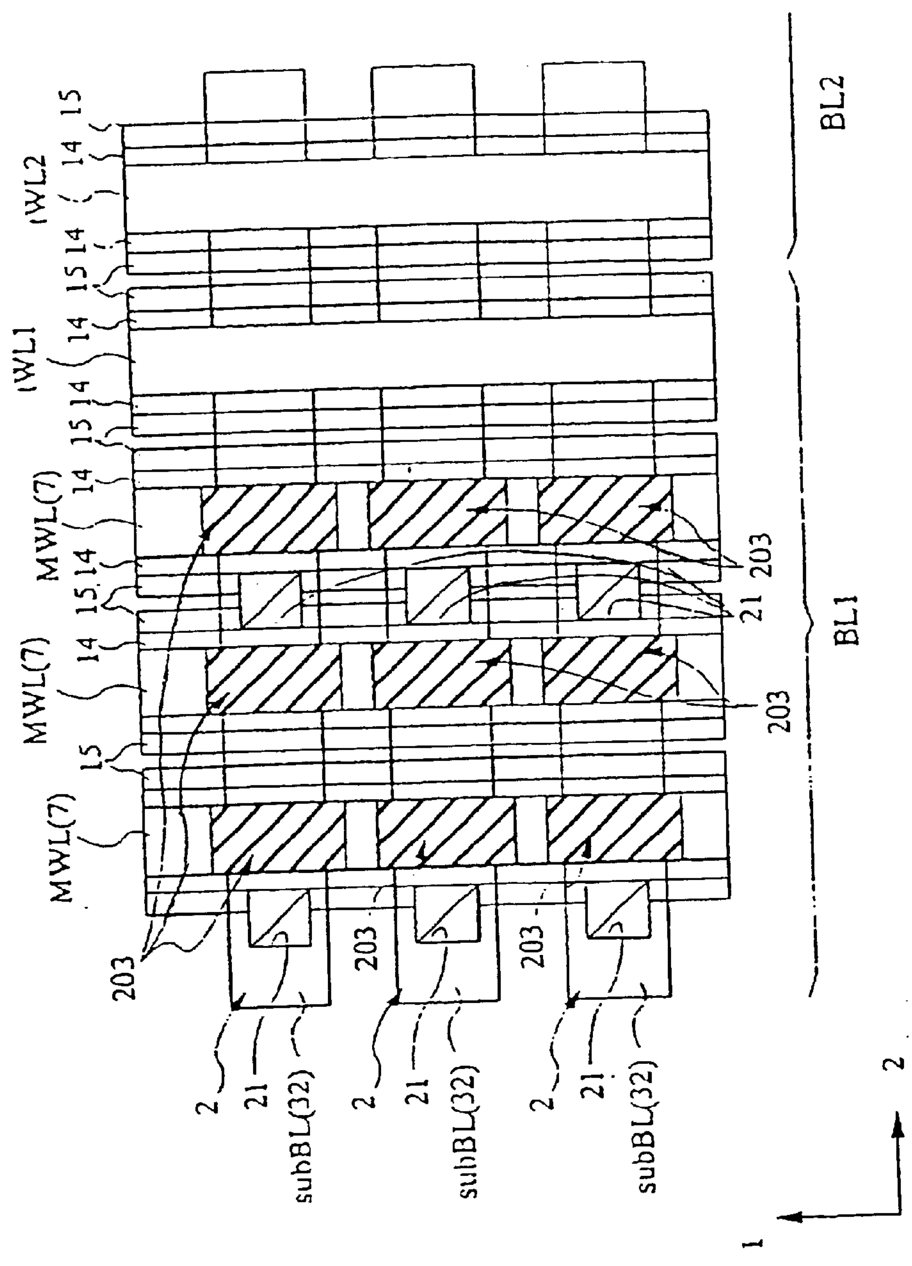
Figure 46:
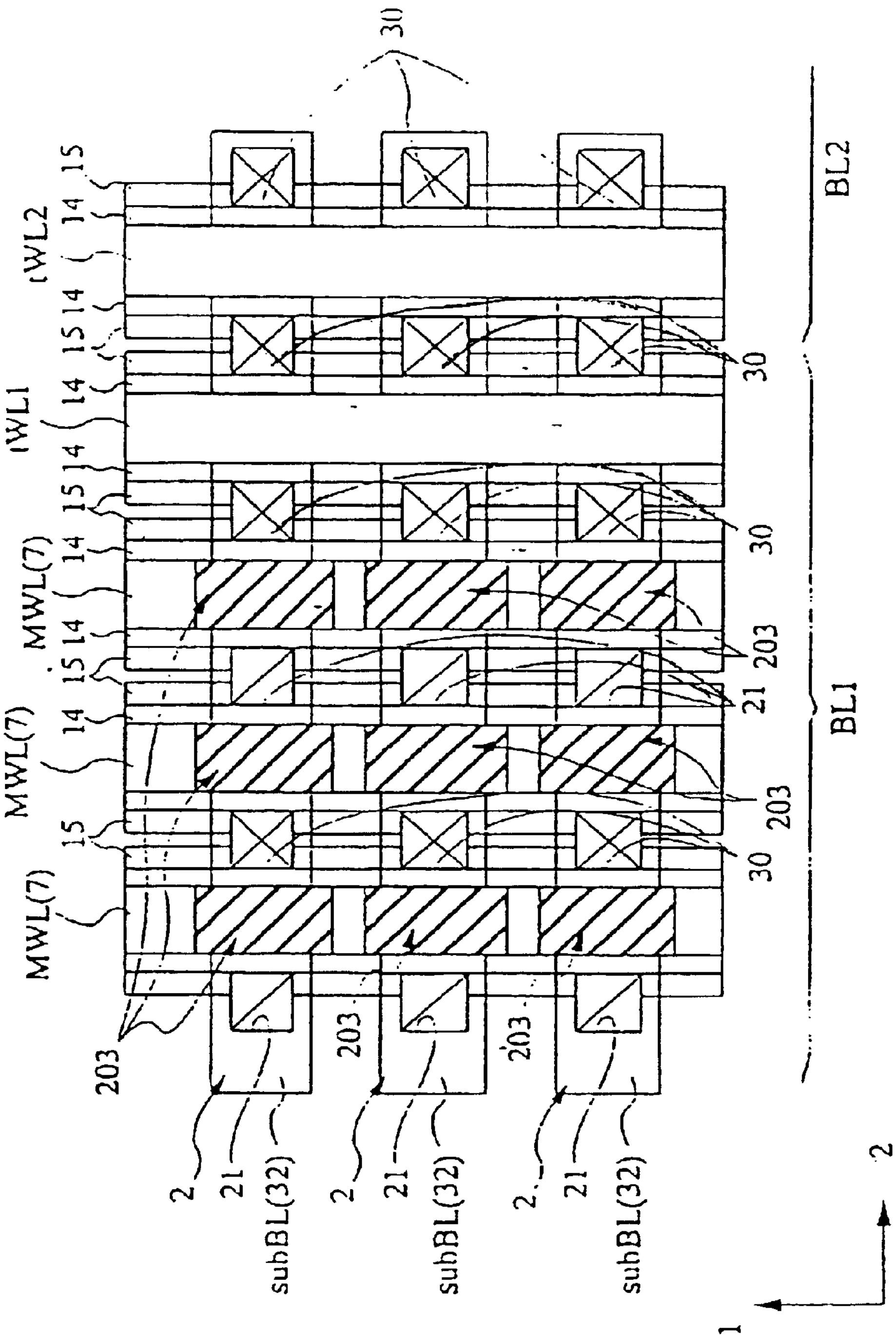

The connecting holes 21 and 30 communicating with the source and the drain of the floating gate type MISFET Qf, as shown in FIGS. 45 and 46 to be described later, are formed in a self-matching manner with respect to the first side wall spacers 14 composed of silicon nitride just like the connecting holes 19 and 21 in the first embodiment. Those memory cells are isolated by the N type semiconductor area 3 so that writing and erasing to be described below can be performed.

Writing data in the flash memory of the present invention is forming by discharging electrons from the floating gate electrodes 203 and lowering the threshold value (Vth). In other words, a negative voltage of about 9V is applied to the control electrodes 7. Then, a positive voltage of about 7V is applied to the drain so that electrons are discharged from the floating gate electrodes 203 to the high density N-type semiconductor area 205, which is a drain, through the FN (Fowler Nordheim) tunnel via the tunnel insulating film to lower the threshold value (Vth).

To erase data, electrons are charged in the floating gate electrodes 203 to increase the threshold value (Vth). In other words, a positive voltage of about 9V is applied to the control gate electrodes 7. Then, a negative voltage of about 9V is applied to the source and the P type well area 5 to charge electrons from an inverse layer formed in a channel area into the floating gate electrodes through the FN tunnel via the tunnel insulating film. Thus, the threshold value is increased.

The N channel MISFET Qn3 and the P channel MISFET Qp2 are used for a circuit for writing and erasing data in and from the flash memory.

With the semiconductor integrated circuitry, even when a flash memory is included in the circuitry, the first and second side wall spacers 14 and 15 are formed to divide the memory cell area finely, so that the LDD can be optimized for the peripheral circuit areas MISFET Qn1, Qn2, Qn3, Qp1, and Qp2. The fine division and performance of the semiconductor integrated circuitry can thus be improved.

Next, a method of manufacturing the semiconductor integrated circuit according to this fourth embodiment will be explained with reference to FIGS. 38 to 46. FIGS. 38 to 46 are cross sectional or top views illustrating various stages of manufacture of the semiconductor integrated circuitry in this fourth embodiment in order of the processes.

Figure 38:
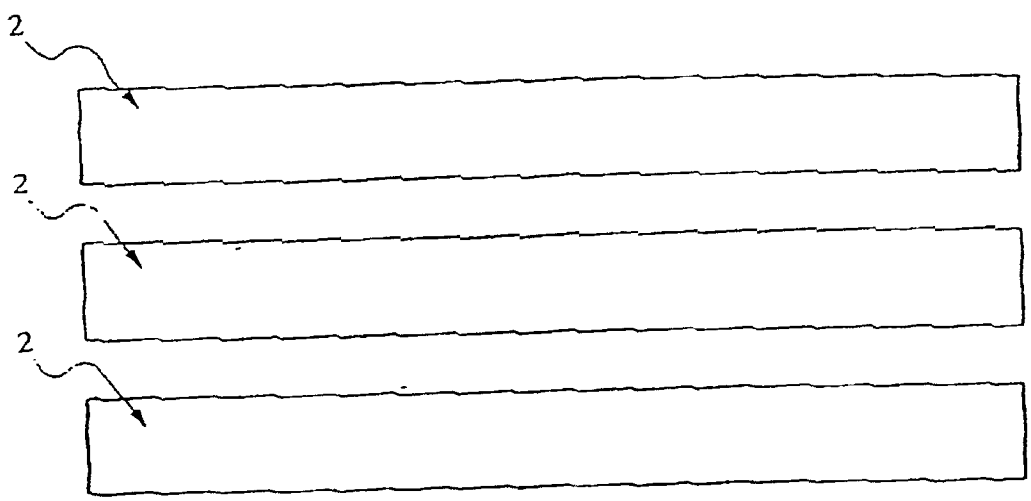
FIGS. 38 to 46 are top or cross sectional views showing a method of manufacturing the semiconductor integrated circuitry in the fourth embodiment in the order of the processes.

At first, just like the first embodiment, the field insulating film 2; the N type semiconductor area 3; the N type well area 4; and the P type well area 5 are formed. FIG. 38 is a top view of flash memory areas after the field insulating film 2 is formed.

Figure 39:
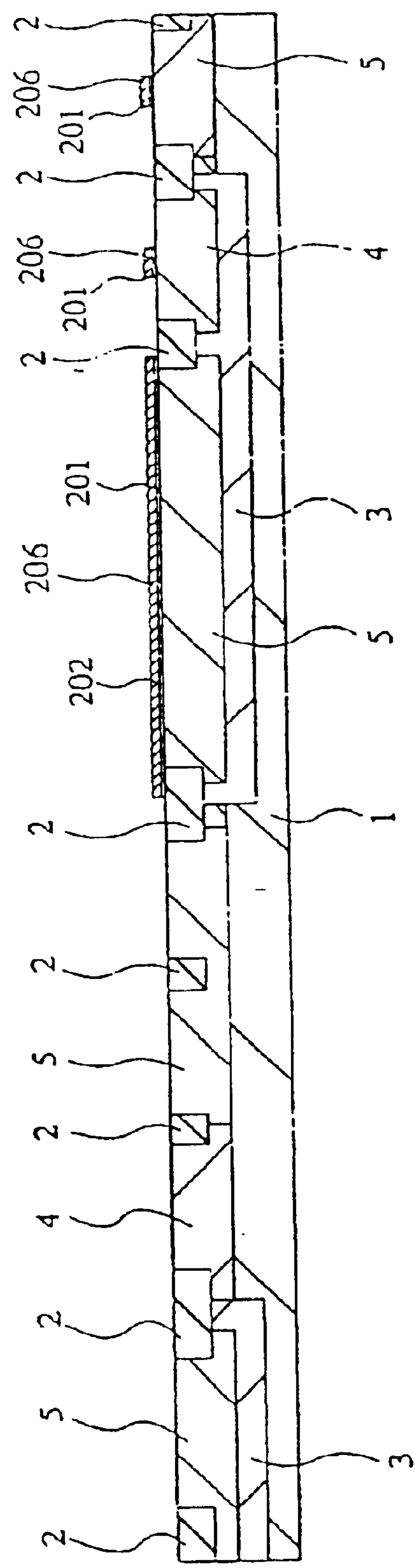
Figure 40:
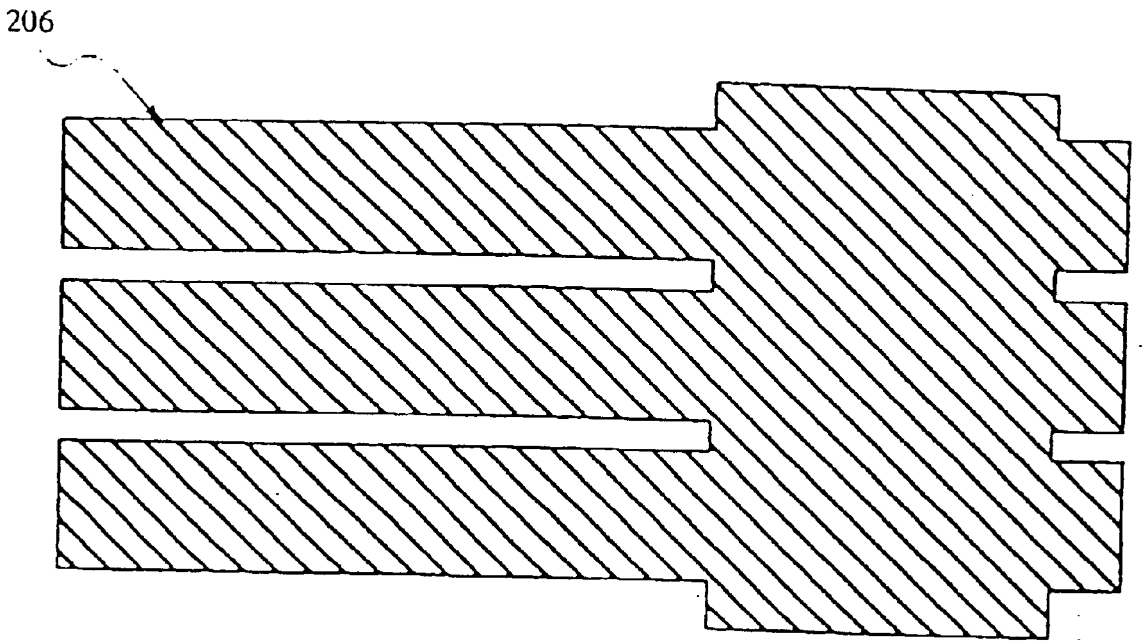

Next, as shown in FIGS. 39 and 40, a gate insulating film 201 is formed using a thermal oxidation method. Then, the film 201 except for the selecting MISFET Qsf, the N channel MISFET Qn3, and the P channel MISFET Qp2 is removed. Then, a tunnel insulating film 202 is formed using a thermal oxidation method. Since the tunnel insulating film 202 is formed after the gate insulating film 201 is removed, the tunnel insulating film 202 which is thinner than the gate insulating film 201 can be formed easily. Thereafter, the flash memory floating gate electrodes 203, as well as electric conductors 206 used as the floating gate electrodes 203 of the selecting MISFET Qsf, the N channel MISFET Qn3, and the P channel MISFET Qp2 are formed. The electric conductors 206 are formed with a silicon film in which impurities such as phosphorus are implanted to lower the resistance. Thereafter, the silicon film masked with photo resist is patterned.

Figure 41:
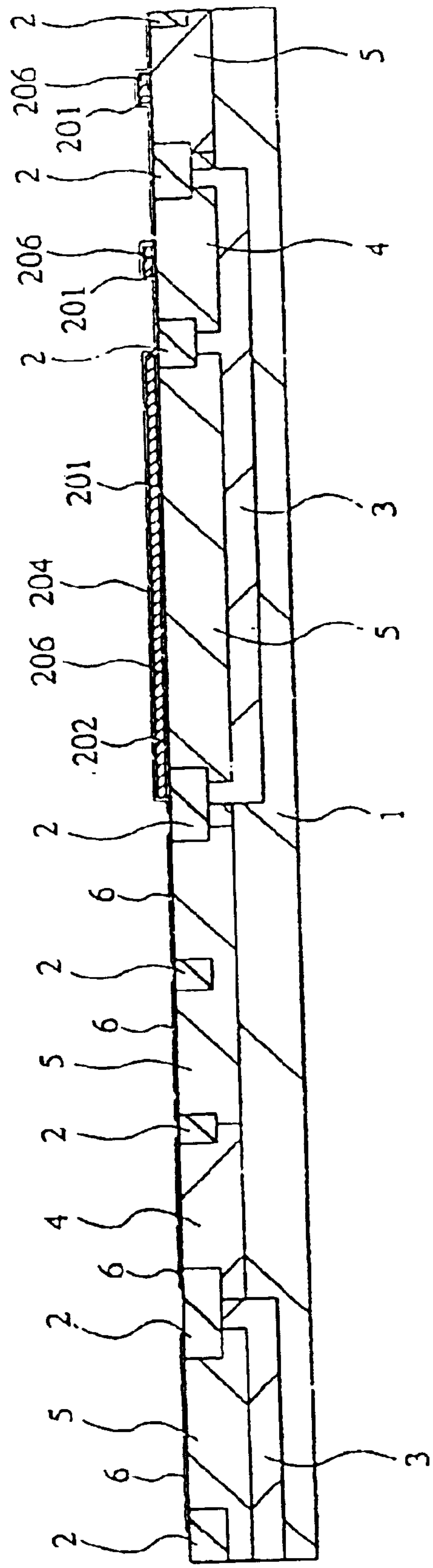

As shown in FIG. 41, the floating gate electrodes 203 of the flash memory and an interlaminar insulating film 204 is formed between control electrodes 7. The interlaminar insulating film 204 is formed with a multi-layer film formed by laminating a silicon oxide film and a silicon nitride film sequentially. Then, the interlaminar insulating film 204 is selectively removed from the areas where the DRAM memory cell selecting MISFET Qs, the N channel MISFET Qn1, the N channel MISFET Qn2, and the P channel MISFET Qp1 are formed. Then, the silicon nitride film on the interlaminar insulating film 204 is used as an oxidation resistance mask to form a gate insulating film 6 just like in the first embodiment.

Figure 42:
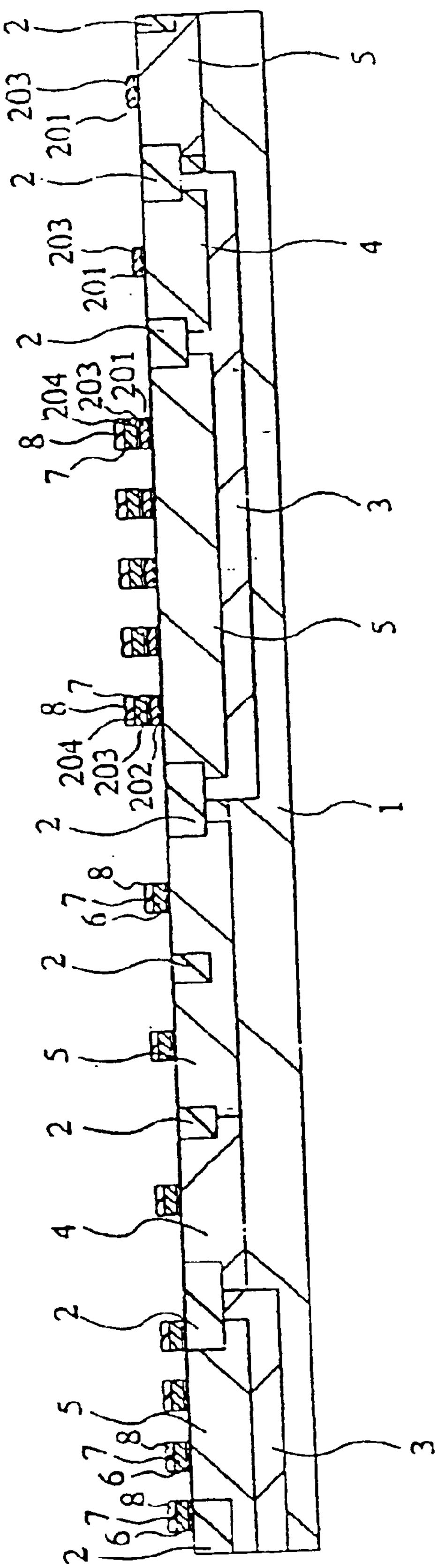
Figure 43:
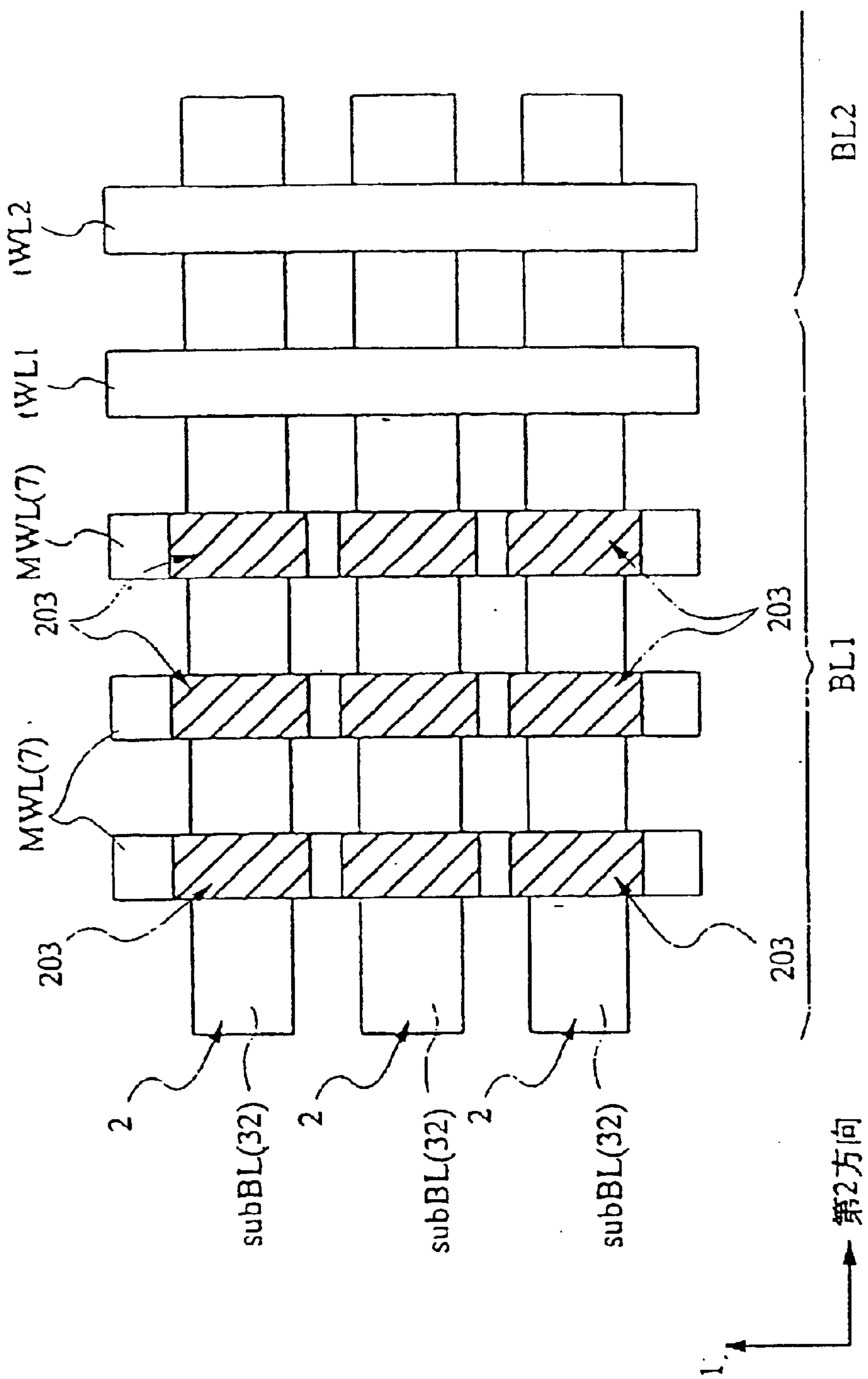

Next, as shown in FIGS. 42 and 43, the control gate electrodes 7 and the silicon nitride film 8 on the electrodes 7 are formed, and then the film 8 is patterned using a photo resist as a mask. The floating gate electrodes 203 of the flash memory and the control gate electrodes 7 are thus formed.

Figure 44:
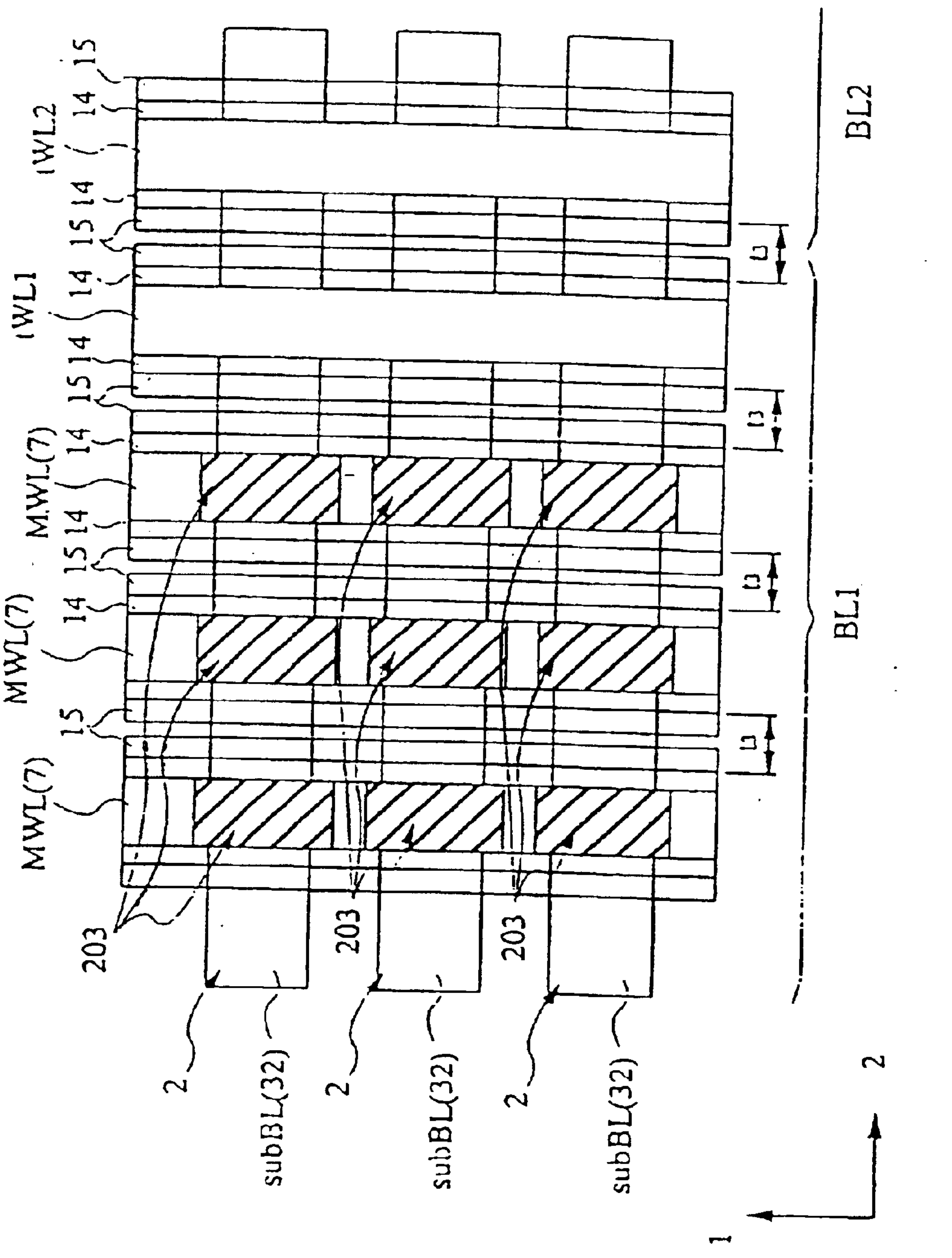

Hereafter, the processes are almost the same as those shown in FIG. 10 in the first embodiment. In other words, as shown in FIG. 44, the first and second side wall spacers 14 and 15 are formed in the DRAM memory cell area, and at the same time, they are formed in the flash memory cell area in the same way. The number of processes can thus be reduced.

Next, just like in the first embodiment, an insulating film 18 is formed, and then connecting holes 21 are formed as shown in FIG. 45.

Next, an insulating film 23 is formed, then connecting holes 30 are formed as shown in FIG. 46.

The connecting holes 21 and 30, just like the connecting holes 19 and 21 in the first embodiment, are formed in a self-matching manner with respect to the first side wall spacers 14 composed of silicon nitride, so that the interval t3 between word lines WL (gate electrodes 7) in the second direction, the interval t3 between word lines WL (gate electrodes 7) and block selecting lines tWL1 and tWL2, and the interval t3 between block selecting lines tWL1 and tWL2 can be reduced finely in the second direction.

In addition, since the margin of alignment in the second direction can be reduced, the interval between elements in the second direction can be reduced finely. In other words, the interval between memory cells in the second direction can be reduced significantly, enabling the semiconductor integrated circuitry of the present invention to be integrated much more finely.

Next, the first wiring 32 is formed just like in the first embodiment. Consequently, DRAM memory cell bit lines BL and flash memory source lines SL can be formed in the same process, so the process can be shortened and simplified.

According to the method of manufacturing the semiconductor integrated circuitry of the fourth embodiment, the circuitry can be manufactured just like the semiconductor integrated circuitry provided with a flash memory in the first embodiment, and the memory cell array can be integrated very finely in the flash memory. In addition, the thickness of the gate insulating film can be varied according to the MISFET requirement.

Needless to say, the silicon nitride film 104 or the silicide layer 105 described in the second and third embodiments may be included in the method of manufacturing the semiconductor integrated circuitry of this fourth embodiment. In this fourth embodiment, needless to say, the semiconductor integrated circuitry is provided with both DRAM and a flash memory, but this invention can also apply to a semiconductor integrated circuit provided only with a flash memory.

(5th Embodiment)

Figure 47:
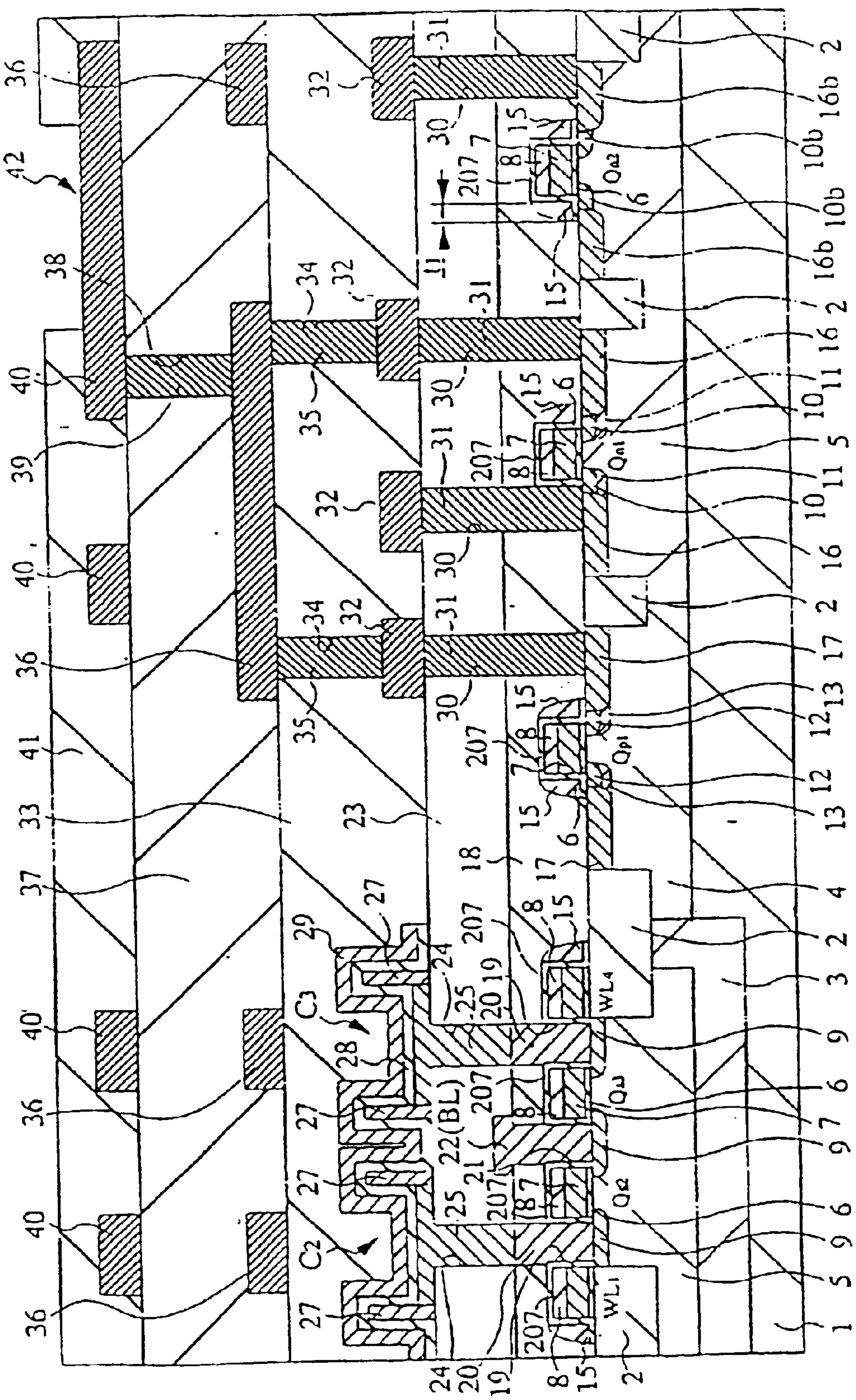
FIG. 47 is a cross sectional view of the major portion of a semiconductor integrated circuit representing a fifth embodiment of the present invention.

FIG. 47 is a cross sectional view of the major portion of a semiconductor integrated circuit representing in another embodiment of the present invention.

The semiconductor integrated circuitry in this fifth embodiment is the same as that in the first embodiment except for the fact that a silicon nitride film (the first side wall spacer) 207 is formed instead of the first side wall spacers 14. Other structural features are entirely the same as those in the first embodiment, and so on explanation thereof will be omitted here. In the semiconductor integrated circuitry in this fifth embodiment, a silicon nitride film (the first side wall spacers) 207 of t1 in thickness is provided, so that the degree of integration of the memory cell area can be improved and the MISFET LDD structure other than the memory cell area can be optimized due to the second side wall spacers 15, thereby to improve the performance of the semiconductor integrated circuitry just like in the first embodiment.

In the method of manufacturing the semiconductor integrated circuitry of this fifth embodiment, the process for forming the first side wall spacers 14 shown in FIG. 12 in the first embodiment is replaced with a process for depositing a silicon nitride film 207 all over the semiconductor substrate 1. Consequently, the isotropic etching and other processes are omitted, making it possible to simplify the manufacturing method significantly. In the processes for opening the connecting boles 19 and 21, however, the second stage etching is needed, as described in the second embodiment. The number of processes is thus increased, but the semiconductor substrate 1 exposed at the bottoms of the connecting holes 19 and 21 can be prevented from over-etching, so that the contact reliability is improved.

Various embodiments of the present invention have been described in detail above, but the present invention is not limited only to those embodiments. Needless to say, they can be varied as long as the substance of the present invention is not exceeded.

For example, in the first to fifth embodiments, a complementary MISFET is used to form peripheral or logic circuits, but only an N channel MISFET or P channel MISFET may be used to form the peripheral circuits.

In addition, in the first to fifth embodiments, the thickness of the gate insulating film of the DRAM memory cell area selecting MISFET Qs is equal to the thicknesses of the gate insulating films of the N channel MISFET Qn1, Qn2, and the P channel MISFET Qp1, but those insulating films may differ in thickness from each another. More particularly, when the gate insulating films of the N channel MISFET Qn1, Qn2, and the P channel MISFET Qp1 are thinner than the selecting MISFET Qs, the N channel MISFET Qn1, Qn2, the P channel MISFET Qp1 can further be converted to shorter channels. The performance of the semiconductor integrated circuitry can thus be further improved. In the case of the method of manufacturing the gate insulating film in such a case, it is possible to use the same method as that described in the fourth embodiment to form the gate insulating films of the flash memory area and the DRAM area in different processes separately.

In addition, although a DRAM or a flash memory that is a nonvolatile memory is used as the memory cells in the first to fifth embodiments, an SRAM (Static RAM), a masked ROM, etc. may be used instead of those; for example, a memory structure wherein a side wall spacer is put between word lines to connect each electric conductor to the source or the drain area of the MISFET in a self-matching manner may be adopted as the memory cell structure.

(6th Embodiment)

Figure 50:
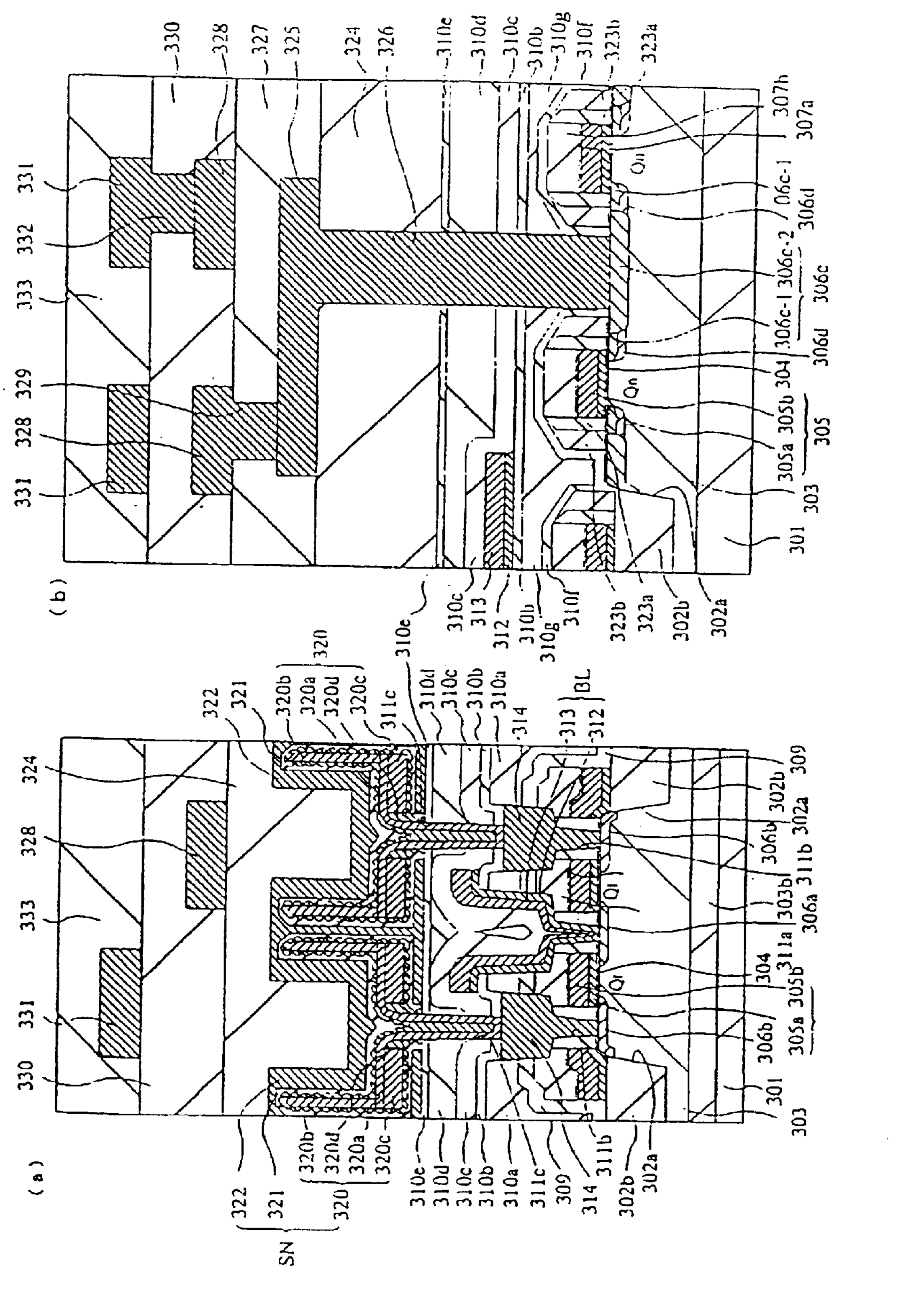
FIG. 50(*a*) is a cross sectional view of a memory cell area of a DRAM representing a sixth embodiment of the present invention.
Figure 51:
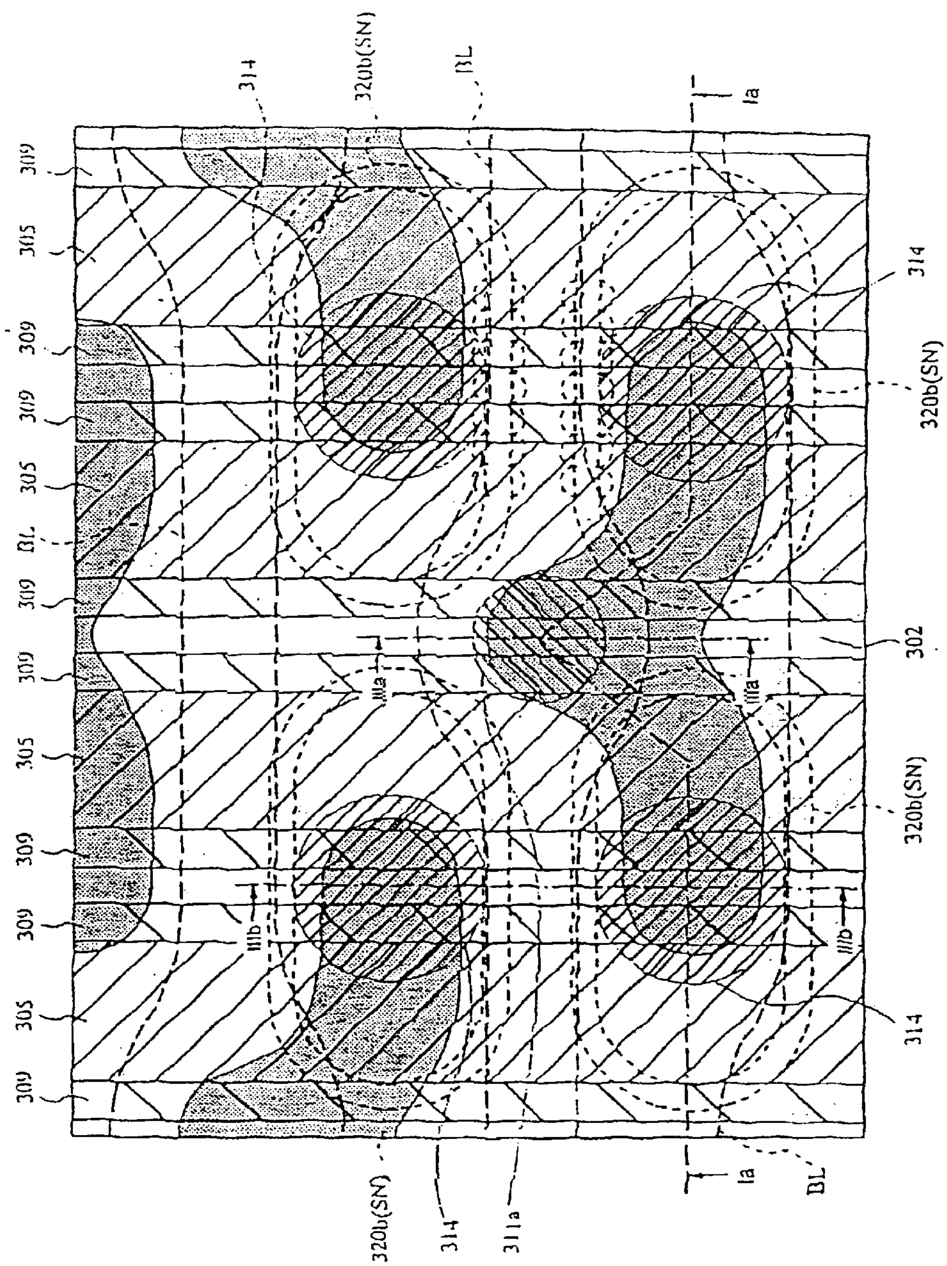
FIG. 51 is a top view of the memory cell area of the DRAM in the sixth embodiment.
Figure 52:
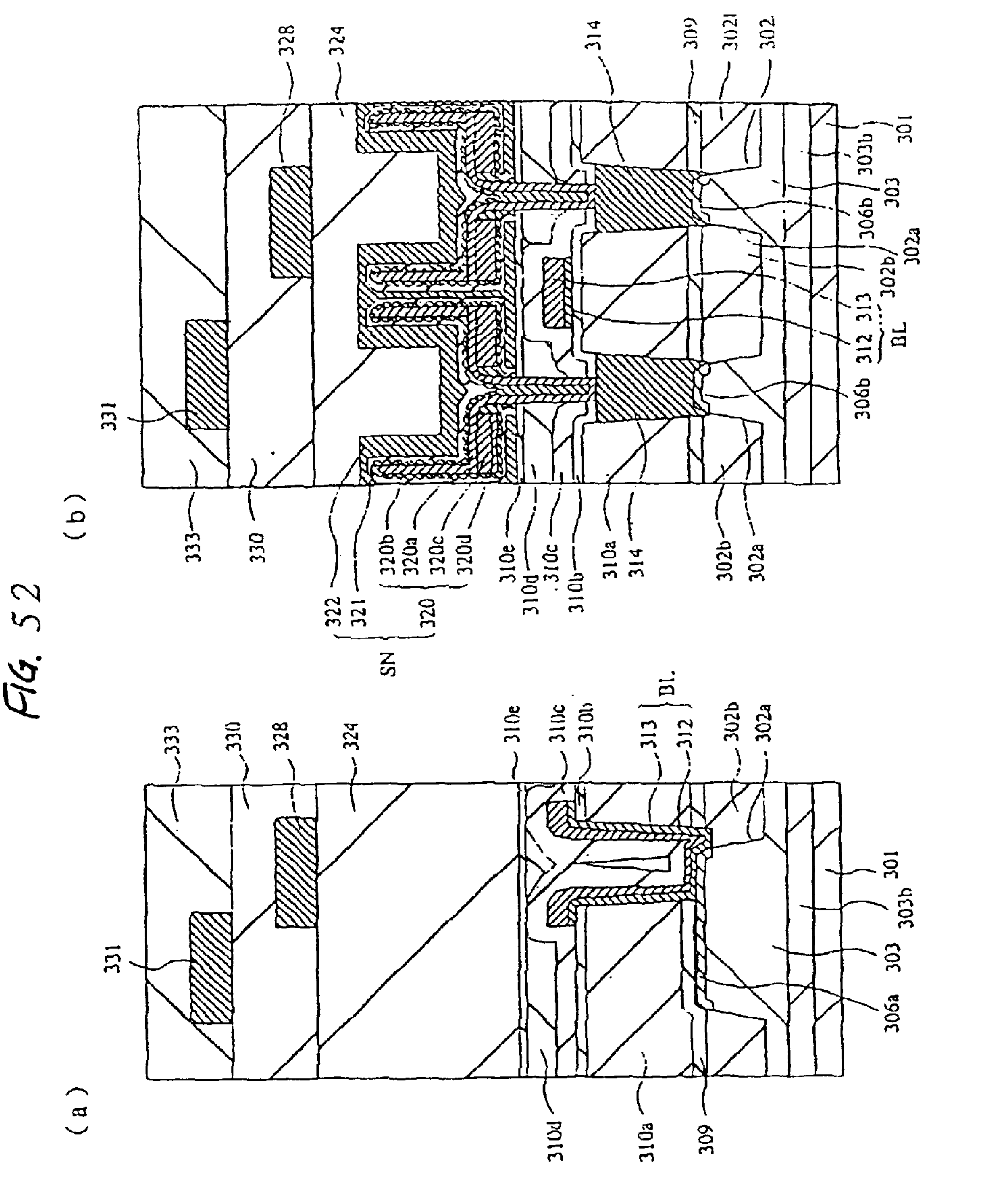
FIG. 52(*a*) is a cross sectional view taken along the line IIIa—IIIa in FIG. 51.

FIG. 50(*a*) is a cross sectional view of the memory cell area of the DRAM in the first embodiment of the present invention. FIG. 50(*b*) is a cross sectional view of the peripheral circuit area. FIG. 51 is a top view of the DRAM memory cell area in this sixth embodiment. FIG. 52 is a cross sectional view of the DRAM memory cell area in this sixth embodiment. FIG. 52(*a*) is a cross sectional view taken along the line IIIa—IIIa in FIG. 51. FIG. 52(*b*) is a cross sectional view taken along the line IIIb—IIIb in FIG. 51. In FIG. 51, some members are hatched or shown with broken lines for easier observation. The line Ia—Ia in FIG. 51 indicates a cut-off portion of the cross sectional view shown in FIG. 50(*a*).

In the DRAM memory cell area in the sixth embodiment, a memory cell selecting MISFET Qt is formed and a charge storage capacity element and bit lines BL connected to the selecting MISFET Qt are formed on the main surface of the semiconductor substrate 301.

In addition, in the DRAM peripheral circuit area there is formed an n-type MISFET Qn forming peripheral circuits. However, a p-type MISFET (not illustrated) is formed in a peripheral circuit, and the n-type MISFET Qn and the p-type MISFET may be combined to form a CMISFET. In addition to the n-type MISFET Qn, a high withstand voltage n-type MISFET (not illustrated) may be formed.

The semiconductor substrate 301 is composed of, for example, p-type silicon (Si) single crystal, and on the main surface there is formed a shallow groove 302*a*. In addition, in the shallow groove 302*a* there is embedded an element isolating insulating film 302*b* composed of, for example, silicon dioxide (SiO2) to form a shallow groove element isolating area.

On the semiconductor substrate 301 there is also formed a p-type well 303. In the p-type well 303 there is included, for example, boron, which is a p-type impurity. Under the p-type well 303, in the area where a memory cell selecting MISFET Qt is formed, there is formed a deep well 303*b*. In the deep well 303*b*, phosphorus is implanted, which is an n-type impurity, so that the selecting MISFET Qt is insulated from the substrate potential to improve the noise resistance of the circuitry.

When a p-type MISFET is formed, an n-type well (not illustrated) into which, for example, phosphorus is implanted, is formed in the area where the p-type MISFET is formed. In addition, in the p-type well 303 and in the n-type well, if it exists, a MISFET threshold value control layer.

The memory cell selecting MISFET Qt is formed in an active area surrounded by the element isolating insulating film 302*b*. In an active area there are formed two selecting MISFETs Qt. Each selecting MISFET Qt has gate electrodes 305 composed of a polycrystal silicon film 305*a* and a tungsten silicide (WSi2) film 305*b* formed on the semiconductor substrate 301 via the gate insulating film 304 formed in the active area of the p-type well 303, and a pair of n-type semiconductor areas 306*a* and 306*b* formed on the p-type wells 303 on both sides of gate electrodes 305, so as to be separated from each other.

Each gate electrode functions as a DRAM word line WL. Both n-type semiconductor areas 306*a* and 306*b* are implanted with an n-type impurity, but the impurity may be either phosphorus or boron (As). In order to improve the withstand voltage between channels of the selecting MISFET Qt so as to improve the refreshing characteristics of the DRAM, however, phosphorus should preferably be implanted.

The n-type semiconductor area 306*a* is shared by two selecting MISFETs Qt. And, a channel area of the selecting MISFET Qt is formed between the n-type semiconductor areas 306*a* and 306*b*. The gate insulating film 304 is composed of, for example, SiO2. The film 304 may be thicker than the gate insulating film 304 of the n-type MISFET Qn of the peripheral circuit area to be described later so that the dielectric strength of the selecting MISFET Qt is improved. In such a case, the dielectric strength of the selecting MISFET Qt is improved so that the refreshing characteristics of the DRAM are improved.

On top of gate electrodes (word lines WL) THERE is formed a cap insulating film 307*b* example, silicon nitride via an insulating film 307*a*. The cap insulating film 307*b* functions as a blocking film when opening the connecting holes 311*a* and 311*b* in a process to be explained later in a self-matching matter with respect to the gate electrodes 305. The cap insulating film 307*a* prevents connecting members such as plugs from being short-circuited with gate electrodes 305.

The surface of the cap insulating film 307*b*, the side surfaces of each gate electrode 305, and the main surface of the semiconductor substrate 301 except for the bottoms of the connecting holes 311*a* and 311*b* are covered respectively by an insulating film 309 for self-matching treatment composed of, for example, a silicon nitride film. The insulating film 309 functions as an etching stopper when the connecting holes 311*a* and 311*b* are opened in a self-matching manner with respect to the word lines, as well as to prevent the semiconductor substrate 301, especially the element isolating insulating film 302*b*, from over-etching when the connecting holes 311*a* and 311*b* are opened.

At the phase boundary between the side surfaces of each of the gate electrodes 305 and the insulating film 309 for self-matching treatment thereof may be formed an insulating film (not illustrated). Such an insulating film and the insulating film 307*a* are provided to prevent the film forming apparatus from being contaminated with the metal that makes up the WSi film 305*b* and to reduce the thermal stress on the cap insulating film 307*b* and the insulating film 309 for self-matching treatment when the cap insulating film 307*b* and the insulating film 309 are formed.

The insulating film 309 for self-matching treatment is covered by an interlaminar insulating film 310*a* composed of, for example, SOG (Spin On Glass). The interlaminar insulating film 310*a* may be BPSG (Boron Phosphor Silicate Glass), but it should be a silicon oxide film that can secure a proper etching selection ratio for silicon nitride films. And, in the interlaminar insulating film 310*a* there are formed connecting holes 311*a* from which the n-type semiconductor area 306*a* formed as an upper layer of the semiconductor substrate 301 is exposed and connecting holes 311*b* from which the n-type semiconductor area 306*b* formed as an upper layer of the semiconductor substrate 301 is exposed.

The cap insulating film 307*b* and the insulating film 309 for self-matching treatment can function as an etching stopper, respectively, as described above, when the connecting holes 311*a* and 311*b* are opened in a self-matching manner. In addition, since the insulating film 309 for self-matching treatment is formed and the connecting holes 311*a* and 311*b* are opened in a two-stage etching process (the first etching process being conditioned to make it easy to etch the interlaminar insulating film 310*a* (etching depth and etching speed; larger) and not easy to etch the insulating film 309 for self-matching treatment (etching depth and etching speed; small) and the second etching process being conditioned to make it easy to etch the insulating film 309 for self-matching treatment and not easy to etch the element isolating insulating film 302*b*), the element isolating insulating film 302*b* formed up to the bottoms of the connecting holes 311*a* and 311*b* is prevented from over-etching even when the bottoms of the connecting holes 311*a* and 311*b* are off the active area of the semiconductor substrate 301 and overlap part of the element isolating insulating film 302*b*, as shown in FIGS. 52(*a*) and FIG. 52(*b*). Thus, the bottoms of the connecting holes 311*a* and 311*b* do not reach the deep area of the element isolating insulating film 302*b*. In other words, even when the element isolating insulating film 302*b* is etched excessively, the etching creates no problem for the process. For example, etching can be controlled equally to or under the thickness of the insulating film 309 for self-matching treatment.

In each connecting hole 311*b* there is formed a plug 314 composed of polycrystal silicon in which, for example, phosphorus is implanted at a high density. At the bottom of the plug 314 there is formed an element isolating insulating film 302*b* even in an over-etched area. The etching depth is controlled to an extent to suppress problems in the process as described above. Thus, the performance of the DRAM refreshing characteristics will not be affected by the etching depth at all.

On both the interlaminar insulating film 310*a* and on the plug 314 there is formed an interlaminar insulating film 310*b*. The interlaminar insulating film 310*b* maybe a silicon oxide film deposited by the thermal CVD method, for example, using TEOS (tetraethoxysilane).

On the interlaminar insulating film 310*b* are formed bit lines BL. The bit line BL is composed of a polycrystal silicon film 312 and a WSi2 film 313 and is connected electrically to the n-type semiconductor area 306*a* via connecting holes 311*a*. At the bottom of the polycrystal silicon film 312 there is formed an element isolating insulating film 302*b* even in an over-etched area just like the plug 314, but the etching depth is controlled to an extent to suppress problems as described above. Thus, the DRAM performance is not affected by the etching depth at all.

The bit lines BL are covered by an interlaminar insulating film 310*c* composed of a silicon oxide film deposited by the thermal CVD method, for example, using TEOS. Furthermore, on the interlaminar insulating film 310*c* there is formed an interlaminar insulating film 310*d*; which is polished and flattened with the CMP method. The interlaminar insulating film 310*d* is formed with the CMP method by polishing a silicon oxide film deposited with the plasma CVD method, for example, using TEOS. The interlaminar insulating film 310*d* may be formed using SOG or BPSG with the etch-back method, etc.

On the interlaminar insulating film 310*d* there is formed an the interlaminar insulating film 310*e* composed, for example, of a silicon nitride film. The interlaminar insulating film 310*e* is used as a blocking film when a crown-like storage capacity SN to be explained later is formed.

On the interlaminar insulating film 310*d* there is formed a storage capacity SN which is like a cylindrical crown in shape. The storage capacity SN is composed of capacitor electrodes 320*a* formed by the first electrodes 320*a* connected to the n-type semiconductor area 306*b* via connecting holes 311*c* and the second electrodes 320*b* provided vertically to the semiconductor substrate 301; a capacitor insulating film 321; and plate electrodes 322 connected to a specified wiring electrically. The first and second electrodes 320*a* and 320*b* may be a polycrystal film in which, for example, phosphorus is implanted at a high density. The capacitor insulating film 321 may be a laminated film formed by deposition on a silicon nitride film, but it may also be a high permittivity thin film, such as tantalum oxide. The plate electrodes 322 may be a polycrystal silicon film in which, for example, phosphorus is implanted at a high density, but it may also be a metallic compound such as tungsten silicide.

Under the first electrodes 320*a* there are formed side walls 320*d* composed of a polycrystal silicon film 320*c* and a polycrystal silicon. The walls function as part of the capacitor electrodes 320. The polycrystal silicon film 320*c* and the side walls 320*d* also function as a hardware mask respectively for opening connecting holes 311*c* and determine the diameter of each connecting hole 311*c* to a fine degree under the resolution of the photolithography.

On the other hand, the n-type MISFET Qn of the peripheral circuit area is formed in an active area surrounded by the element isolating insulating film 302*b*. The n-type MISFET is composed of gate electrodes 305 composed of a polycrystal silicon film 305*a* formed on the semiconductor substrate 301 via a gate insulating film 304 formed in an active area of the p-type well 303 and a WSi2 film 305*b*; and a pair of n-type semiconductor areas 306*c* formed on both ends of the gate electrodes 305 so as to be separated from each other.

The gate electrodes 305 are formed together with the word lines WL. Each n-type semiconductor area 306*c* includes a low density n-type semiconductor area 306*c*-1 and a high density n-type semiconductor area 306*c*-2 (higher density than the low density n-type semiconductor area 306*c*-1) formed in a self-matching manner with respect to the second side walls 323*b*. In other words, the n-type semiconductor area 306*c* has a so-called LDD (Lightly Doped Drain) structure. And, between the high density n-type semiconductor area 306*c*-2 formed under the low density n-type semiconductor area 306c-1 and the channel area there is formed a p-type semiconductor area 306d that functions as a punched-through stopper. In the n-type semiconductor area 306c there is implanted, for example, phosphorus or arsenic. However, in order to shorten the channel length of the n-type MISFET Qn to improve the performance, arsenic should be implanted. To form a high dielectric strength type MISFET, phosphorus should be implanted in the low density n-type semiconductor area 306c-1. Consequently, the dielectric strength between channels is improved.

The gate insulating film 304 is the same as that of the selecting MISFET Qt, and so an explanation thereof will be omitted here.

Just like the selecting MISFET Qt described above, a cap insulating film 307b is also formed on top of each gate electrode 305 via an insulating film 307a. Thus, explanation thereof will also be omitted here.

On both side surfaces of each gate electrode 305, the first side walls 323a are formed, and outside the side walls 323a, the second side walls 323b are formed.

The first side walls 323a are formed by anisotropic etching performed for the insulating film 309 for self-matching treatment to be described later. For example, the first side walls 323a are composed of a silicon nitride film. These first side walls 323a can also be used as side walls for opening connecting holes in a self-matching manner with respect to gate electrodes 305 when the connecting holes are formed in the peripheral circuit area.

The second side walls 323b are composed of, for example, a silicon oxide film and they are used as a mask for ion-implanting of impurities to form a high density n-type semiconductor area 306c-2, so that the high density n-type semiconductor area 306c-2 is formed in a self-matching manner. By controlling the thickness of this second side wall film 323b, the LDD structure can be optimized to improve the performance of the n-type MISFET Qn.

As described above, the insulating film 309 for self-matching treatment on the semiconductor substrate 301 is removed by anisotropic etching and the insulating film for self-matching treatment 309 is not provided in the peripheral circuit area. Thus, there is no need to open the connecting holes in the peripheral circuit area in two stages, permitting the holes to be opened easily. When the gate electrodes 305 in the peripheral circuit area are connected to a wiring in the upper layer, the connecting holes can be opened easily. The reason why there is no need to provide the insulating film for self-matching treatment 309 in the peripheral circuit area can be explained as follows: the MISFET formed in the peripheral circuit area does not require such a high integration and so a rather large margin can be secured for the pitches of elements, as well as a margin can be secured for forming active areas. Thus, failures in opening the connecting holes can be taken into consideration during design. When a high integration is required for the peripheral circuit area, therefore, the etching stopper 104 described in the second embodiment may be formed selectively in the peripheral circuit area after the second side walls 323b are formed, of course.

When it is needed, a p-type MISFET can be formed in the same configuration as that of the n-type MISFET Qn just by reversing the electrical conductivity.

At the phase boundary between side surfaces of each gate electrode 305 and the first side walls 323a, an insulating film (not illustrated) may be formed. Such an insulating film and the insulating film 307a are provided to prevent film forming apparatus from being contaminated with the metal used for forming the WSi2 film 305b and to reduce the thermal stress on the cap insulating film 307b and the first side walls 323a when the cap insulating film 307b and the first side walls 323a are formed.

The n-type MISFET Qn is covered by an interlaminar insulating film 310f composed of a silicon oxide film deposited by the CVD method using, for example, TEOS. In addition, on the interlaminar insulating film 310f there is formed an interlaminar insulating film 310g flattened by, for example, the CMP method. The interlaminar insulating film 310g may be a silicon oxide film deposited by the plasma CVD method using, for example, TEOS. The interlaminar insulating film 310g may be formed with SOG or BSPG and flattened using the etch-back method.

On the interlaminar insulating film 310g there is formed the interlaminar insulating film 310b described above, and on the interlaminar insulating film 310b there is formed the bit lines BL described above. The bit lines BL are covered by an interlaminar insulating film 310c described above, and on the interlaminar insulating film 310c there is formed the interlaminar insulating film 310d described above.

Both on the interlaminar insulating film 310d and on the plate electrodes 322 there is formed an interlaminar insulating film 324 composed of, for example, BPSG. The interlaminar insulating film 324 is flattened by the reflowing method.

On the interlaminar insulating film 324 in the peripheral circuit area there is formed the first wiring layer 325. The first wiring layer 325 is connected to the high density n-type semiconductor area 306c-2 of the n-type MISFET Qn via connecting holes 326. The first wiring layer 325 may be a laminated film composed of a metallic film such as titan nitride, titan, or aluminum. The laminated film may be deposited by, for example, the spattering method. A plug composed of, for example, tungsten may be formed in each connecting hole 326. The tungsten plug may be formed the tungsten CVD method. At this time, titan nitride should be used for forming a bonding layer beforehand in each connecting hole.

The first wiring layer 325 is covered by an interlaminar insulating film 327, and on the interlaminar insulating film 327 there is formed the second wiring layer 328. The second wiring layer 328 is connected to the first wiring layer 325 via connecting holes 329. The interlaminar insulating film 327 may be a silicon oxide film composed of, for example, a silicon oxide film and SOG, but it should be a laminated film formed by sandwiching the silicon oxide film between silicon oxide films deposited by the plasma CVD method. The second wiring layer 328 should take the same configuration as that of the first wiring layer 325.

The second wiring layer 328 is covered by an interlaminar insulating film 330, and on the interlaminar insulating film 330 there is formed the third wiring layer 331. The third wiring layer 331 is connected to the second wiring layer 328 via connecting holes 332. The interlaminar insulating film 330 may take the same configuration as that of the interlaminar insulating film 327, and the third wiring layer 331 may take the same configuration as that of the first wiring layer 325.

The third wiring layer 331 is covered by a passivation film 333. The passivation film 333 may be a laminated film composed of a silicon oxide film and a silicon nitride film.

Next, how to manufacture the DRAM will be described with reference to FIGS. 53(a) to 79(b).

FIGS. 53(a) to 79(b) are cross sectional views of a method of manufacturing the DRAM in this sixth embodiment in order of the processes. FIGS. 53(a) to 79(b) except for FIGS.

Figure 63:
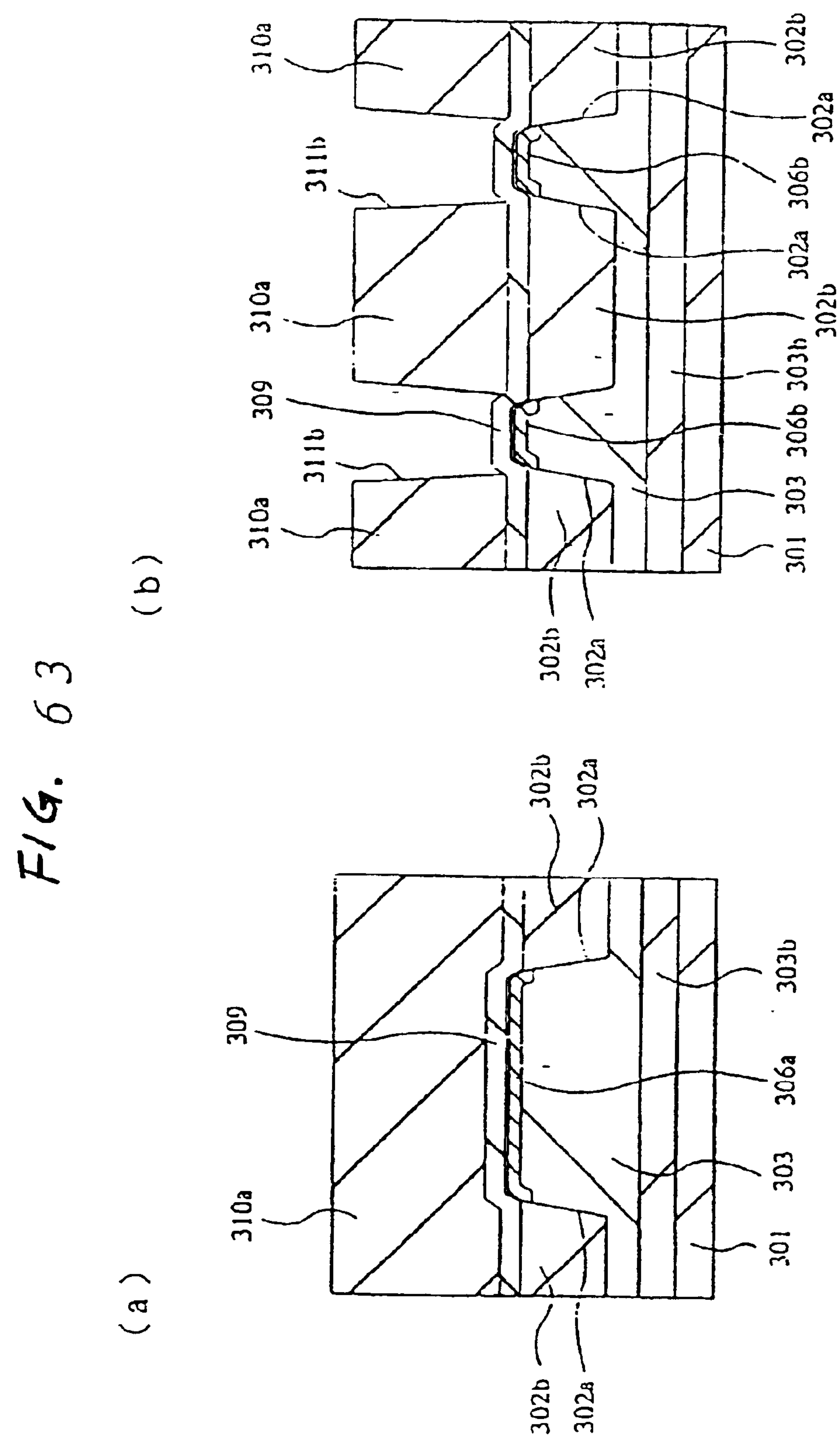

63(*a*) and (*b*), 65(*a*) and (*b*), 67(*a*) and (*b*), 69(*a*) and (*b*), and 71(*a*) and (*b*) indicate a portion equivalent to the cross sectional view taken along the line Ia—Ia shown in FIG. 51 in each (a) view and in each (b), view, respectively. They indicate a cross sectional view of the peripheral circuit area. FIGS. 63(*a*), 65(*a*), 67(*a*), 69(*a*), and 71(*a*) indicate a portion equivalent to a cross sectional view taken along the line IIIa—IIIa, and FIGS. 63(*b*), 65(*b*), 67(*b*), 69(*b*) and 71(*b*) indicates a portion equivalent to a cross sectional view taken along the line IIIb—IIIb, shown in FIG. 51, respectively.

Figure 53:
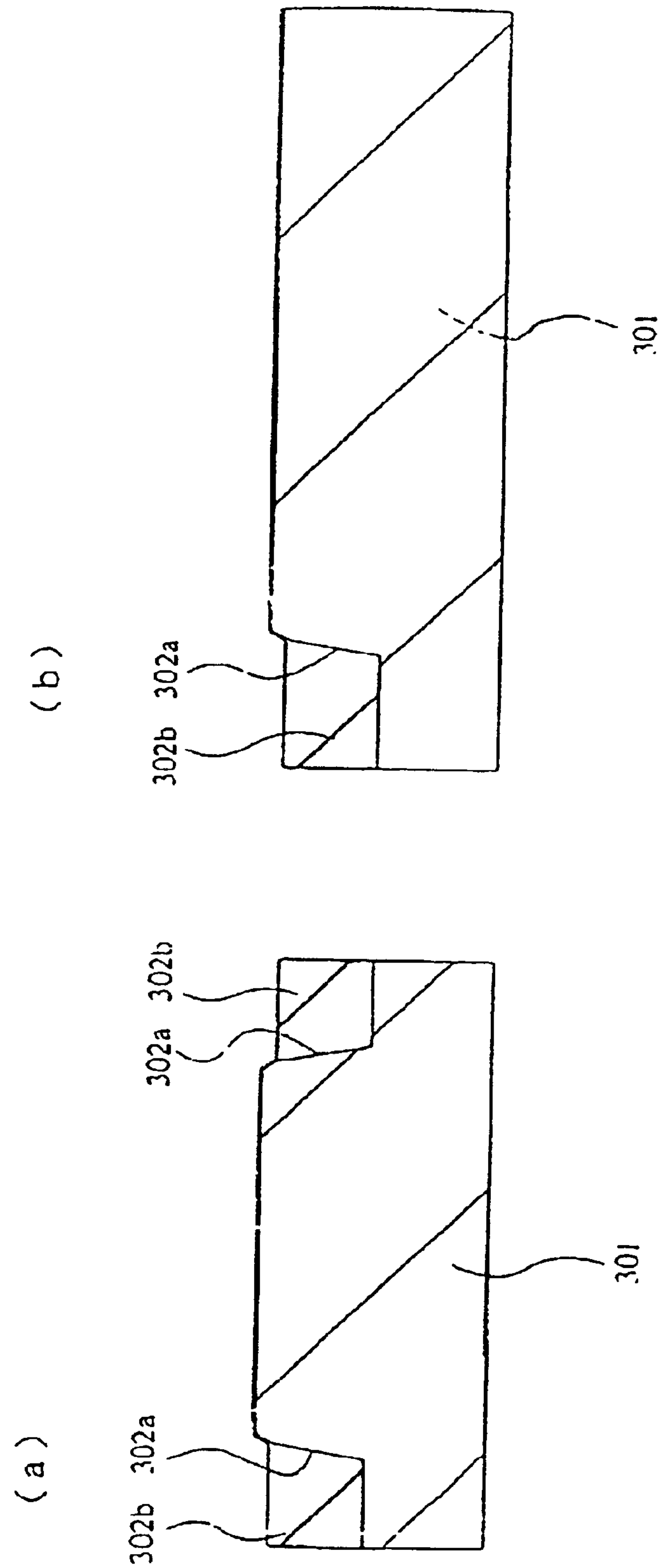
FIGS. 53 to 79 are cross sectional views showing a method of manufacturing the DRAM in the sixth embodiment in the order of the processes.

At first, as shown in FIG. 53(*a*) and FIG. 53(*b*), a shallow groove element, isolating area is formed in each specified area on the semiconductor substrate 301. In the shallow groove element isolating area there is formed a silicon oxide film and a silicon nitride film (both not illustrated) sequentially on the main surface of the semiconductor substrate 301. Then, both the silicon oxide film and the silicon nitride film are removed by photo resist from the shallow groove 302*a*, and then a groove 0.3 to 0.4 $\mu$m in depth is formed in the semiconductor substrate 301. Next, a silicon thermal-oxide film (not illustrated) is formed on surfaces of both the sides and bottom surface of the groove using the silicon nitride film as an oxidation mask. Then, a silicon oxide film is deposited all over the semiconductor substrate 301 using the CVD (Chemical Vapor Deposition) method. The silicon oxide film is removed from the areas except for the shallow groove 302*a* using the CMP (Chemical Mechanical Polishing) method or the dryetching method to embed the silicon oxide film in the shallow groove 302*a* selectively.

The element isolating insulating film 302*b* should be densified in an atmosphere of oxidation. Then, the silicon nitride film is removed with heated phosphoric acid to form an element isolating insulating film 302*b*. At this time, the element isolating insulating film 302*b* is slightly etched with heated phosphoric acid so as to be lowered in position relative to the- active areas on the semiconductor substrate 301. Consequently, the gate electrodes 305 can be patterned more satisfactorily to improve the performance of the MISFET.

Figure 54:
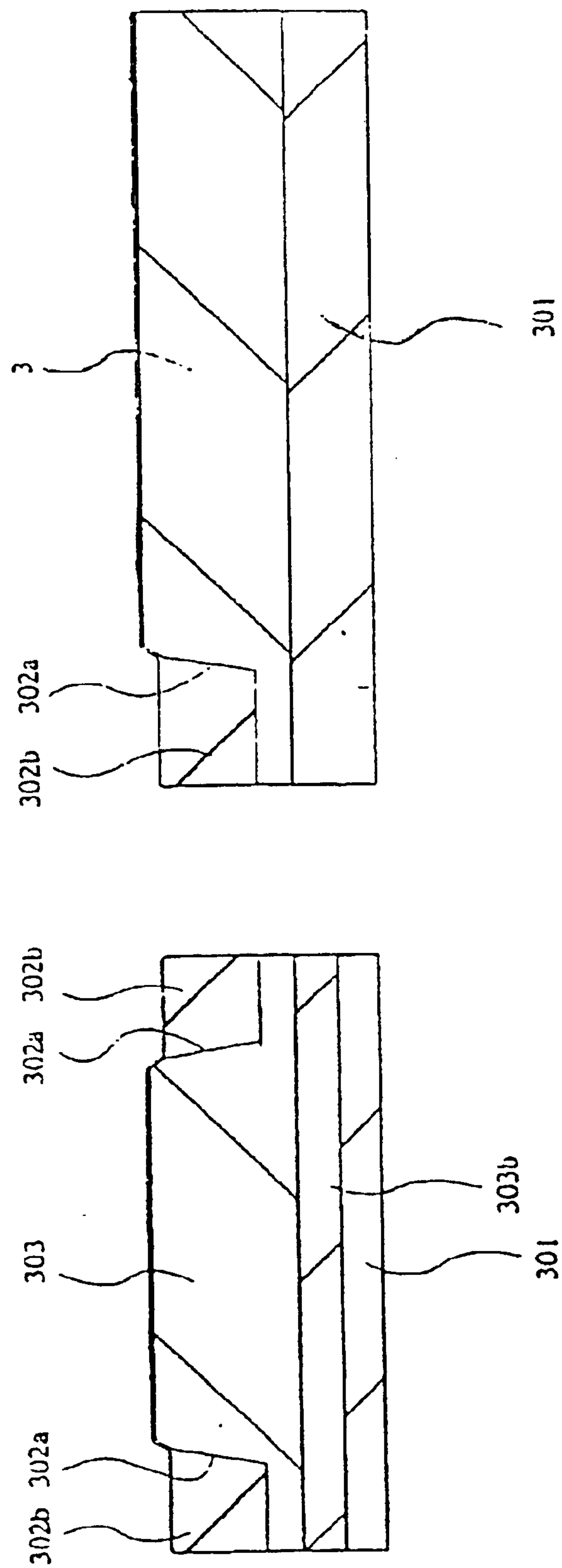

As shown in FIG. 54(*a*) and FIG. 54(*b*), an n-type impurity, for example, phosphorus is ion-implanted in the memory cell array forming area on the semiconductor substrate 301 using a photo resist as a mask. Then, the photo resist is removed and a p-type impurity, for example, boron is ion-implanted in the memory cell array forming area and the n-type MISFET Qn forming area on the semiconductor substrate 301. The photo resist is then removed and a heat distribution treatment is performed for the semiconductor substrate 301 to form a deep well 303*b* and a p-well 303. To form a p-type MISFET, for example, phosphorus is implanted in the area to form an n-well.

And, in order to optimize the impurity density in a channel area and obtain the threshold voltage of a desired memory cell selecting MISFET Qt or an n-type MISFET Qn, a p-type impurity, for example, boron can be ion-implanted in the main surface of the active area of the p-well 303.

Figure 55:
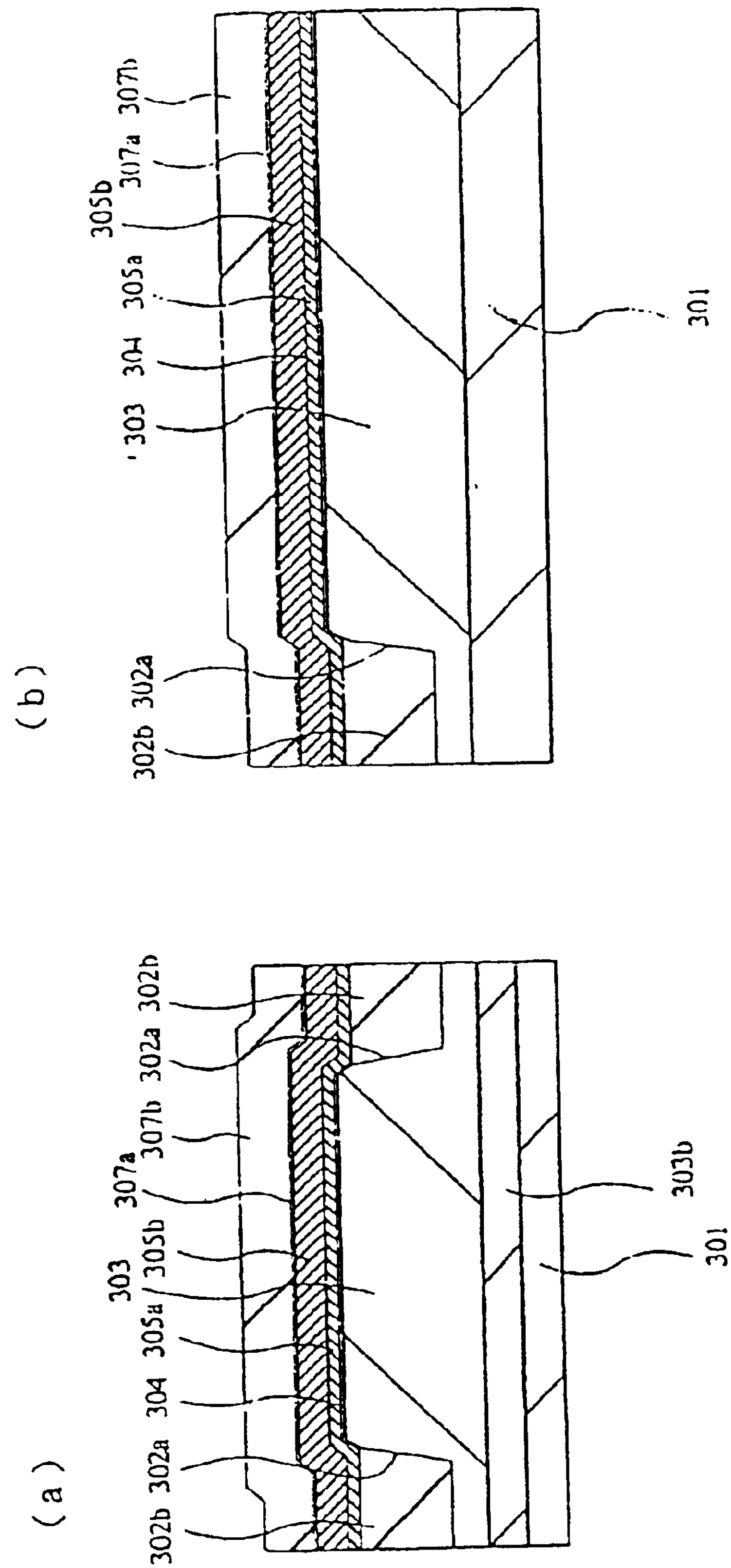

As shown in FIG. 55(*a*) and FIG. 55(*b*), a gate insulating film 304 is formed on the surface of the semiconductor substrate 301. This gate insulating film 304 is formed using the thermal oxidation method with a thickness of about 7 nm. In addition, a polycrystal silicon film 305*a* formed by implanting phosphorus all over the semiconductor substrate 301 and a $WSi_2$ film 305*b* are deposited sequentially. The CVD method is used to form the polycrystal silicon film 305*a* and the $WSi_2$ film 305*b*. They are 40 nm and 100 nm in thickness, respectively. Then, on the $WSi_2$ film 305*b* an insulating film 307*a* composed of a silicon oxide and a cap insulating film 307*b* composed of a silicon nitride and deposited sequentially. The CVD method is used to form the insulating film 307*a* and the cap insulating film 307*b*. The films 307*a* and 307*b* are 10 nm and 160 nm in thickness, respectively.

Figure 56:
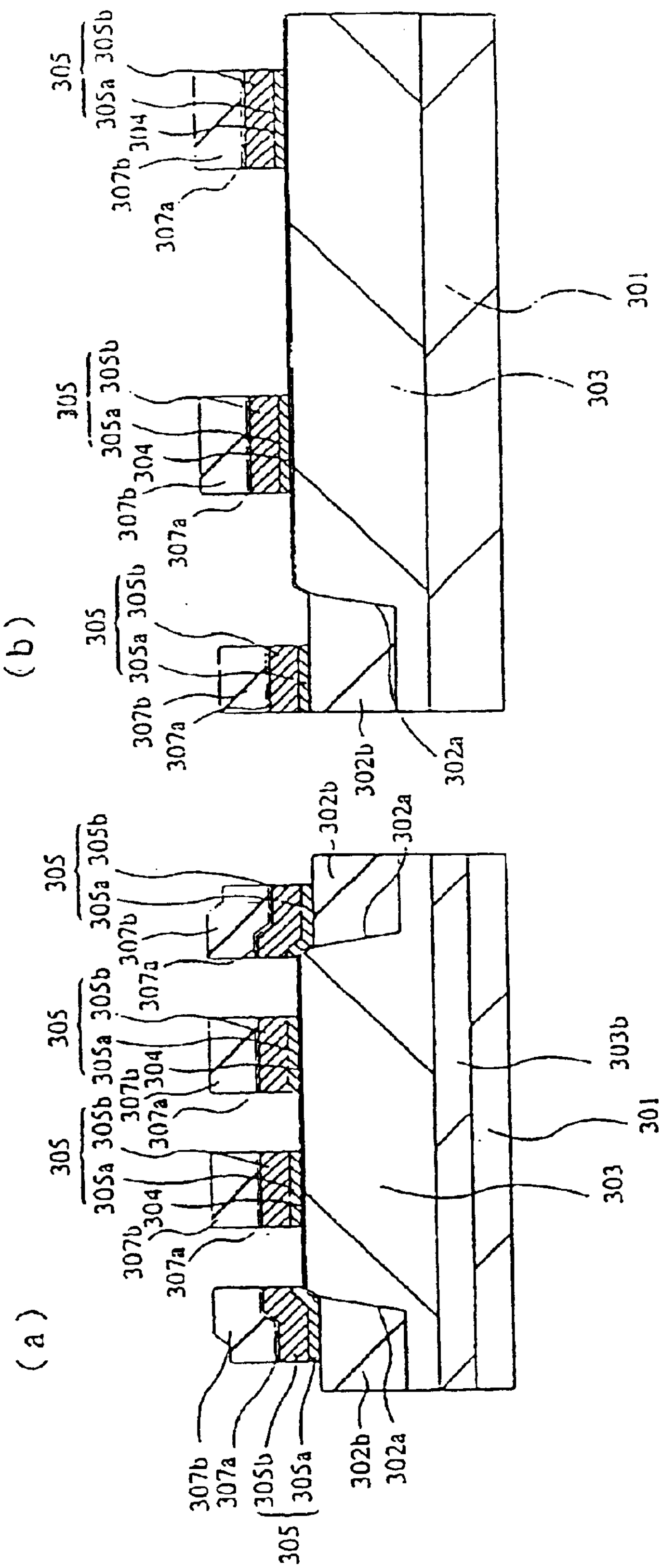

As shown in FIG. 56(*a*) and FIG. 56(*b*), the gate electrodes 305 of the selecting MISFET Qt for the memory cells composed of a polycrystal silicon film 305*a* and a $WSi_2$ film 305*b* and the peripheral circuit MISFET Qn are formed by etching a cap insulating film 307*b*, an insulating film 307*a*, a $WSi_2$ film 305*b*, a polycrystal silicon film 305*a* of an laminating film sequentially using photo resist as a mask.

Next, the photo resist is removed, and then a thermal oxidation treatment is performed on the semiconductor substrate 301 to form a thin silicon oxide film on the side surfaces of the polycrystal silicon film 305*a* formed by gate electrodes 305 and the $WSi_2$ film 305*b*.

Figure 57:
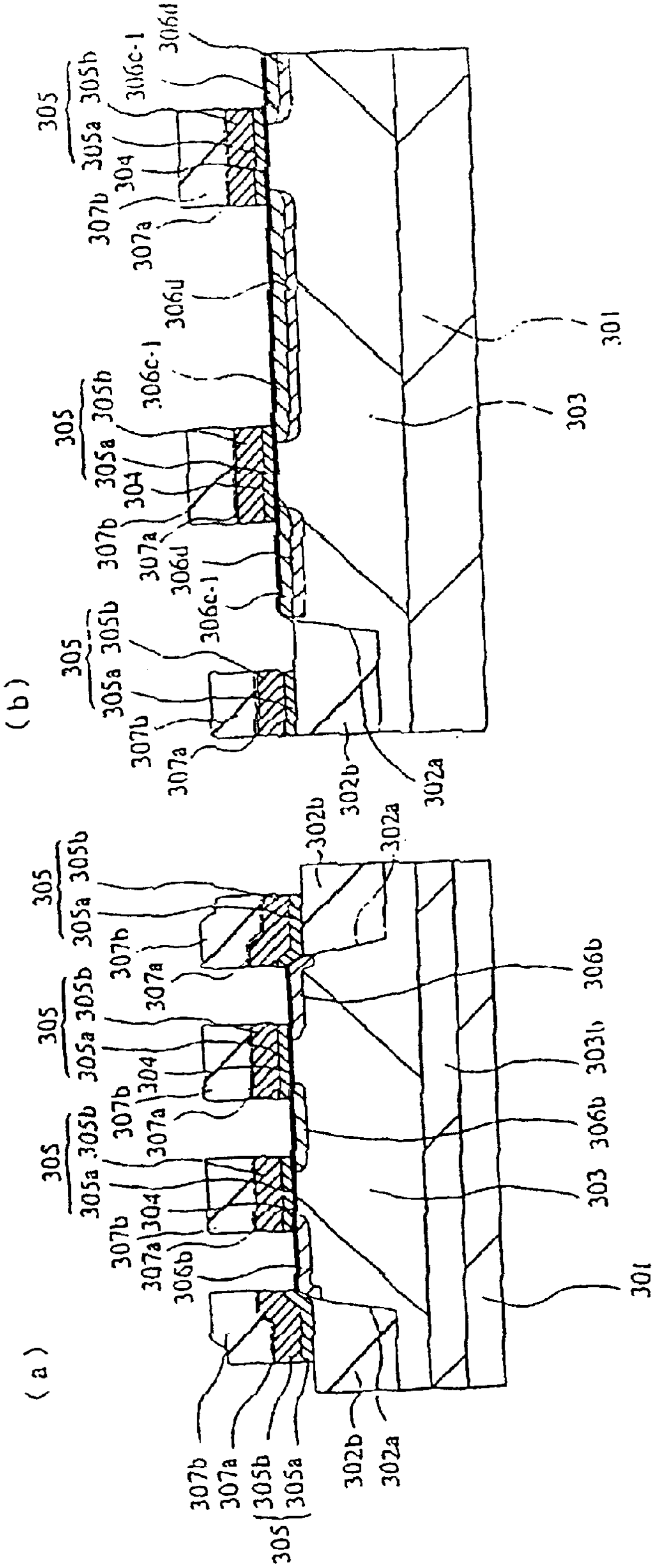

As shown in FIG. 57(*a*) and FIG. 57(*b*), a p-type impurity, for example, boron is ion-implanted in the main surface of the p-well in the area where an n-type MISFET Qn of the peripheral circuit area is formed using the laminated film described above and a photo resist as masks, and then an n-type impurity, for example, arsenic is ion-implanted in the same main surface. Furthermore, after the photo resist is removed, an impurity, for example, phosphorus is ion-implanted in the main surface of the p-well 303 where a selecting MISFET Qt is formed, using the laminated film described above and a photo resist as masks. Then, those impurities are expanded and distributed to form a low density n-type semiconductor area 306*c*-1 and a p-type semiconductor area 306*d* of the n-type MISFET Qn and n-type semiconductor areas 306*a* and 306*b* of the selecting MISFET Qt. To form a high dielectric strength n-type MISFET, phosphorus is implanted in the area. To form a p-type MISFET, arsenic for a punched-through stopper and boron ($BF_2$) for a low density semiconductor area are implanted in the area. The low density n-type semiconductor area 306*c*-1 for the peripheral circuit MISFET Qn and the n-type semiconductor areas 306*a* and 306*b* of the memory cell selecting MISFET Qt are formed in a self-matching manner with respect to the gate electrodes.

Figure 58:
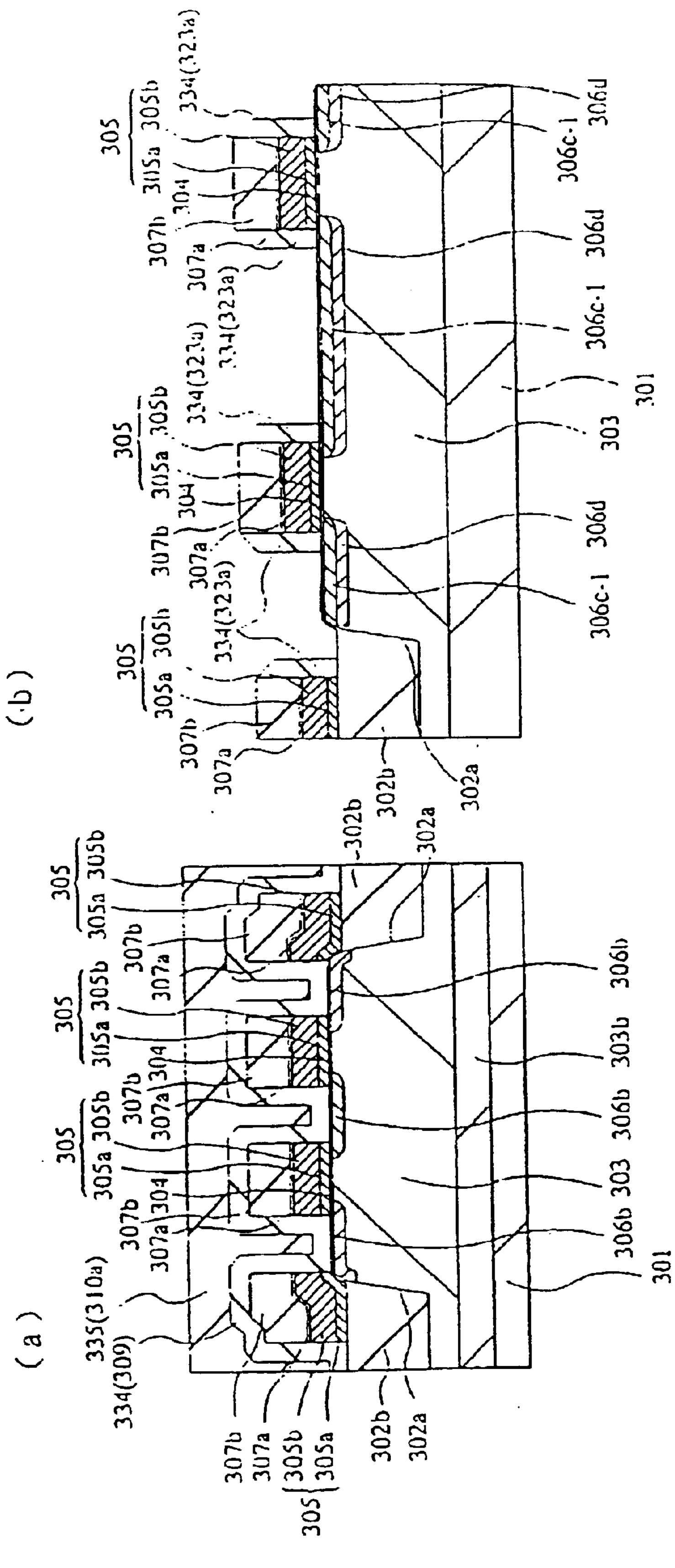

As shown in FIG. 58(*a*) and FIG. 58(*b*), a silicon nitride film 334 is deposited. The thickness of the silicon nitride film 334 can be, for example, 80 nm. Then, an SOG film 335 is deposited, and the memory array area is masked with photo resist to etch the SOG film 335 and the silicon nitride film 334. The etching may be anisotropic etching such as RIE (Reactive Ion Etching). Consequently, the SOG film 335 and the silicon nitride film 334 are removed from the peripheral circuit area to form an insulating film for self-matching treatment 309 and an interlaminar insulating film 310*a* in the memory array area. The interlaminar insulating film 310*a* is composed of SOG, so that the film 310*a* can fill each recess and flatten the surfaces of the gate electrodes 305 and the cap insulating film 307*b*. Furthermore, since anisotropic etching is performed, the first side walls 323*a* composed of a silicon nitride film are formed on side surfaces of the gate electrodes 305 of the n-type MISFET Qn and the cap insulating film 307*b* in the peripheral circuit area.

Figure 59:
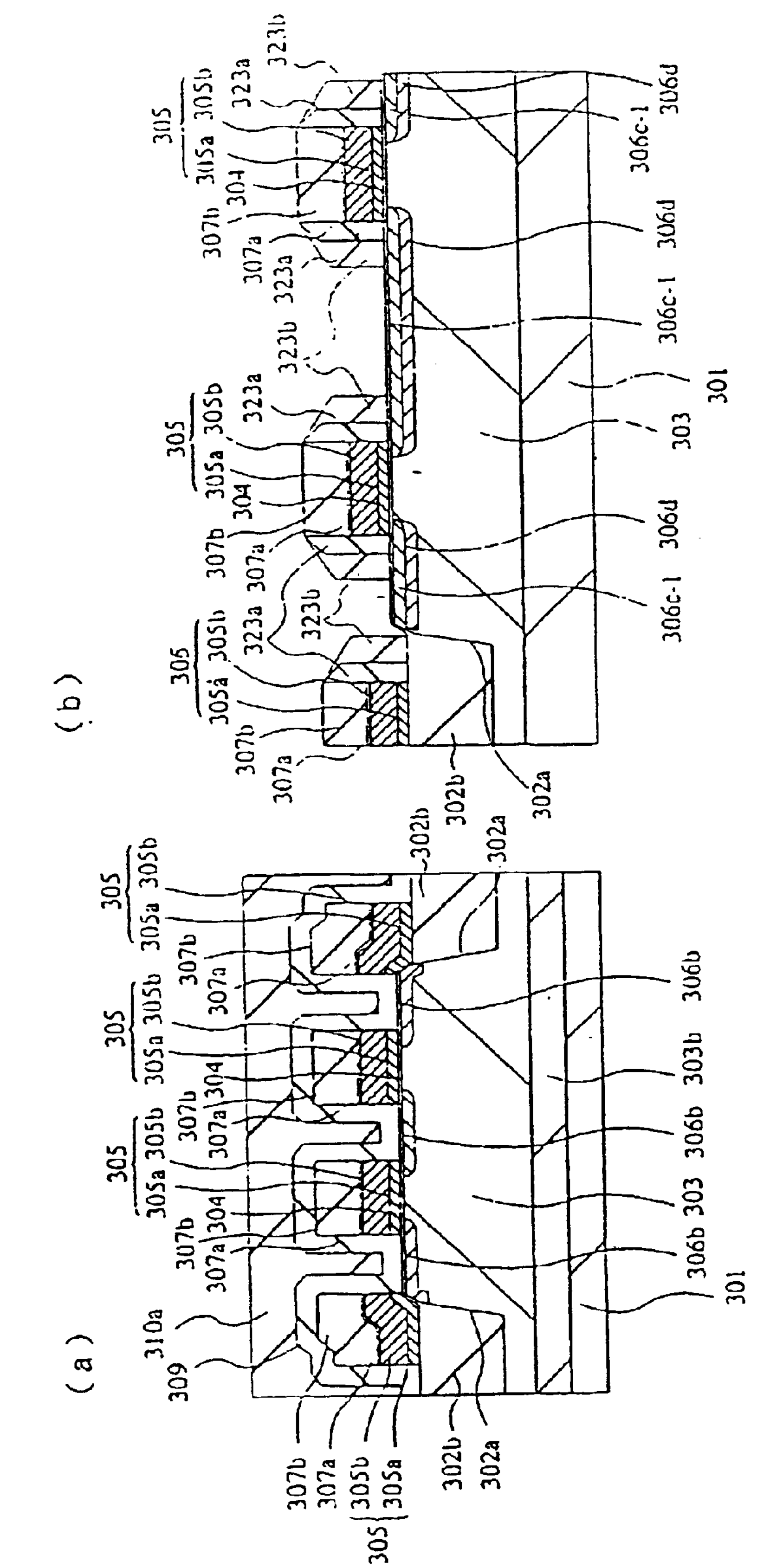

As shown in FIG. 59(*a*) and FIG. 59(*b*), a TEOS silicon oxide film (not illustrated) is formed all over the surface of the semiconductor substrate 301, and then the film is anisotropic-etched to form the second side walls 323*b* on side surfaces of the first side walls 323*a*. The second side walls 323*b* should be thicker (wider) than the first side walls 323*a*. The memory cell can thus be divided finely and the characteristics of the peripheral circuit MISFET are improved.

Figure 60:
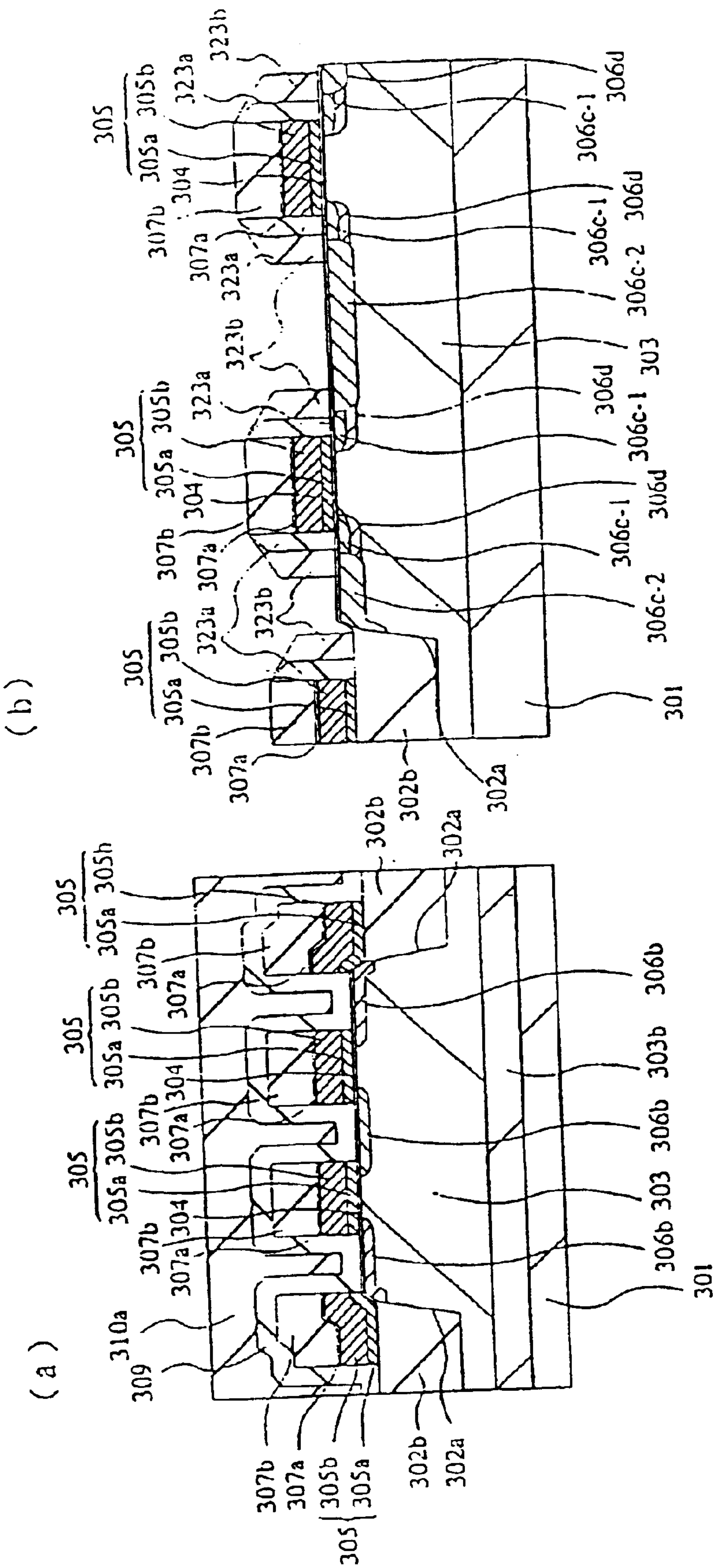

As shown in FIG. 60(*a*) and FIG. 60(*b*), n-type impurities, for example, arsenic and phosphorus are ion-implanted in the peripheral circuit area where the n-type MISFET Qn is formed, using the gate electrodes 305, the cap insulating film 307*b*, the second side walls 323*b*, and a photo resist as masks. Then, the photo resist is removed and the impurities are expanded and distributed to form a high density n-type semiconductor area 306*c*-2 of the n-type MISFET Qn. To form a p-type MISFET, boron ($BF_2$) for a high density semiconductor area is implanted in the area. This high density n-type semiconductor area 306*c*-2 is formed in a self-matching manner with respect to the second side walls 323*b*.

Figure 61:
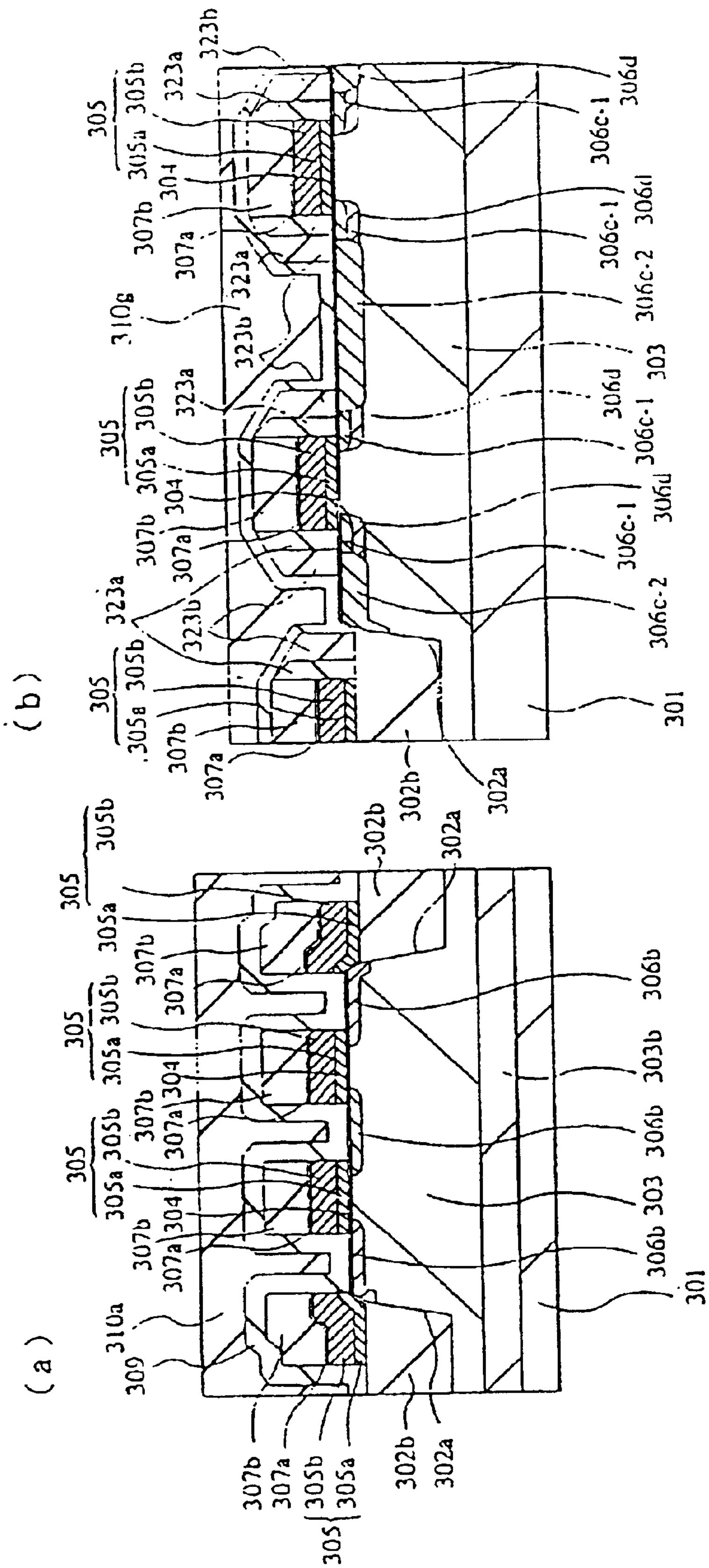

As shown in FIG. 61(*a*) and FIG. 61(*b*), a TEOS silicon oxide film is deposited to form an interlaminar insulating film 310*f*. In addition, a silicon oxide film is deposited by the plasma CVD method using TEOS, and then the silicon oxide film is flattened by CMP method (polishing) to form an interlaminar insulating film 310*g*. In the memory cell portion there is deposited a TEOS silicon oxide film 310*f* and another silicon oxide film, while the SOG film 335 is left as it is. The surface is flattened using the CMP method. Thereafter, in the memory cell portion the SOG film 335, the TEOS silicon oxide film 310*f*, and the polished silicon oxide film remain. This 3-layer insulating film is referred to as an interlaminar insulating film 310*g*.

Figure 62:
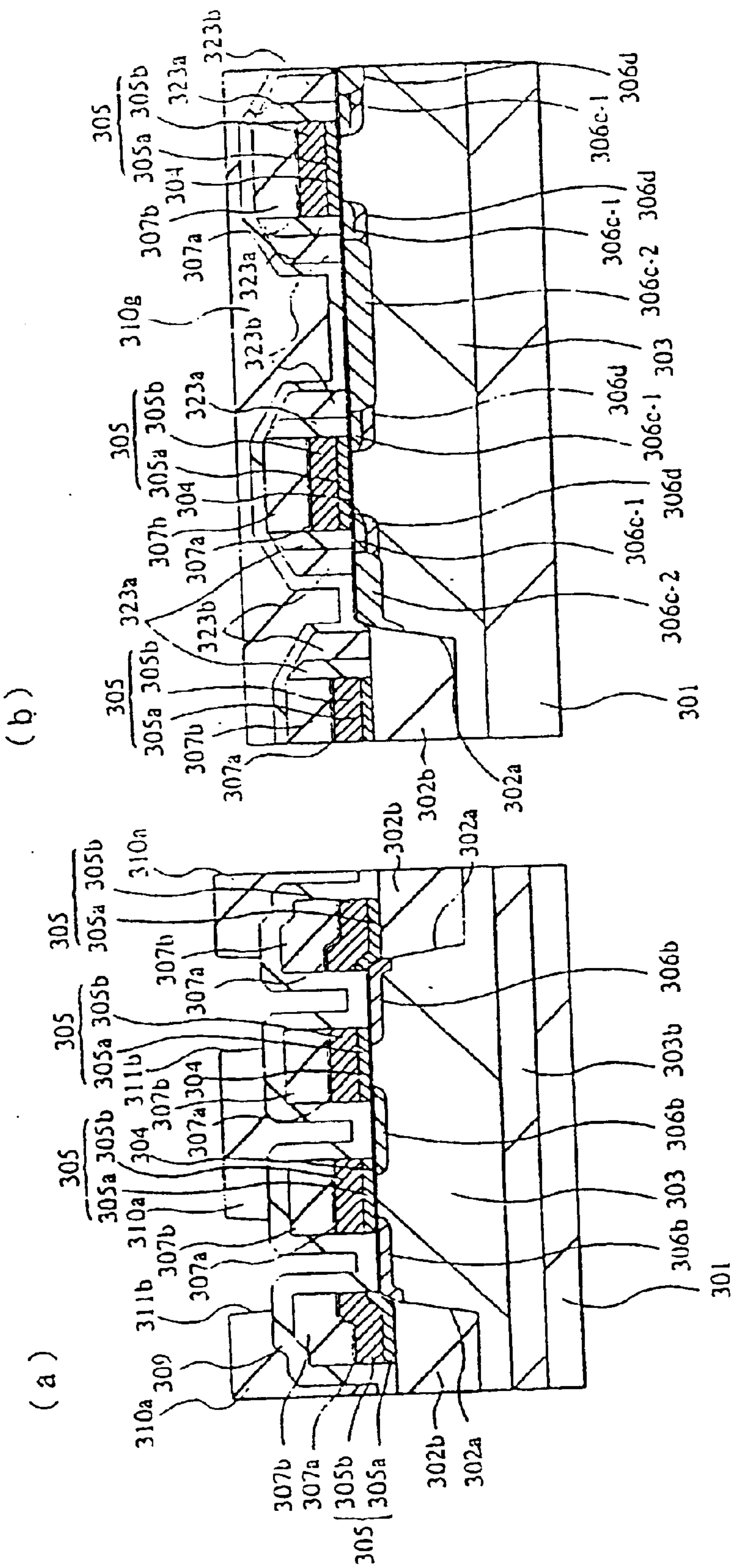

Next, as shown in FIGS. 62(*a*) to 65(*b*), the interlaminar insulating film 310*a* is etched using a photo resist as a mask to form connecting holes 311*b*. The connecting holes 311*b* are opened by etching performed in two stages.

At first, the first etching process is performed under conditions which make it easy to etch the silicon oxide film and not easy to etch the silicon nitride film. Such etching is performed as an anisotropic plasma etching using a mixed gas containing, for example, $C_4F_8$ and argon as material gases. In this first etching process, it is not easy to etch the silicon nitride film, so etching of the interlaminar insulating film 310*a* composed of a silicon oxide is advanced into the stage in which the insulating film for self-matching treatment 309 composed of a silicon nitride film is exposed. FIGS. 62(*a*) and 63(*b*) indicate this state. In other words, the insulating film for self-matching treatment 309 functions as an etching stopper in the first etching process.

Figure 65:
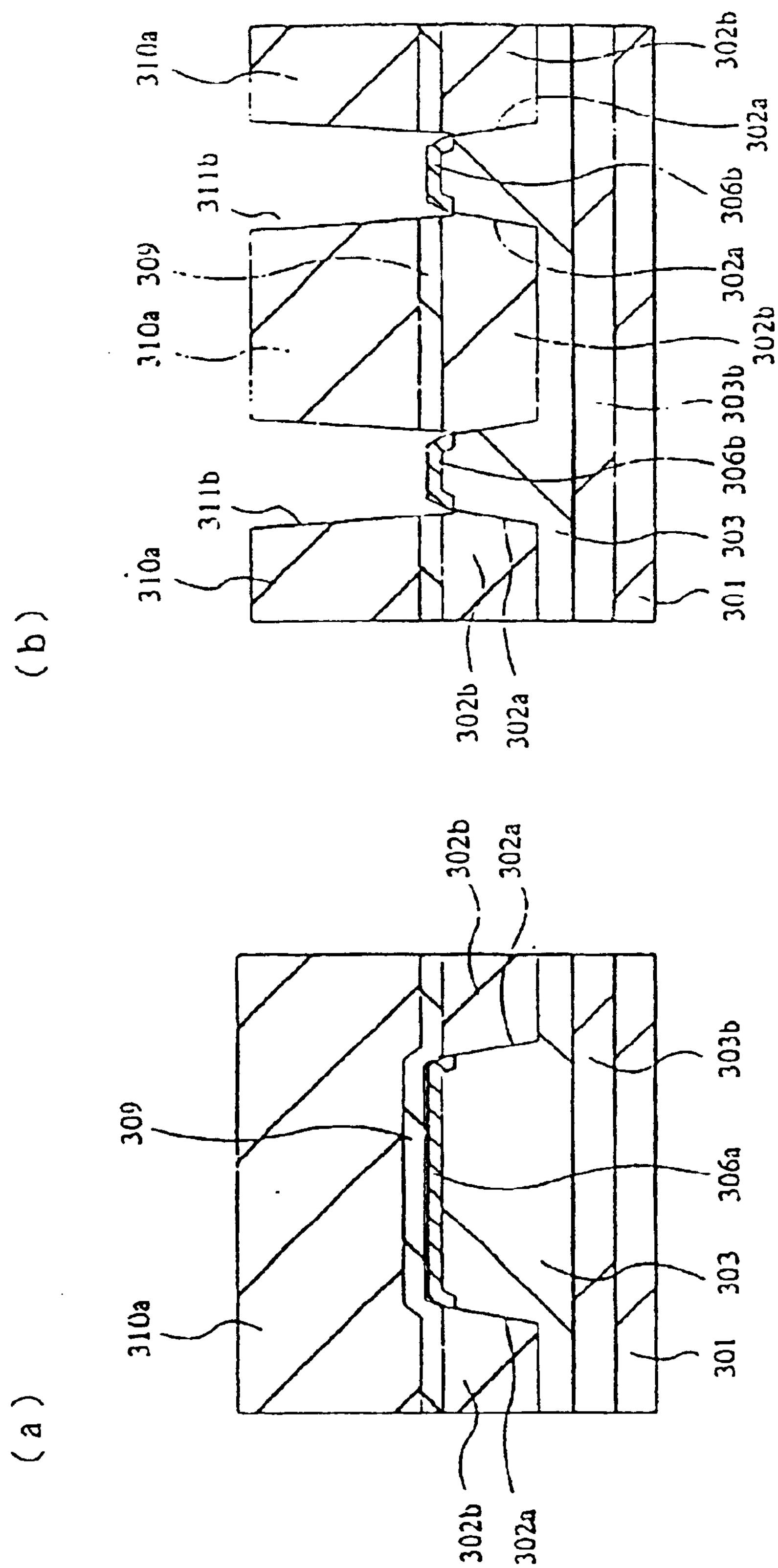

Next, the second etching process is performed under conditions which make it easy to etch the silicon nitride film. Such etching is performed as an anisotropic plasma etching using a mixed gas containing $CHF_3$, $CF_4$ and argon as material gases. In the second etching process, it is only necessary to etch the thinner insulating film for self-matching treatment 309, since the thicker interlaminar insulating film 310*a* already has been removed in the first etching process. In other words, it is possible to etch the insulating film for self-matching treatment 309 with an a sufficient process margin by suppressing over-etching to the ground of the insulating film for self-matching treatment 309. This means that under conditions which make it easy to etch silicon nitride films, no selection ratio of silicon nitride films to silicon oxide films can be taken. Thus, both silicon nitride and silicon oxide films are etched. As a result, as shown in FIG. 65(*b*), when the bottom of any connecting hole 311*b* overlaps the element isolating insulating film 302*b*, the insulating film 302*b* composed of a silicon oxide film is also etched. Ideally, the etching should be such that only the insulating film for self-matching treatment 309 is etched and the etching is ended just after the insulating film for self-matching treatment 309 is removed. It is generally difficult, however, to open connecting holes 311*b* in every area on the substrate and perform a just-etching because of problems such as etching speed distribution on the substrate, etc. Over-etching cannot be avoided to a certain extent. When the bottom of any connecting hole 311*b* goes over an active area and overlaps the element isolating insulating film 302*b*, therefore, the insulating film 302*b* might be over-etched. In this method, however, the insulating film for self-matching treatment 309 is as thin as 80 nm, and it is necessary to etch only the insulating film for self-matching treatment 309, so that the over-etching will be sufficient if the depth reaches 30 to 50% of the thickness of the insulating film for self-matching treatment 309 and at most the thickness of the insulating film for self-matching treatment 309. Overetching for the element isolating insulating film 302*b* can thus be minimized and the refreshing characteristics of the DRAM can be improved significantly to improve the performance of the-DRAM.

Figure 64:
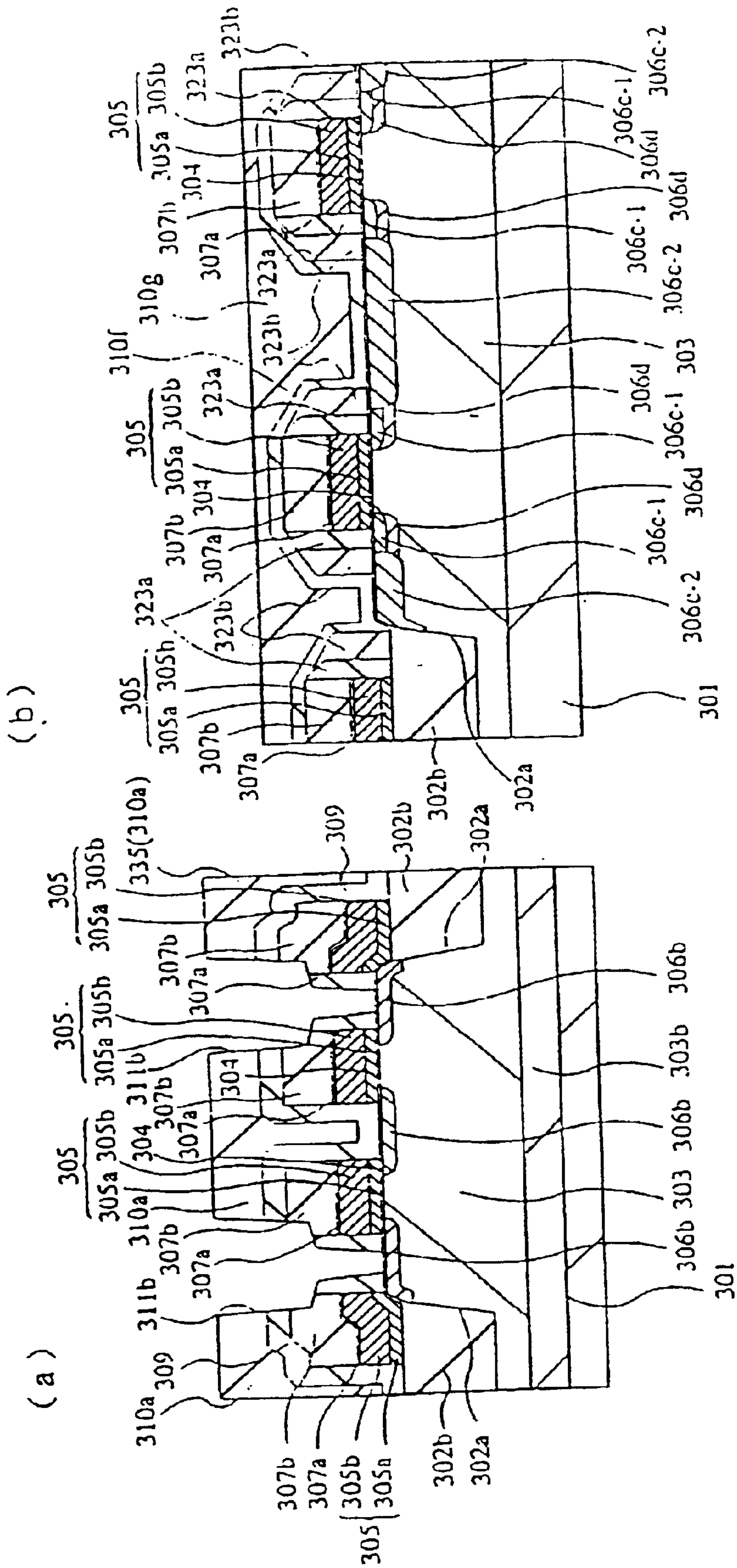

In the second etching process, the gate electrodes 305 are covered by both the insulating film for self-matching treatment 309 and the cap insulating film 307*b*, as shown in FIG. 64(*a*) and FIG. 64(*b*), so the gate electrodes 305 are not exposed even when designed so that the connecting holes 311*b* overlap the gate electrodes 305. Connecting holes 311*b* can thus be opened in a self-matching manner. In other words, the insulating film for self-matching treatment 309 can function to open connecting holes 311*b* in a self-matching manner with respect to gate electrodes 305 and to suppress overetching of the element isolating insulating film 302*b*.

In the two-stage etching method that uses the insulating film for self-matching treatment 309 in such a way, the degree of integration is improved and if effective especially for a DRAM in which the interval between gate electrodes 305 is narrow. In other words, when side walls are formed on side surfaces of each gate electrode 305 for opening connecting holes in a self-matching manner with respect to the gate electrodes 305, if an attempt is made to form a stopper film to suppress over-etching of the element isolating insulating film 302*b*, each connecting hole 311*b* composing each space between gate electrodes 305 is filled or even when the space is not filled, the bottom area of each connecting hole 311*b* is minimized. And, this makes it difficult to secure a sufficient connecting conductivity. In the case of the manufacturing method in the sixth embodiment, however, no side wall is formed for self-matching opening of connecting holes with respect to gate electrodes 305. Instead, the insulating film for self-matching treatment 309 is provided with a function for such a self-matching opening, so that a sufficient space can be secured between gate electrodes 305 and the connecting reliability are assured while the process margin for opening connecting holes 311*b* is maintained.

Figure 66:
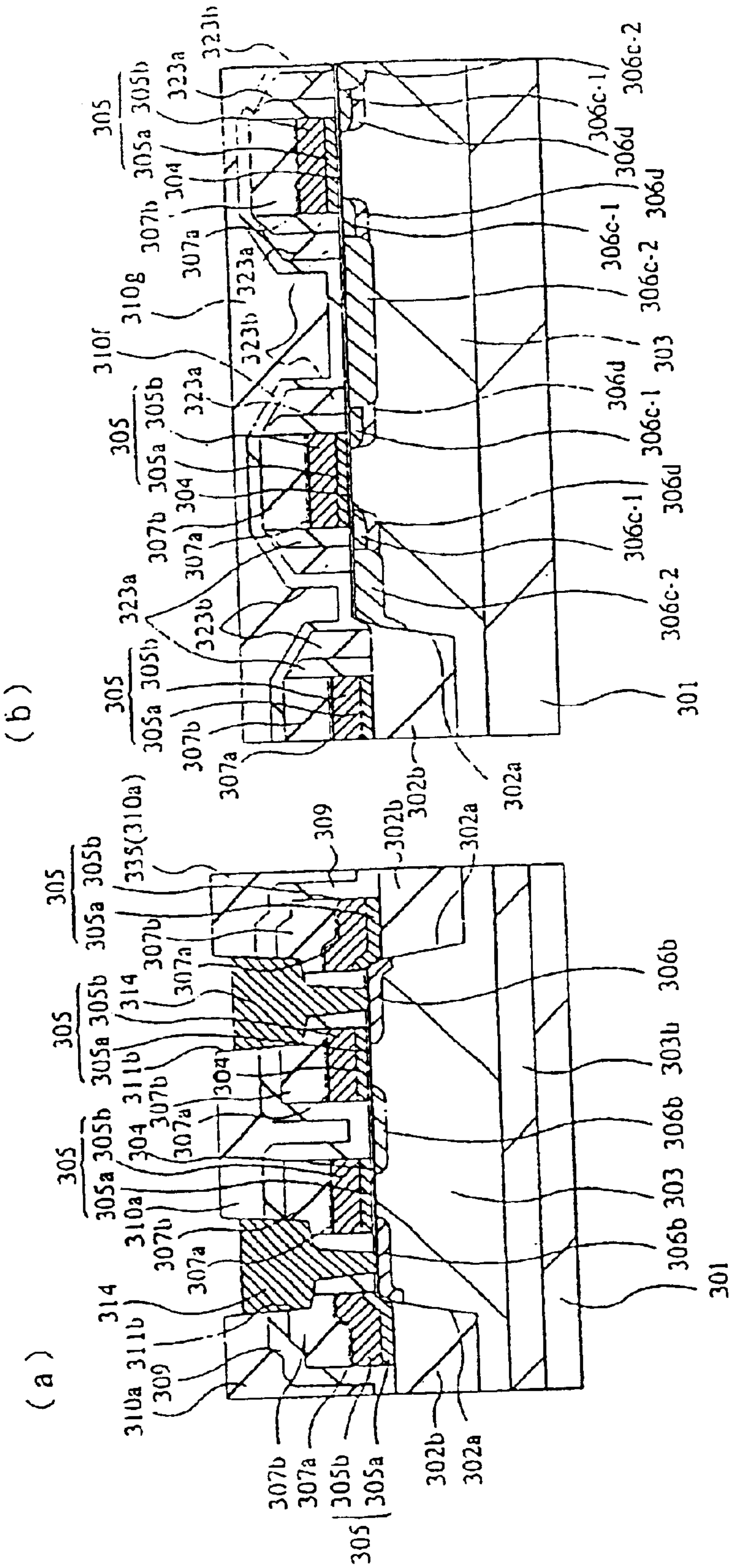
Figure 67:
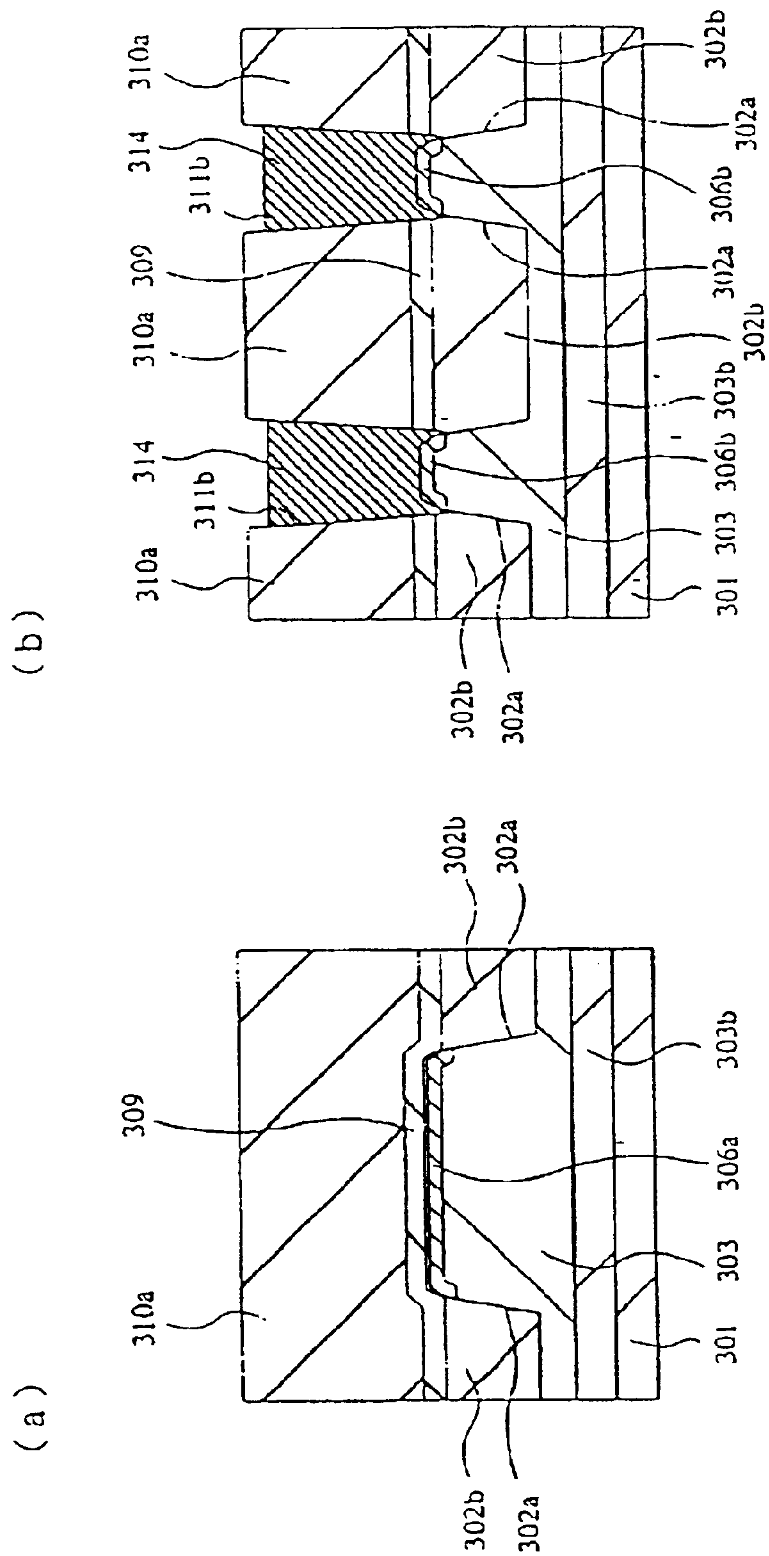

Next, as shown in FIGS. 66(*a*) and 67(*b*), a plug 314 is formed in each connecting hole 311*b*. The plug 314 may be polycrystal silicon implanted with phosphorus. The plug 314 can be formed by depositing a polycrystal silicon film all over the surface of the semiconductor substrate 301 and etching-back the polycrystal silicon film. Since the bottom of the connecting hole 311*b* does not reach the depth of the element isolating insulating film 302*b*, the bottom of the plug 314 is formed in a shallow area even in an area where a connecting hole 311*b* overlaps the insulating film 302*b*, so that the reliability of the DRAM is improved.

Figure 68:
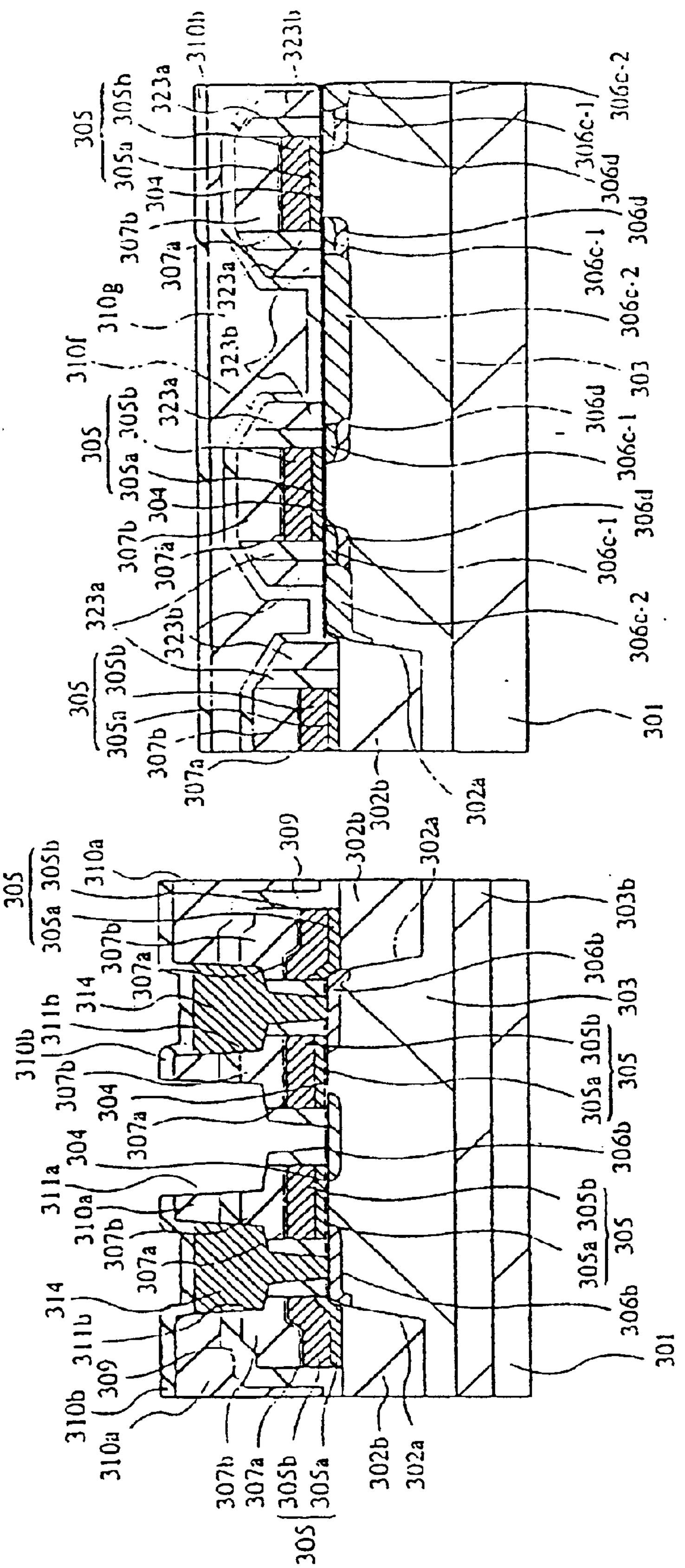
Figure 69:
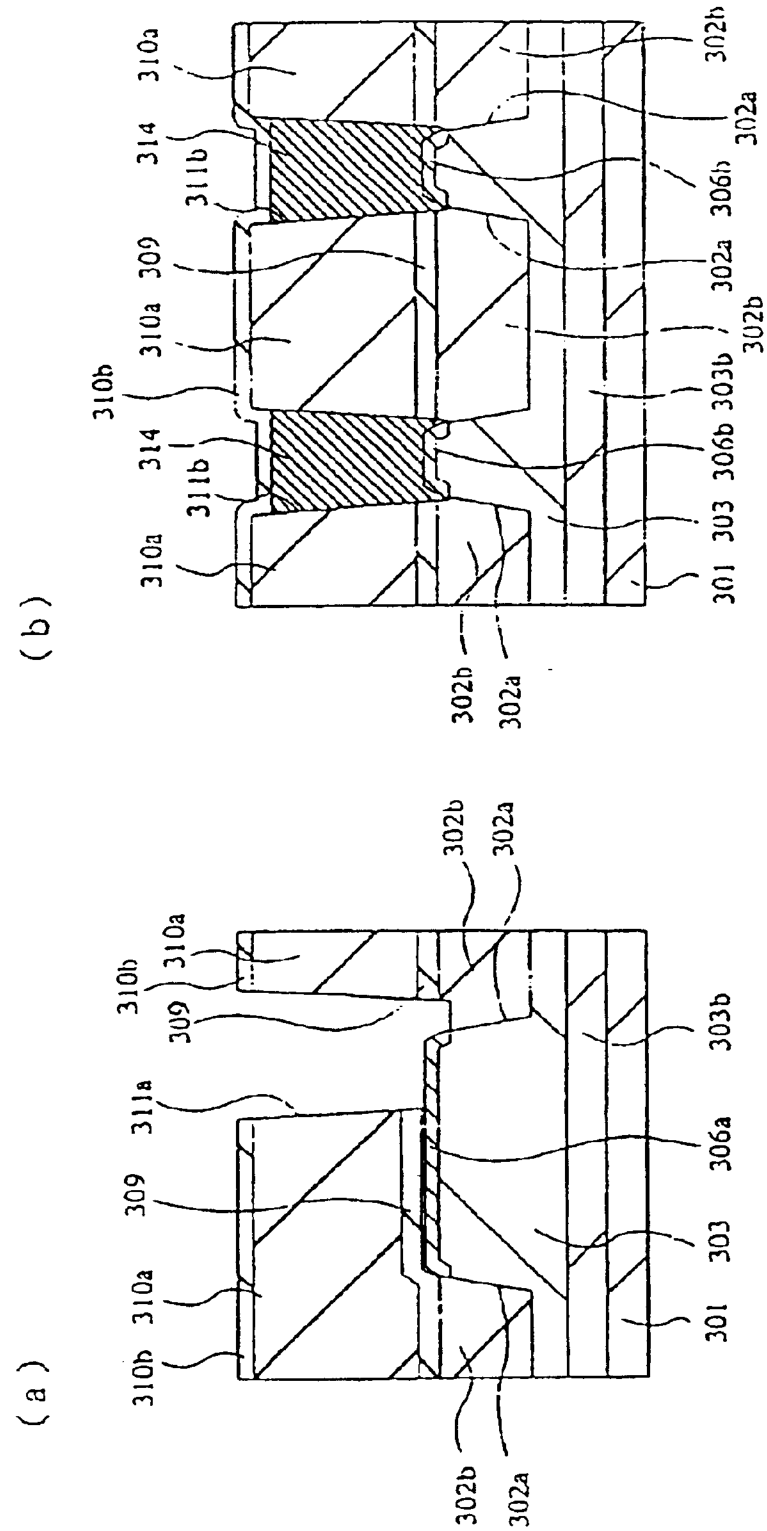

Next, as shown in FIGS. 68(*b*) and 69(*b*), an interlaminar insulating film 310*b* composed of a TOES silicon oxide film is formed all over the semiconductor substrate 301, and then connecting holes 311*a* are formed. The connecting holes

311*a* can be formed in a two-stage etching process just like the connecting holes 311*b*. And, just like connecting holes 311*b*, a plug is not formed in the depth of the element isolating insulating film 302*b* even in each connecting hole 311*a*.

Figure 70:
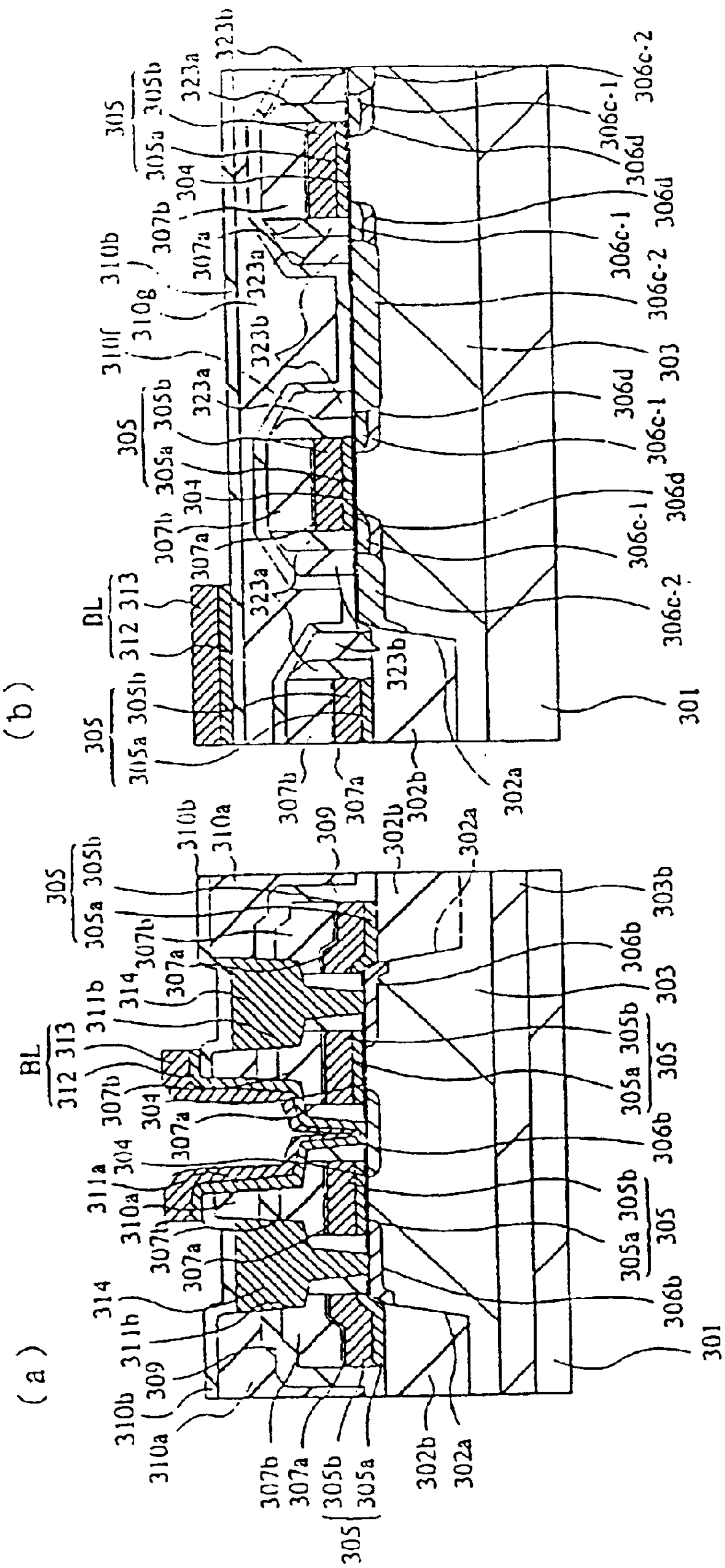
Figure 71:
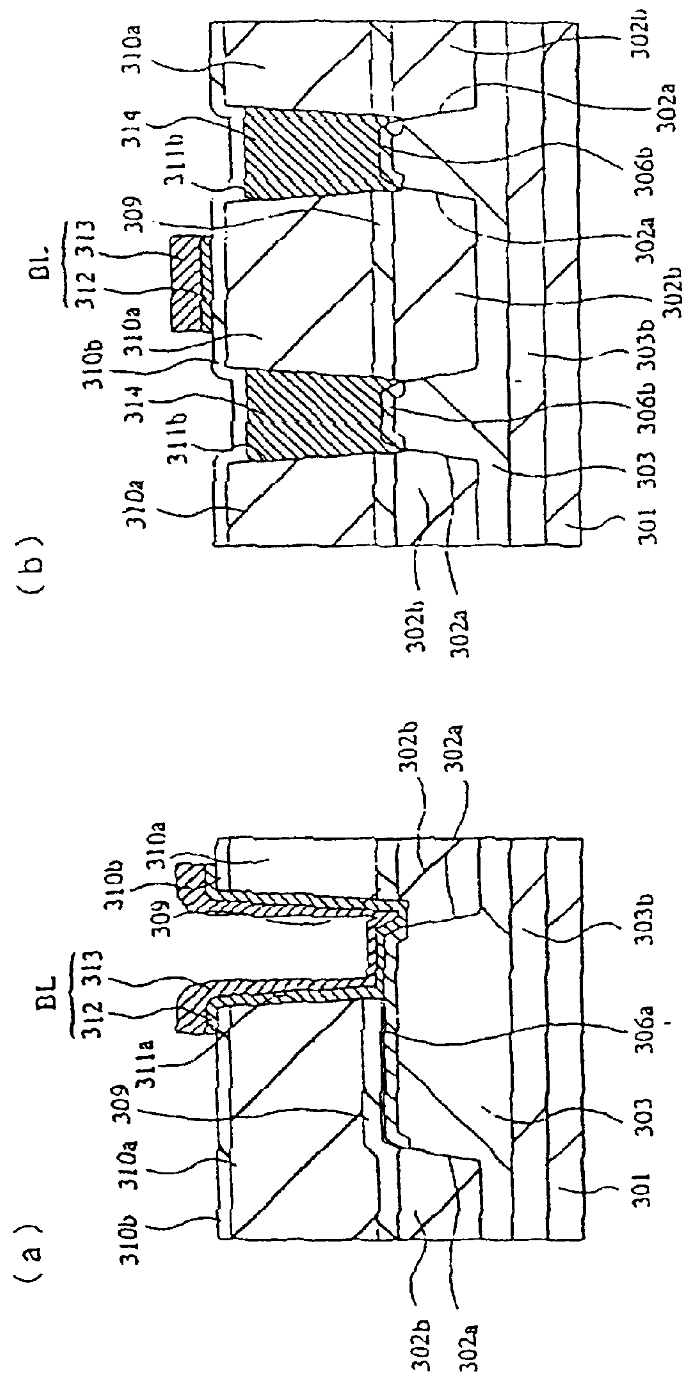

Next, as shown in FIGS. 70(*a*) and 71(*a*), a polycrystal silicon film 312 implanted with phosphorus and a WSi2 film 313 are deposited sequentially using the CVD method, and then the film is patterned to form bit lines BL. The bit lines BL are connected to one n-type semiconductor area 306*a* of the memory cell selecting MISFET Qt. Just like the plug 314, the bottom of the polycrystal silicon film 312 is formed in the shallow area even in the area where the connecting holes 311*a* overlap the element isolating insulating film 302*b*. The reliability of the DRAM is thus improved.

Figure 72:
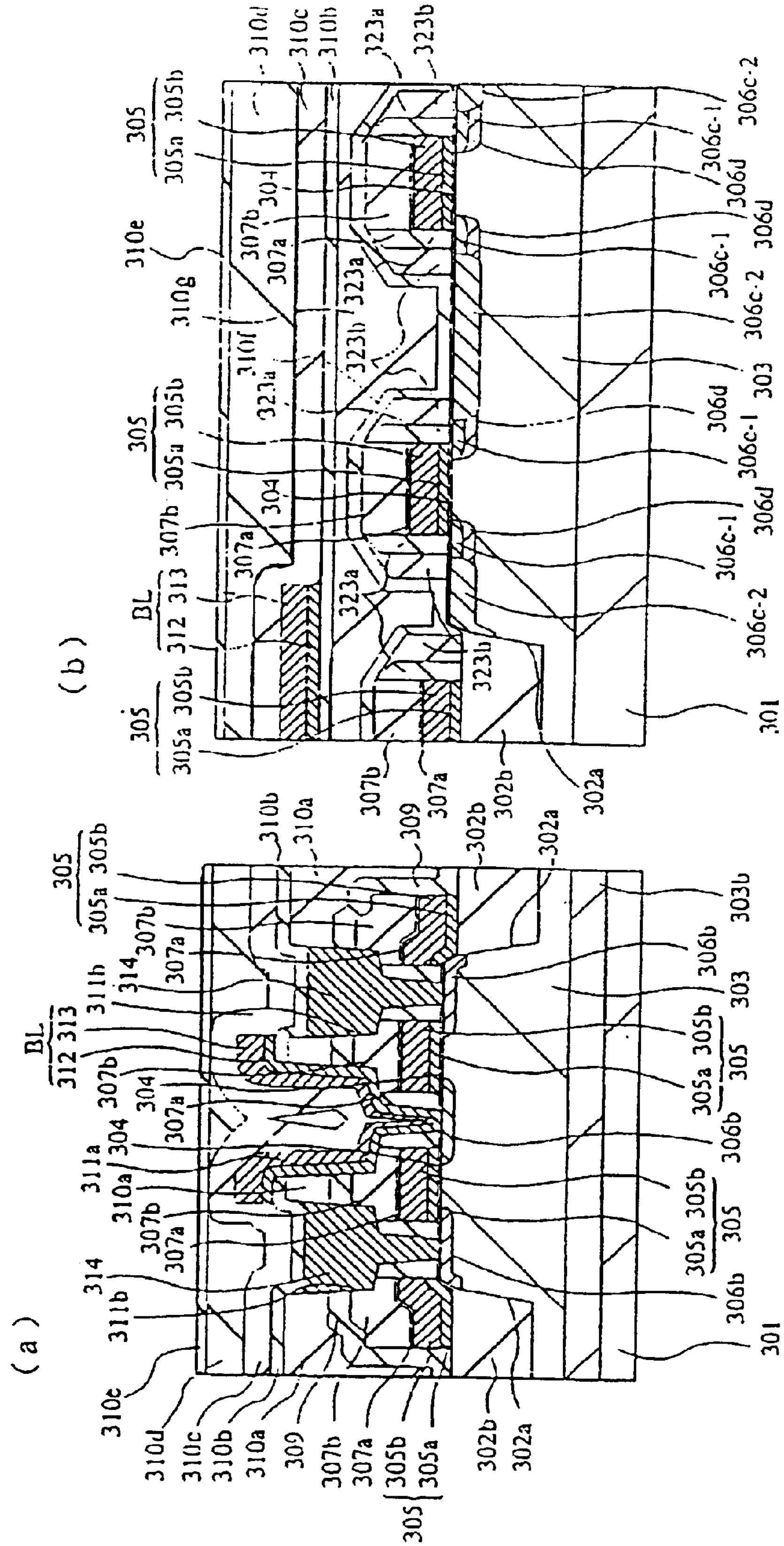

As shown in FIG. 72, on the semiconductor substrate 301 there is deposited an interlaminar insulating film 310*c* composed of a silicon oxide film and an interlaminar insulating film 310*d* using the CVD method, and then the surface of the interlaminar insulating film 310*d* is flattened using, for example, the CMP method. On the semiconductor substrate 3-1 there is formed an interlaminar insulating film 310*e* composed of a silicon nitride film.

Figure 73:
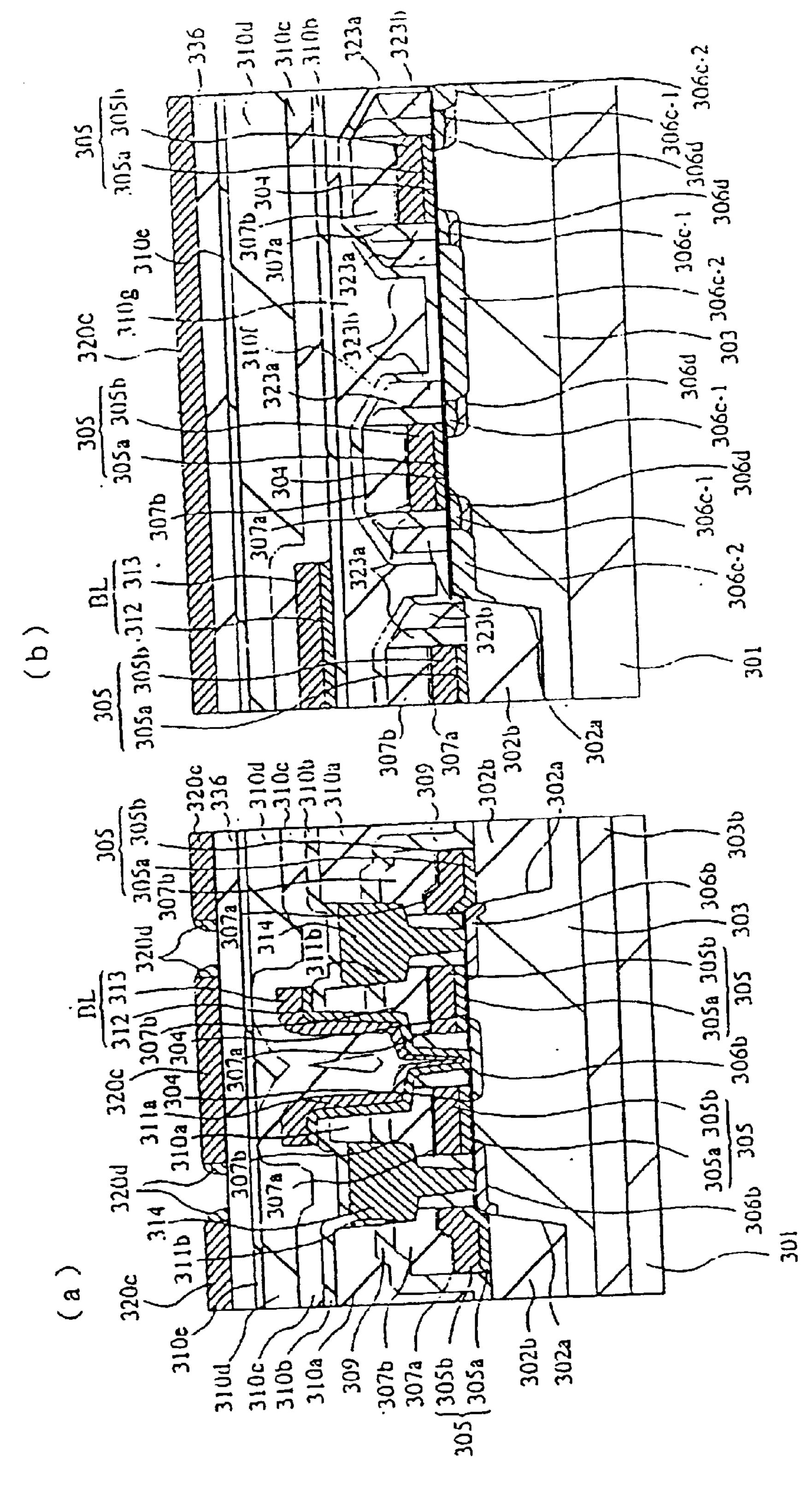

As shown in FIG. 73(*a*) and FIG. 73(*b*), a silicon oxide film 336 is deposited, and then a polycrystal silicon film 320*c* is deposited and patterned using a photo resist as a mask. Furthermore, a polycrystal silicon film (not illustrated) is deposited and anisotropic-etched to form side walls 320*d*. Since side walls 320*d* are formed in such a way, holes can be formed with a smaller diameter than those of the polycrystal silicon film 320*c* patterned with the minimum resolution of lithography.

Figure 74:
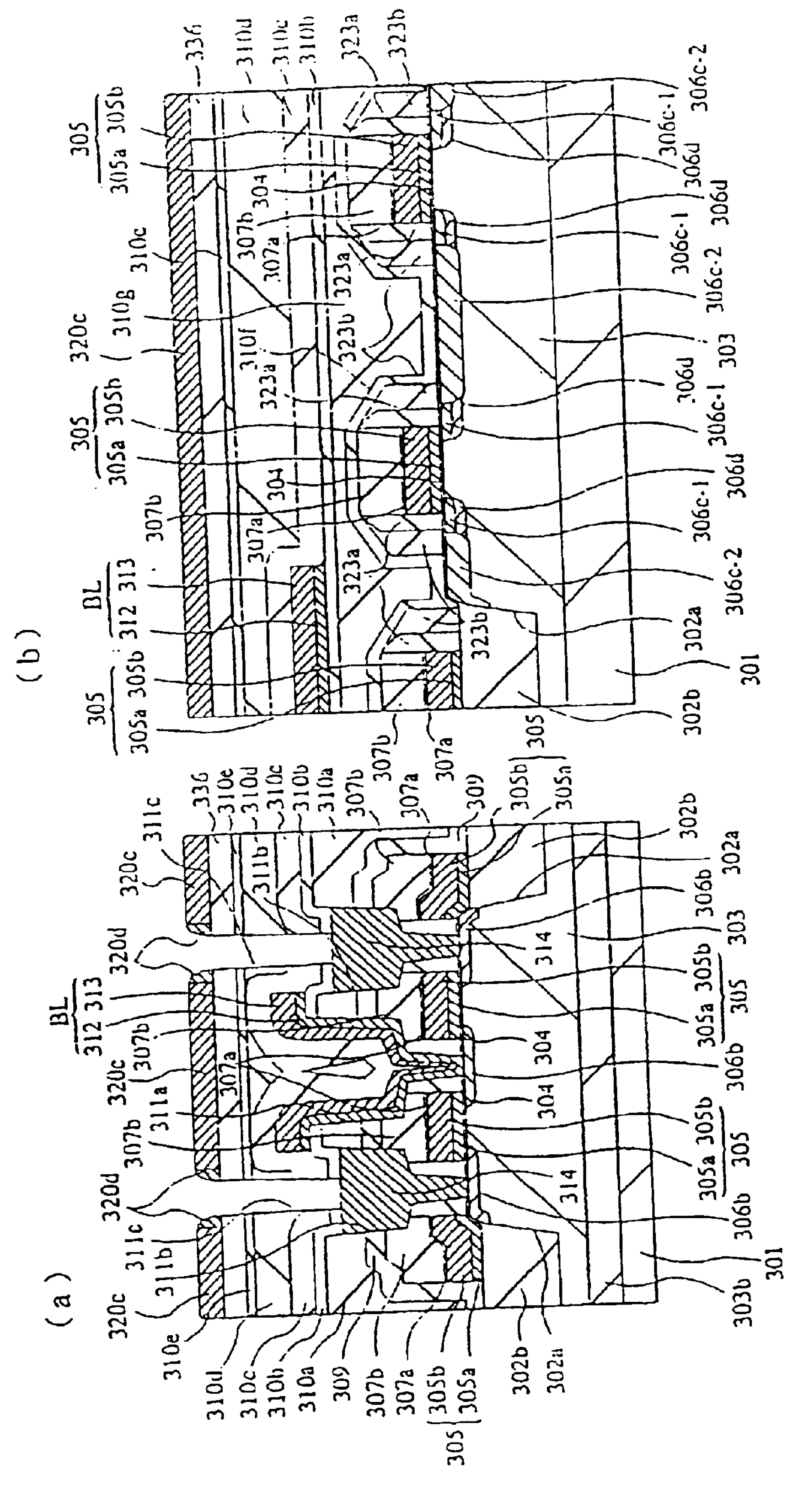

As shown in FIG. 74(*a*), connecting holes 311*c*, masked by the polycrystal silicon film 320*c*, and the side walls 320*d*, are opened.

Figure 75:
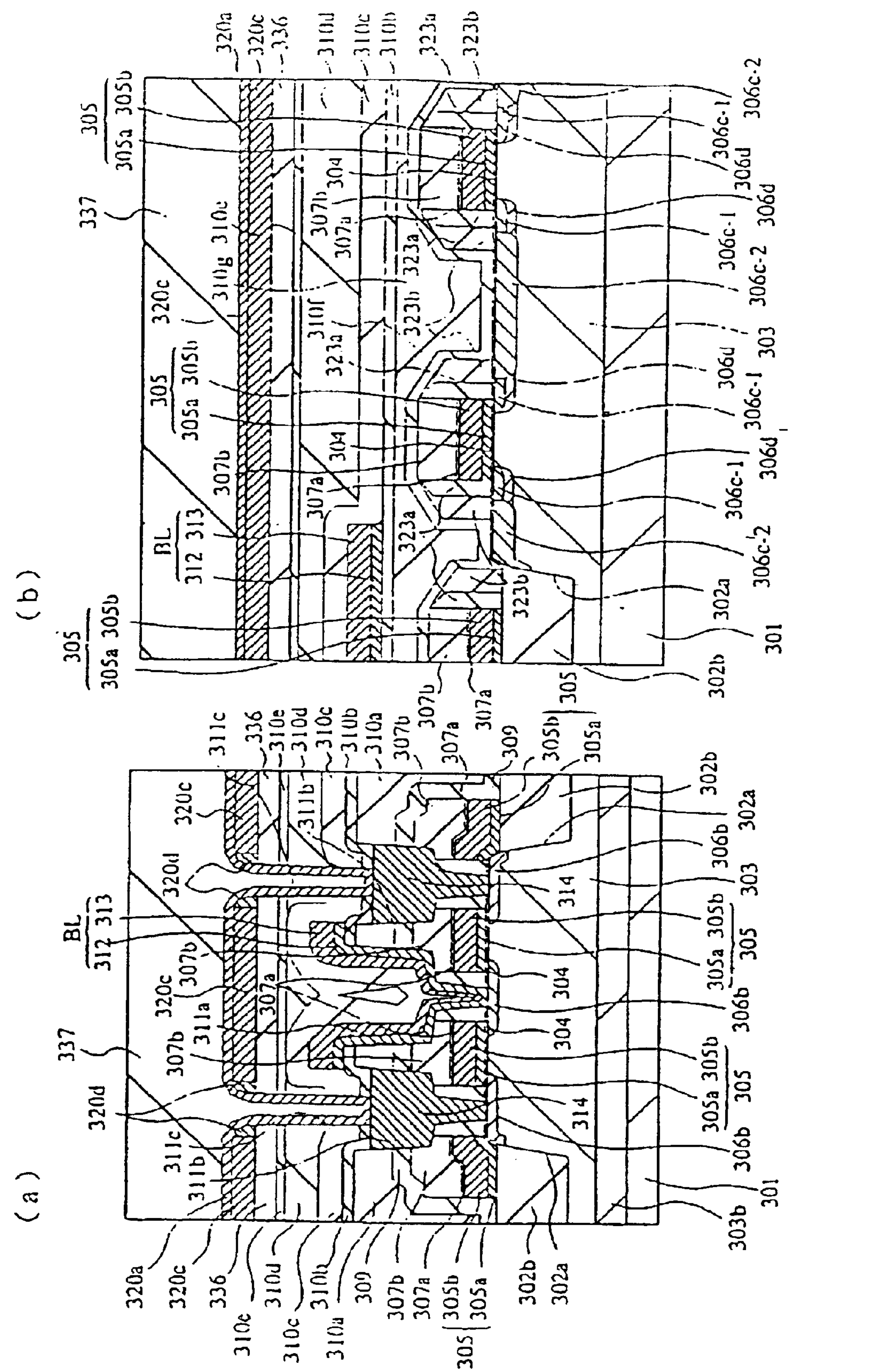

Then, as shown in FIG. 75(*a*) and FIG. 75(*b*), the first electrodes 320*a* implanted with phosphorus and a silicon oxide film 337 are deposited sequentially on the semiconductor substrate 301. Each of the first electrodes 320*a* is deposited in a connecting hole 311*c* and connected to a plug 314.

Figure 76:
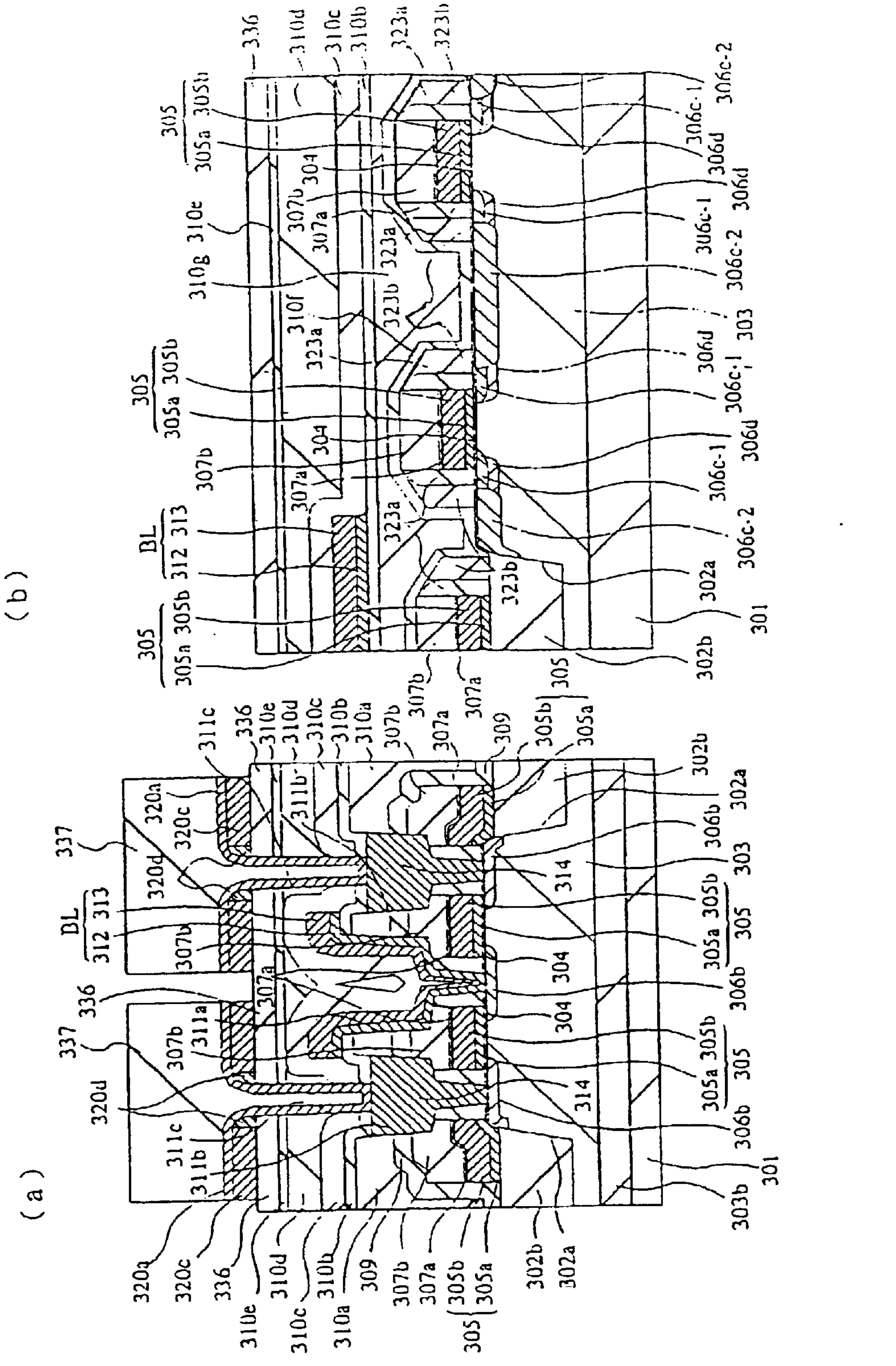

As shown in FIG. 76(*a*) and FIG. 76(*b*), the silicon oxide film 337 masked by photo resist is etched, and then the first electrodes 320*a* and the polycrystal silicon film 320*c* are etched sequentially. The treated first electrodes 320*a* and the polycrystal silicon film 320*c* are used as part of the storage capacity element for storing information in the memory cell area.

Figure 77:
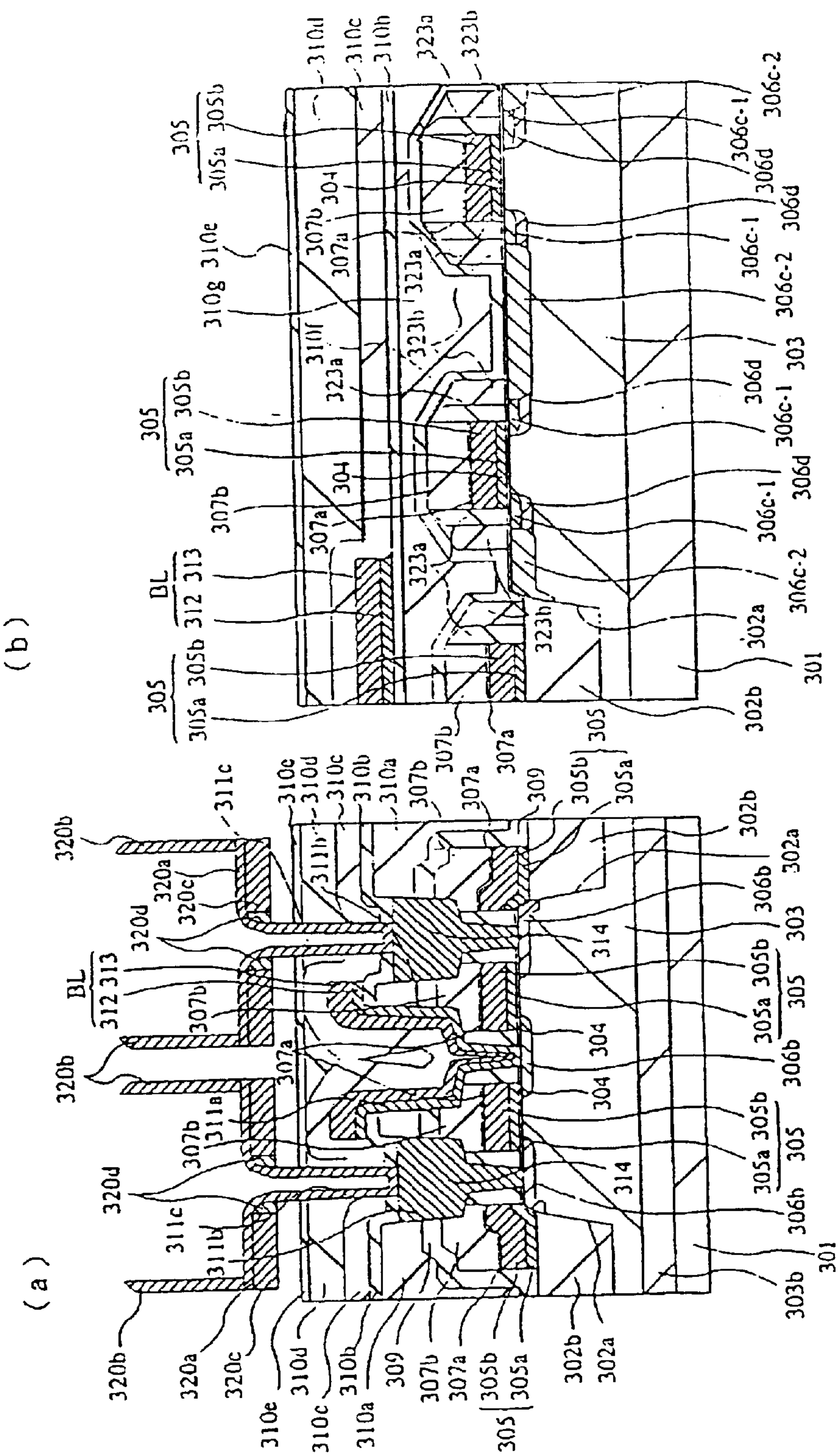

Next, the photo resist is removed, as shown in FIG. 77(*b*), and a polycrystal silicon film (not illustrated) is deposited on the semiconductor substrate 301 using the CVD method. Then, anisotropic etching is performed for the polycrystal silicon film to form the second electrodes 320*b*. Furthermore, the silicon oxide films 336 and 337 are removed by wet etching using, for example, an acid fluoride solution to form the first electrodes 320*a*, the second electrodes 320*b*, and the crown-like capacitor electrodes 320 composed of a polycrystal silicon film 320*c* and side walls 320*d*.

Figure 78:
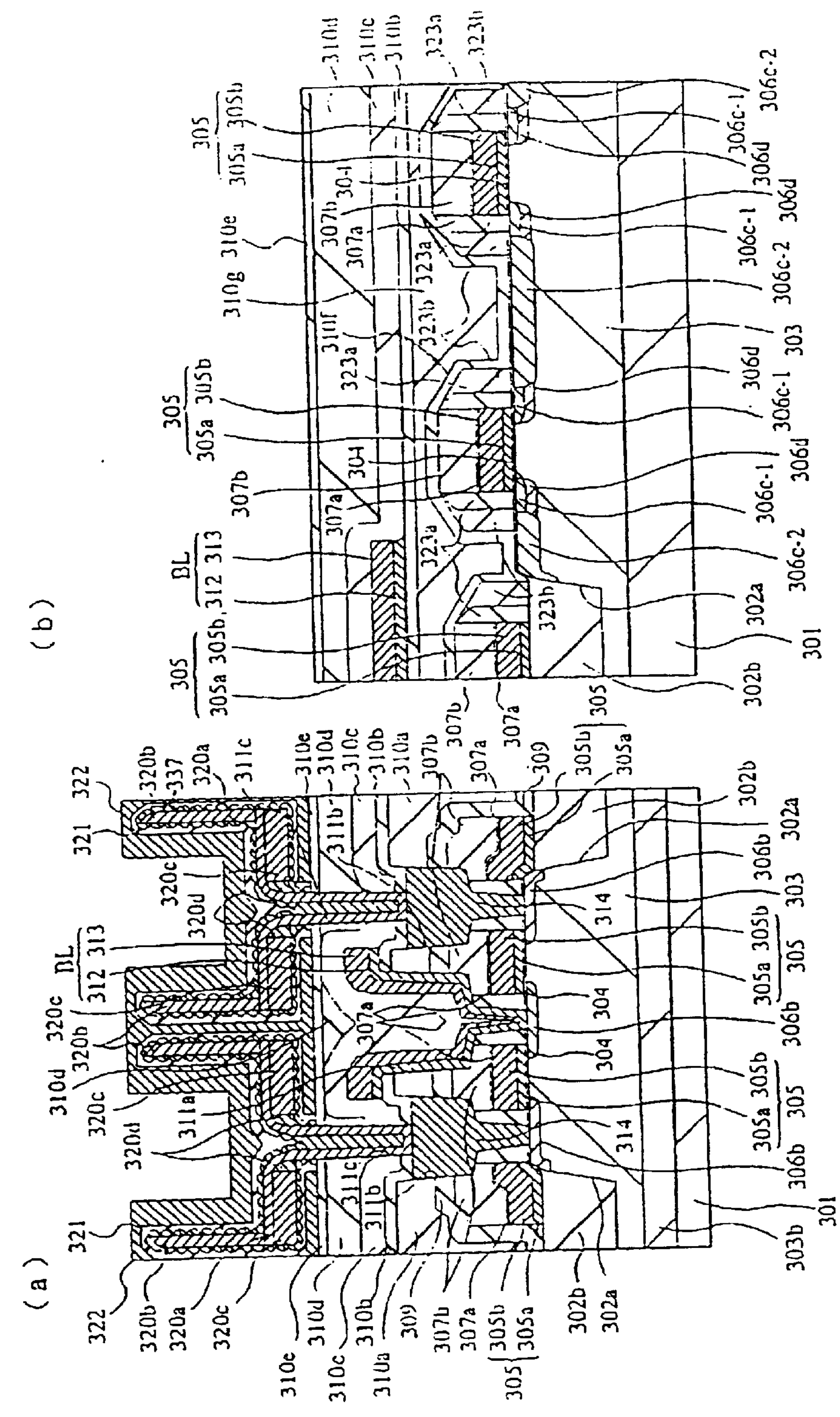

As shown in FIG. 78(*a*), polycrystal silicon particles of about 40 nm in diameter are grown on each capacitor electrode 320, and then a silicon nitride film (not illustrated) is deposited on the semiconductor substrate 301 using the CVD method. An oxidation treatment is performed for the film to form a silicon oxide film on the surface of the silicon nitride film and form a capacitor insulating film 321 composed of a silicon oxide film and a silicon nitride film on the surfaces of the capacitor electrodes 320. Thereafter, on the semiconductor substrate 301 there is deposited a polycrystal silicon film (not illustrated) using the CVD method and this polycrystal silicon film is masked with a photo resist and etched to form plate electrodes 322.

Figure 79:
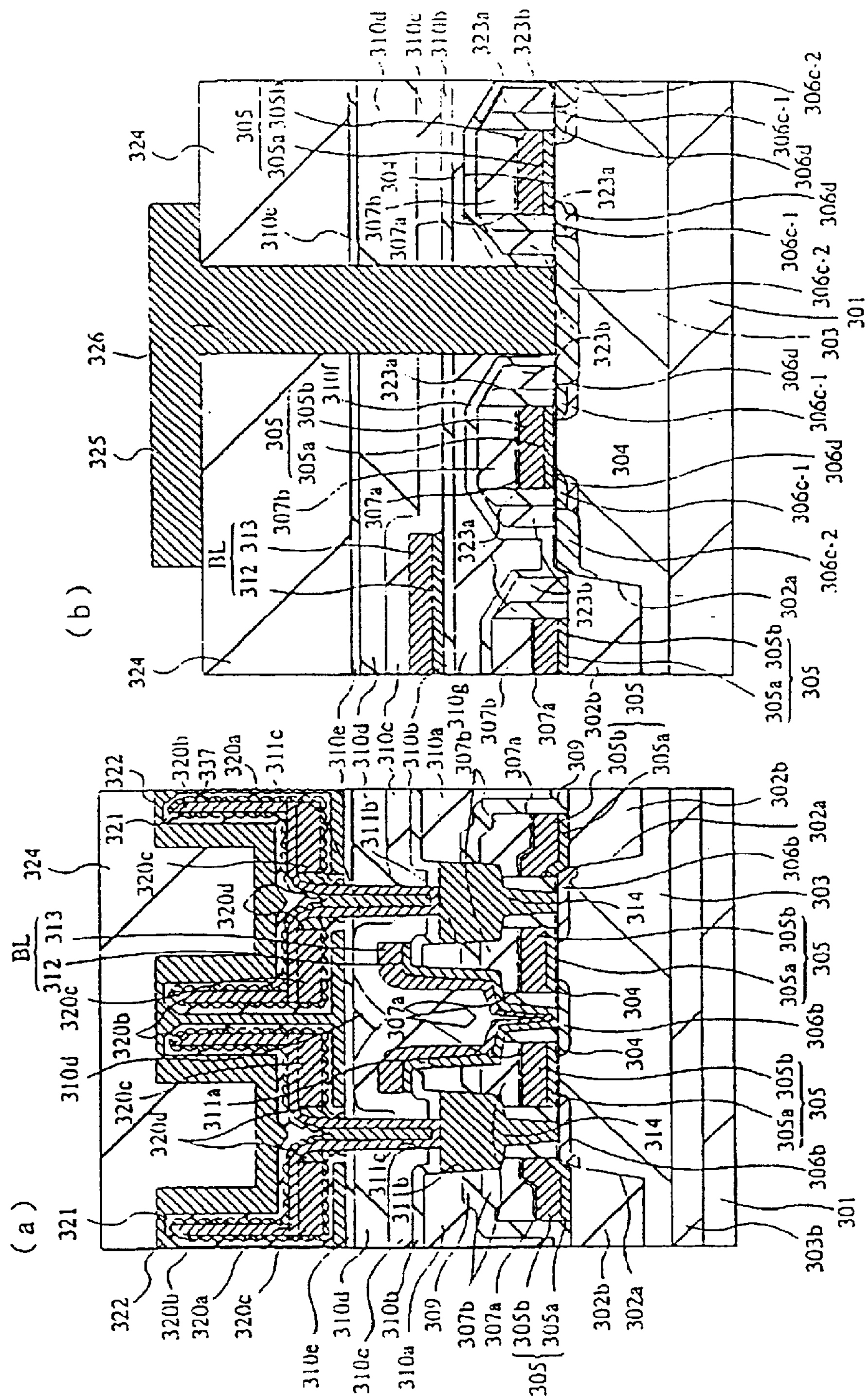

As shown in FIG. 79(*a*) and 79(*b*), a BPSG film is deposited and annealed to form an interlaminar insulating film 324. Then, the interlaminar insulating film 324 is masked with a photo resist and etched to open connecting holes 326. When the holes 326 are opened, the first side walls 323*a* can be used to open the connecting holes 326 in a self-matching manner with respect to the gate electrodes 305 in the peripheral circuit area. Furthermore, titan, titan nitride, aluminum, and titan are deposited sequentially and patterned to form the first wiring layer 325. On an inner surface of each connecting hole 326 there may also be deposited titan to form a tungsten film using the CVD method, then the tungsten film is etched back to form a tungsten plug. The spattering method can be used for depositing titan nitride, aluminum, and titan.

Finally, a TEOS silicon oxide film is deposited using the plasma CVD method, and then an SOG film is coated on the film and a TEOS silicon oxide film is deposited on the film using the plasma CVD method to form an interlaminar insulating film 327. Just like the first wiring layer, connecting holes 329, the second wiring layer 328, the interlaminar insulating film 330, connecting holes 332, and the third wiring layer 331 are formed. Then, a TEOS silicon oxide film and a silicon nitride film are deposited on the surface using the plasma CVD method to form a passivation film 333. Thus, the manufacturing of the DRAM shown in FIG. 50(*a*) and FIG. 50(*b*) is almost finished.

According to the DRAM in this sixth embodiment, since the insulating film for self-matching treatment 309 is used to open the connecting holes 311*a* and 311*b* by two-stage etching, plugs 314 and bit lines BL can be formed in a self-matching manner with respect to gate electrodes 305, and the element isolating insulating film 302*b* is prevented from over-etching as well. The refreshing characteristics of the DRAM can thus be improved. In addition, no side wall is formed on the side surfaces of each gate electrode 305 in the memory cell area, so that this sixth embodiment can also cope with higher integration of the DRAM.

In addition, the insulating film for self-matching treatment 309 is provided with two functions for forming self-matching contacts with respect to the gate electrodes 305 and for preventing the element isolating insulating film 302*b* from over-etching, so that there is no need to form a member for realizing each of the functions specially. The number of processes can be reduced, thereby suppressing an increase in the number of processes.

In this sixth embodiment, plugs 314 are used. However, no plug 314 need be used, since the capacitor electrodes 320 may be connected to the n-type semiconductor area 306*b* directly via connecting holes 311*b*. In this case, connecting holes 311*b* are formed deeply, the etching margin becomes small and treatment of those holes becomes difficult. When the two-stage etching in this sixth embodiment is used, however, the etching margin is increased and it becomes possible to cope with opening of the connecting holes. In other words, when no plug 314 is used, the effect of the present invention becomes more clear.

Needless to say, the two-stage etching described above may also be performed as continuous processes.

In FIG. 60(*b*), after a high density n-type semiconductor area 306*c*-2 of the n-type MISFET Qn is formed, the silicon nitride film 104 shown in the second embodiment is formed selectively in the peripheral circuit area, and then the TEOS silicon oxide film shown in FIG. 61(*b*) is deposited to form an interlaminar insulating film 310*f*. The subsequent processes can also be performed.

After a high density n-type semiconductor area 306*c*-2 of the n-type MISFET Qn is formed as shown in FIG. 60(*b*), the third embodiment can be obtained.

In other words, after a high density n-type semiconductor area 306*c*-2 of the n-type MISFET Qn is formed, high melting-point metals such as molybdenum and cobalt are deposited in the peripheral circuit area to form a silicide layer on the surface of the high density n-type semiconductor area 306*c*-2 of the n-type MISFET Qn for peripheral circuits. Thereafter, non-reacted high melting-point metals are removed and a TEOS silicon film shown in FIG. 61(*b*) is deposited to form an interlaminar insulating film 310*f*. The subsequent processes can also be performed.

The above examples can also be applied in the case of the seventh and eighth embodiments.

(7th Embodiment)

Figure 80:
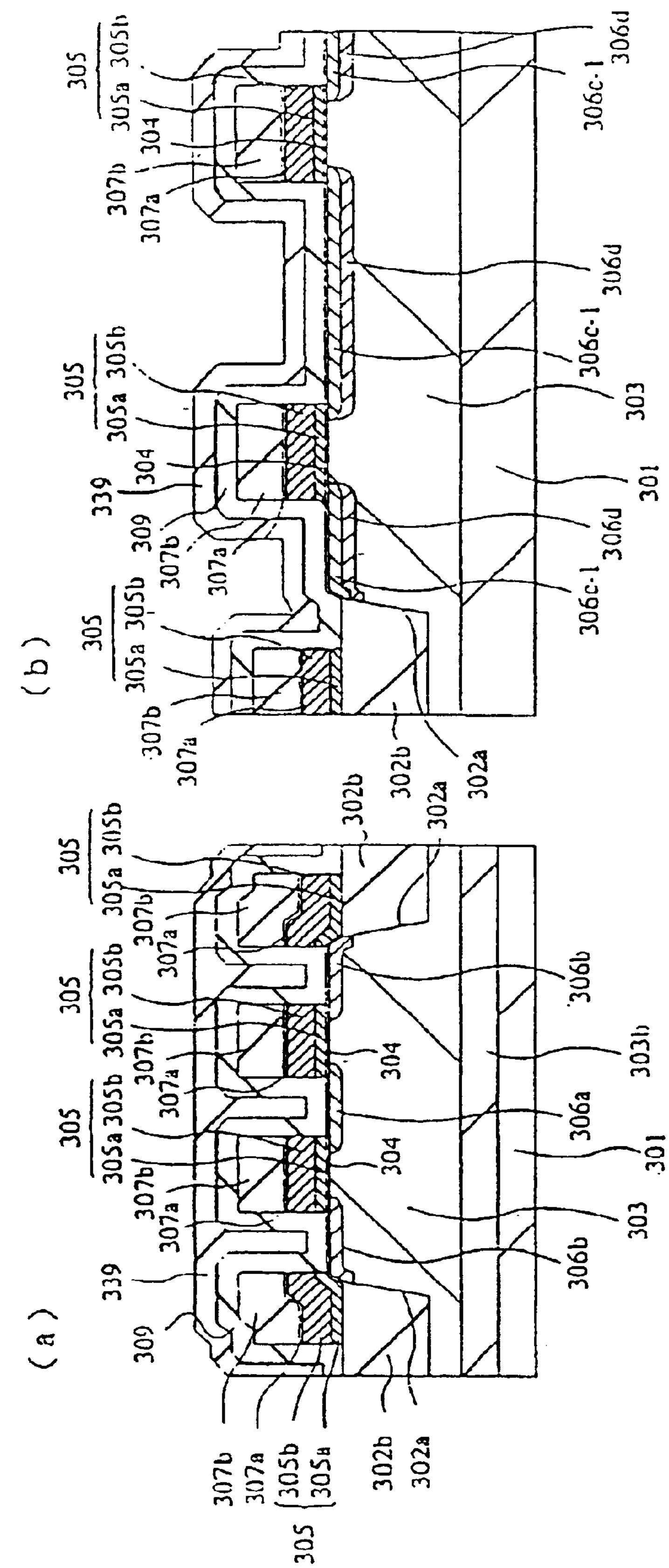
FIGS. 80 and 81 are cross sectional views showing a method of manufacturing a DRAM representing a seventh embodiment of the present invention.
Figure 81:
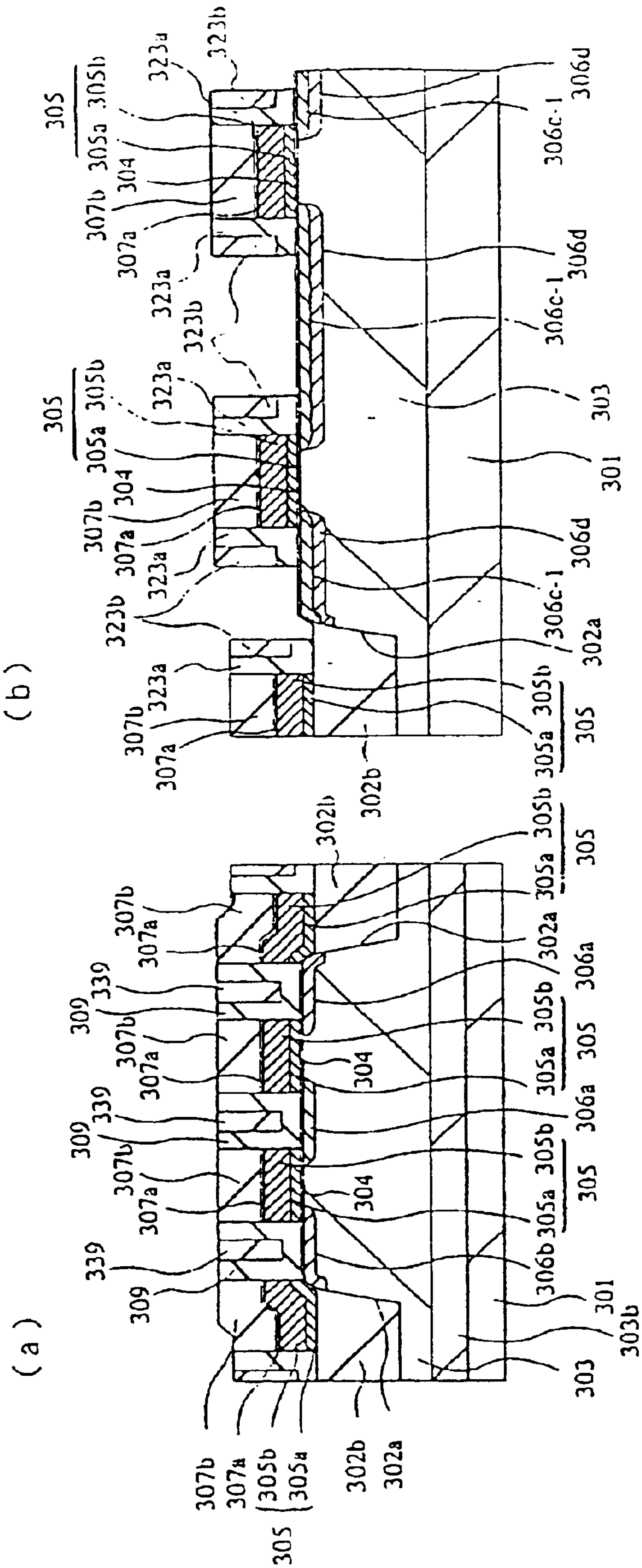

FIGS. 80(*a*), 80(*b*) and FIGS. 81(*a*), 81(*b*) are cross sectional views indicating a method of manufacturing the DRAM according to another embodiment of the present invention.

The method of manufacturing the DRAM in this seventh embodiment involves the same process as that in the sixth embodiment up to the forming of the gate electrodes 305 and the cap insulating film 307*b* (FIG. 57(*a*) and FIG. 57(*b*)). The explanation will thus be omitted here, avoiding a redundant explanation.

The method of manufacturing the DRAM in this seventh embodiment indicates a case where the gate electrodes 305 in the memory array area are disposed finely and the insulating film 309 for self-matching treatment is removed from the peripheral circuit area without using any mask.

After the gate electrodes 305 and the cap insulating film 307*b* are formed, a silicon nitride film to be used as an insulating film for self-matching treatment 309 is deposited as shown in FIG. 80(*b*), and then a silicon oxide film 339 is deposited on the film 309. In the memory array area, since the gate electrodes 305 are disposed finely as shown in FIG. 80(*a*), the recesses of the silicon oxide film 339 are filled completely, so that the surface is flattened. On the other hand, the gate electrodes 305 are formed more thinly in the peripheral circuit area as shown in FIG. 80(*b*) than in the memory array area, so an unevenness of those electrodes 305 will appear almost faithfully on the surface of the film 339.

As shown in FIG. 81(*a*), the silicon nitride film 309 and the silicon oxide film 339 are etched by anisotropic etching. This etching is performed under conditions which make it easy to etch silicon nitride films using, for example, a mixed gas of $CHF_3$, $CF_4$ and argon. In the memory array area, since the surface of the silicon oxide film 339 is flat, only the silicon nitride film 309 is etched both on the flat surface of the silicon oxide film 339 and on the surface of the silicon nitride film 307*b*. Consequently, in the memory array area, the silicon nitride film 309 is left on the main surface of the semiconductor substrate 301 and the film 309 functions as an insulating film 309 for self-matching treatment. On the other hand, in the peripheral circuit area, the silicon nitride film 309 and the silicon oxide film 330 on the main surface of the semiconductor substrate 301 and the surface of the cap insulating film 307*b* except for the side surfaces of the gate electrodes 305 are etched. The silicon nitride film 309 and the silicon oxide film 330 are left only as the first side walls 323*a* and the second side walls 323*b* of the gate electrodes 305.

According to the method of manufacturing the DRAM in this seventh embodiment, the insulating film for self-matching treatment 309 is formed in the memory array area and at the same time the first and second side walls 323*a* and 323*b* can be formed on the side surfaces of each gate electrode in the peripheral circuit area even without using photo masks, etc. Thus, the process can be simplified.

Hereafter, the processes are the same as those shown in FIG. 60(*a*) and subsequent process for in the sixth embodiment. The explanation will thus be omitted here, avoiding redundant explanation.

(8th Embodiment)

Figure 82:
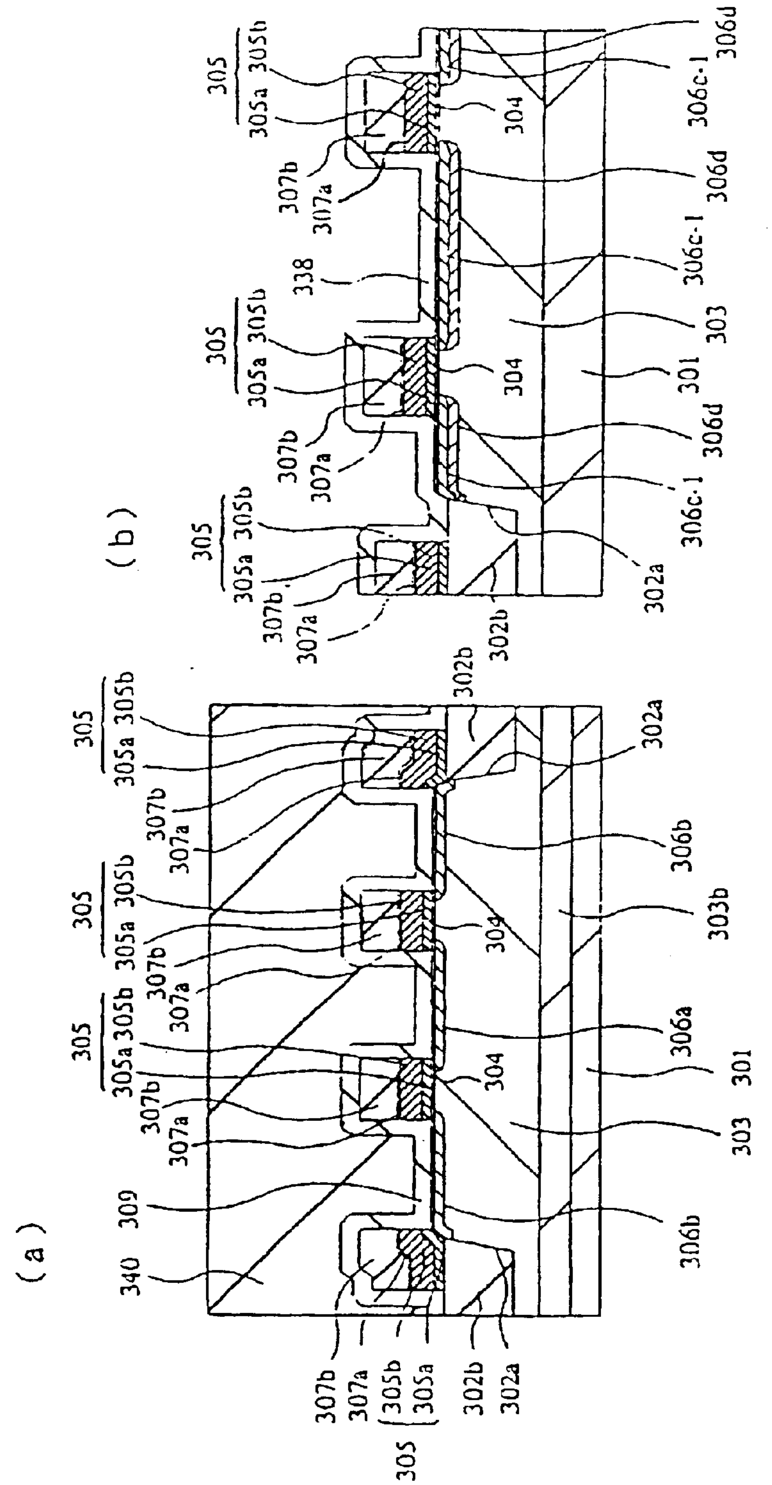
FIGS. 82 to 84 are cross sectional views showing a method of manufacturing a DRAM representing an eighth embodiment of the present invention.

FIGS. 82(*a*) to 84(*b*) are cross sectional views indicating a method of manufacturing the DRAM according to another embodiment of the present invention.

The manufacturing method according to this eighth embodiment is the same as that in the sixth embodiment up to forming of the gate electrodes 305 and the cap insulating film 307 (FIG. 57(*a*) and FIG. 57(*b*)). The explanation for the same processes will thus be omitted here.

The manufacturing method according to this eighth embodiment represents a case where the gate electrodes 305 are disposed thinly in the memory array area and a mask is used to remove the insulating film for self-matching treatment 309 in the peripheral circuit area.

After the gate electrodes 305 and the cap insulating film 307*b* are formed, a silicon nitride film to be used as an insulating film for self-matching treatment 309 is deposited to form a photo mask 340 in the memory array area.

Figure 83:
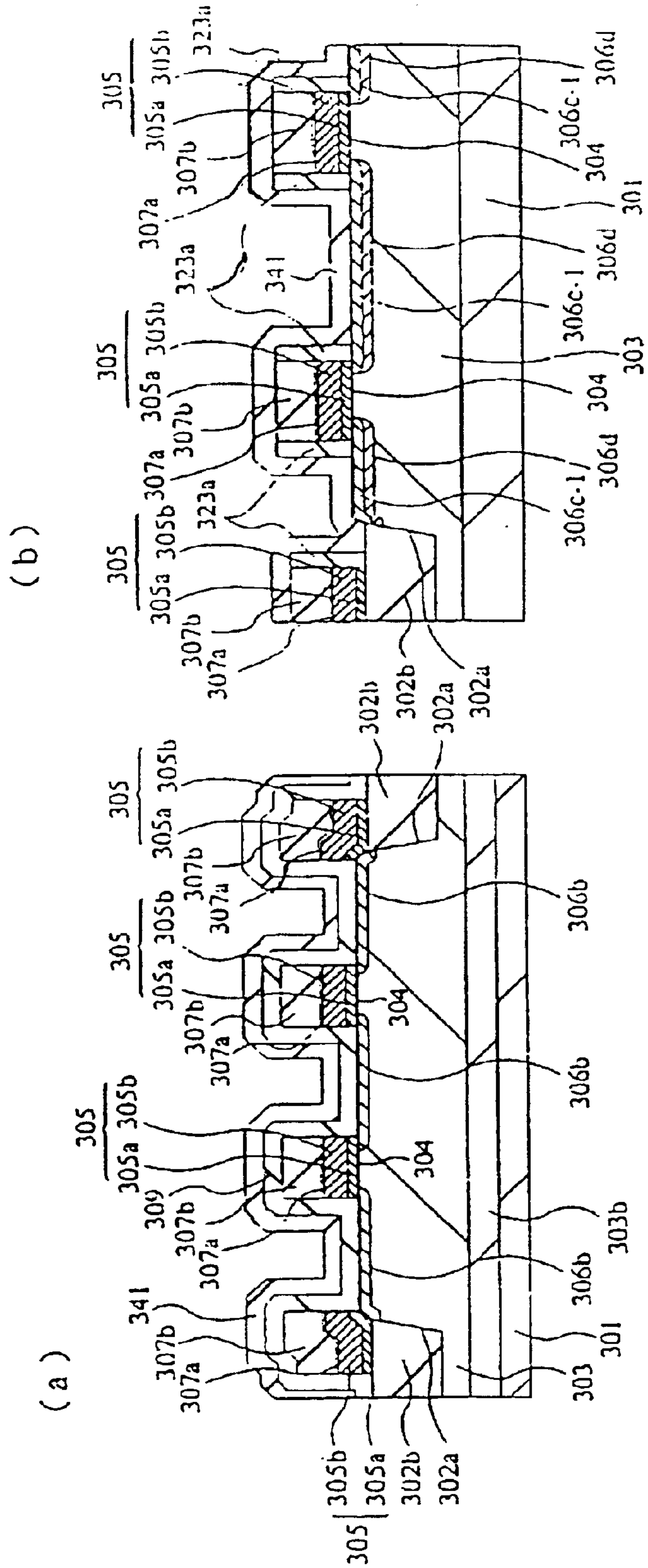

Then, as shown in FIG. 83(*a*) and FIG. 83(*b*), the insulating film for self-matching treatment 309 masked by the photo mask 340 is etched by anisotropic etching. This etching is performed under conditions which make it easy to etch the silicon nitride film using a mixed gas of, for example, $CHF_3$, $CF_4$, and argon Consequently, the first side walls 323*a* are formed on side surfaces of each gate electrode 305 in the peripheral circuit area.

Furthermore, the photo mask 340 is removed, and then a silicon oxide film 341 is deposited all over the surface of the semiconductor substrate 301.

Figure 84:
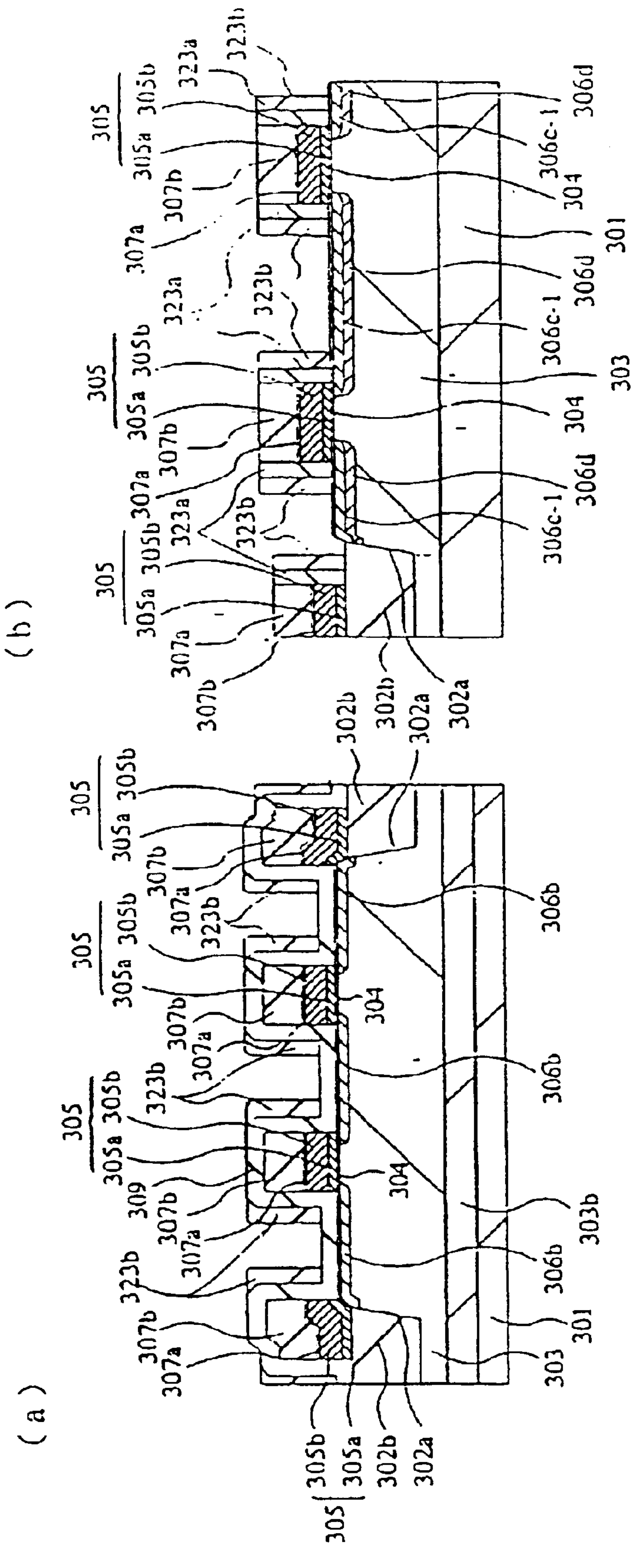

As shown in FIG. 84, the silicon oxide film 341 may be etched by anisotropic etching on conditions to make it difficult to etch silicon nitride films using, for example, a mixed gas of $C_4F_8$ and argon. Consequently, the second side walls 323*b* are formed on side surfaces of the gate electrodes 305 not only in the peripheral circuit area, but also in the memory cell array area.

According to this manufacturing method, the insulating film for self-matching treatment 309 is removed from the peripheral circuit area and the second side walls 323*b* can be formed on side surfaces of the gate electrodes 305. And, as described in the sixth embodiment, the thickness of the second side walls 323*b* can be adjusted to optimize the LDD structure.

The subsequent processes are the same as those shown in FIG. 60(*a*) and subsequent processes for the sixth embodiment, and thus, explanation for those processes will be omitted here, avoiding redundant explanation.

The invention is as described above with reference to various embodiments, but the present invention is not limited only to those embodiments. Needless to say, the embodiments may be varied freely as long as the substance of the present invention is not exceeded.

For example, although the element isolating area is provided in the shallow groove element isolating area in the sixth to eighth embodiments, the element isolating area may be composed of a thick field insulating film formed by the LOCOS method. In the present invention, since the shallow groove of the shallow groove element isolating area is formed more sharply than a bird's beak of the field insulating film, the present invention, when applied to a shallow element isolating area that will be affected significantly even by a slight deviation from connecting holes, can obtain more remarkable effects. And, the same effect can also be obtained when the present invention is applied to an element isolating area formed with a field insulating film, of course.

The present invention also includes the following features.

(1) The semiconductor integrated circuit of the present invention comprises a semiconductor substrate having an element isolating area and active areas surrounded by the element isolating area respectively on its main surface; a gate insulating film formed on the main surface; gate electrodes formed on the gate insulating film; a cap insulating film formed on the gate electrodes; a MISFET including a semiconductor area formed in both active areas on both sides of the gate electrodes; and an interlaminar insulating film insulating the MISFET and a conductive member formed in the upper layer of the MISFET, wherein an insulating film for self-matching treatment having an etching selection ratio for interlaminar insulating films is formed on the main surface of the semiconductor substrate including the top and side surfaces of the cap insulating film in all or part of the MISFET areas, as well as side surfaces of the gate electrodes, and the insulating film for self-matching treatment is used to open the holes for connecting the conductive member to the semiconductor area in a self-matching manner with respect to the gate electrodes and to prevent the bottom of each connecting hole going into the element isolating area off the active area from over-etching.

According to the semiconductor integrated circuitry, since the insulating film for self-matching treatment is formed on side surfaces of the gate electrodes and on the main surface of the semiconductor substrate so as to be used as side walls of the gate electrodes to open the connecting holes in a self-matching manner and as a stopper film to prevent the element isolating area on the semiconductor substrate from over-etching, the gate electrodes can be disposed at fine intervals to improve the integration degree of the circuitry and especially to secure a sufficient connecting area at the bottom of each connecting hole even in every MISFET in the highly integrated DRAM memory mat area. As a result, even in a highly integrated semiconductor integrated circuitry, self-matching contact technologies and over-etching preventive technologies for the element isolating area can be used together to improve the integration degree and reliability of the semiconductor integrated circuitry.

(2) In the semiconductor integrated circuitry, the insulating film for self-matching treatment can be formed adjacent to the side surfaces of the cap insulating film and the gate electrodes or via a thinner film than the insulating film for self-matching treatment. In addition, there is no need to form any side wall among the insulating film for self-matching treatment, the side surfaces of the cap insulating film, and the gate electrodes. This is because the insulating film for self-matching treatment can be used as the side walls of each gate electrode. Consequently, the margin for opening each connecting hole can be increased and the process can be simplified to minimize an increase of processes.

(3) In addition, the insulating film for self-matching treatment may be a silicon nitride film and each interlaminar insulating film may be a silicon oxide film. And, since the silicon nitride film and the silicon oxide film used frequently in the manufacturing processes of conventional semiconductor integrated circuits, the solid state properties of those films are well known. It is thus possible to design processes and select conditions using existing established manufacturing processes to start up production processes speedily.

(4) In addition, the element isolating area can be formed in the shallow groove element isolating area structured to isolate each element from others in a shallow groove or in the element isolating area having a thick field insulating film formed with the selective oxidation method. Especially, in the case of the shallow groove element isolating area, the area is formed to rise sharply at a boundary between an active area and the element isolating area, so an over-etched portion formed in the element isolating area due to a slight deviation during the formation of connecting holes is deepened more than the thick field insulating film, so that the over-etching problem caused by such a deviation described above arises remarkably. When the present invention is applied to a semiconductor integrated circuit having a shallow groove element isolating area to prevent the element isolating area from over-etching, therefore, the effect appears more remarkably.

(5) In addition, the semiconductor integrated circuit of the present invention includes a DRAM memory mat area and the insulating film for self-matching treatment is formed only in the DRAM memory mat area. In other words, the insulating film for self-matching treatment is formed only in the memory mat area that must be highly integrated to assure high integration and high reliability thereof And, the insulating film for self-matching treatment is not formed in other areas, including the peripheral circuit area, which are not needed to be highly integrated so much.

According to the present invention, since a high integration and a high reliability are assured in the memory mat area, and no insulation film for self-matching treatment is formed in other areas including the peripheral circuit area, the process for forming holes connecting a wiring layer formed together with the gate electrodes to the upper layer of the wiring layer or the process for forming holes connecting the MISFET semiconductor area in the peripheral circuit area to the upper layer of the semiconductor area can be simplified. In other words, when an insulating film for self-matching treatment is also formed in the peripheral circuit area, a two-stage etching process is needed for etching the insulating film for self-matching treatment when the holes connecting the semiconductor area to the upper layer, as well as the cap insulating film formed on top of the gate electrodes and the insulating film for self-matching treatment must also be etched when the holes connecting the wiring layer formed together with the gate electrodes to the upper layer are formed, resulting in a complicated process In accordance the present invention, however, since no insulating film for self-matching treatment is formed in the peripheral circuit area, the process is not complicated.

(6) In addition, the semiconductor integrated circuit of the present invention includes a DRAM memory mat area, and on side surfaces of each MISFET gate electrode formed in areas other than the memory mat area there are formed side walls via an insulating film deposited in the same process as that of the insulating film for self-matching treatment or in contact with the side surfaces of the insulation film.

According to the present invention, the LDD (Lightly Doped Drain) of each MISFET formed in areas other than the memory mat area can be optimized to shorten the channel of the MISFET in areas other than the memory mat area and improve the performance.

The method of manufacturing the semiconductor integrated circuit of the present invention includes (a) a process for forming an element isolating area on the main surface of a semiconductor substrate; (b) a process for depositing a silicon oxide film, serving as a gate insulating film, a conductor film composed mainly with a polycrystal silicon film, serving as gate electrodes, and a silicon nitride film, serving as a cap insulating film sequentially to form a laminated film composed of those films all over the surface of the semiconductor substrate, then patterning the laminated film to form a gate insulating film, gate electrodes, and a cap insulating film; (c) a process for forming a semiconductor area in an active area on the main surface of the semiconductor substrate, surrounded by the element isolating area by implanting impurities using the gate electrodes as a mask; (d) a process for depositing an insulating film for self-matching treatment all over the surface of the semiconductor substrate; (e) a first etching process for depositing an interlaminar insulating film all over the surface of the semiconductor substrate on which the insulating film for self-matching treatment is formed; (f) a process for etching the interlaminar insulating film under conditions which make the etching of the insulating film for self-matching treatment slower than the etching of the interlaminar insulating film selectively, and open part of the connecting holes in a self-matching manner with respect to the gate electrodes; and (g) a second etching process for performing anisotropic etching for the insulating film for self-matching treatment at the bottom of each connecting hole.

According to the method of manufacturing the semiconductor integrated circuit, since the insulating film for self-matching treatment is deposited without forming side walls after the gate electrodes and the cap insulating film are formed, a sufficient contact margin between gate electrodes can be obtained. As a result, the reliability of the semiconductor integrated circuitry in connecting the member formed in each connecting hole to the semiconductor area formed in an active area can be improved significantly.

In addition, since connecting holes are opened in two stages (the first and second etching processes), the connecting holes can be opened in a self-matching manner with respect to the gate electrodes, and the element isolating area going into the bottom of each connecting hole can be prevented from over-etching as well. Consequently, the integration of the semiconductor integrated circuitry is improved and the characteristics of the MISFET of the semiconductor integrated circuitry is improved to improve the reliability. The first and second etching processes in the two-stage etching can be continued processes, of course.

(8) In addition, in order to form the element isolating area in the process (a), any of a first configuration in which a shallow groove is formed, then the shallow groove is covered by a silicon oxide film and the surface is polished by etching-back or by the CMP method to leave the silicon oxide film only in the shallow groove, or a second configuration in which a thick field insulating film formed with the thermal oxidation method selectively using a patterned silicon nitride film as a mask, can be taken. According to the manufacturing method of the present invention, it is possible to easily manufacture a semiconductor integrated circuit having a shallow groove element isolating area or a thick field insulating film formed by the LOCOS method.

(9) In addition, in the method of manufacturing the semiconductor integrated circuitry of the present invention, the insulating film for self-matching treatment may be a silicon nitride film and the interlaminar insulating film may be a silicon oxide film. The etching in the first etching process may be plasma etching using a mixed gas Of $C_4F_8$ and argon and the etching in the second etching process may be plasma etching using a mixed gas of $CHF_3$, $CF_4$, and argon.

According to the manufacturing method of the present invention, since plasma etching is performed using a mixed gas of $C_4F_8$ and argon in the first etching process, the silicon oxide film can be etched under conditions which make it difficult to etch silicon nitride films, that is, the silicon oxide film can be etched under conditions which can provide a sufficient etching selection ratio for silicon nitride films. In addition, the interlaminar insulating film in the connecting hole area can be etched with a sufficient treatment margin up to the insulating film for self-matching treatment formed on the main surface of the semiconductor substrate. The insulating film for self-matching treatment functions as a stopper film. In the second etching process, plasma etching can be performed using a mixed gas of $CHF_3$, $CF_4$, and argon, so the insulating film for self-matching treatment, composed of a silicon nitride film, can be etched easily. And, since only a comparatively thin silicon nitride film is etched in the second etching process, the connecting holes can be opened with a sufficient margin and accordingly, the element isolating area can be prevented from over-etching effectively as described above.

(10) The method of manufacturing the semiconductor integrated circuitry of the present invention applies over-etching in the second etching process so that the etching time is reduced in comparison to the time necessary for etching the total thickness of the insulating film for self-matching treatment.

Such over-etching is possible because the insulating film for self-matching treatment is used as a stopper film opening of the connecting holes by two-stage etching. And, because of the over-etching applied, connecting holes can be opened surely while active areas are etched slightly. The connecting reliability at the bottom of each hole can be improved. The etching depth in active areas is equal to the thickness of the insulating film for self-matching treatment or less, since the over-etching time is less than the time necessary for etching the total thickness of the insulating film for self-matching treatment. In addition, since the insulating film for self-matching treatment can be as thinned to 30 to 50 nm, the over-etching creates no problem from the etching process.

(11) The method of manufacturing the semiconductor integrated circuitry of the present invention allows the DRAM memory mat area to be included in the semiconductor integrated circuitry, and the method includes a process for forming side walls on side surfaces of the gate electrodes in areas other than the memory mat area and the cap insulating film with the insulating film for self-matching treatment disposed therebetween after the insulating film for self-matching treatment is deposited.

According to the manufacturing method of the present invention, a proper LDD structure can be formed in every MISFET other than in the memory mat area. As a result, the channel of every MISFET in areas other than the memory mat area, for example, the channel of the MISFET in the peripheral circuit area, can be shortened to improve the performance of the MISFET. And, since it is possible to generally take a margin for the interval between gate electrodes in the peripheral circuit area, side walls can be formed on side surfaces of each gate electrode in the MISFET in the peripheral circuit area even when the insulating film for self-matching treatment is formed there.

(12) In addition, the method of manufacturing the semiconductor integrated circuitry of the present invention allows the DRAM memory mat area to be included in the semiconductor integrated circuit, and the method includes a process for removing the insulating film for self-matching treatment at least on the main surface of the semiconductor substrate except for the memory mat area after the insulating film for self-matching treatment is deposited.

According to the manufacturing method of the present invention, since the method includes a process for removing the insulating film for self-matching treatment from the main surface of the semiconductor substrate except for at least the memory mat area, it is possible to remove, for example, the insulating film for self-matching treatment from the peripheral circuit area of the DRAM. Thus, it is possible to easily open the connecting holes connected to the MISFET semiconductor area or the gate electrodes in the peripheral circuit area.

(13) Side walls can be formed after the insulating film for self-matching treatment is deposited by etching the insulating film for self-matching treatment using the photo resist covering the memory mat area as a mask, and then by removing the photo resist, depositing an insulating film all over the semiconductor substrate and anisotropic etching the insulating film. The etching of the insulating film for self-matching treatment may be anisotropic etching leaving the insulating film for self-matching treatment on side surfaces of each gate electrode as side walls or isotropic etching not leaving the insulating film for self-matching treatment as side walls.

In addition, side walls can be formed after the insulating film for self-matching treatment is deposited by depositing an insulating film that covers uneven portions caused by the gate electrodes and the cap insulating film formed in the memory mat area on the insulating film and etching the insulating film by anisotropic etching. In such a case, since the insulating film fills each space between the gate electrodes in the memory mat area, the insulating film for self-matching treatment formed on the main surface of the semiconductor substrate, between the gate electrodes in the memory mat area, is not etched by the anisotropic etching performed later. On the other hand, the insulating film for self-matching treatment in areas other than the memory mat area, for example, in the peripheral circuit area, can be etched together with the insulating film used for forming side walls in the anisotropic etching, since it is possible to take a margin for the interval between gate electrodes in the peripheral circuit area. In other words, it is possible to omit the mask forming process for etching only the insulating film for self-matching treatment in the peripheral circuit area. The process can thus be simplified.

Of those features described above, the effects obtained by representative aspects of the invention can be summarized as follows.

(1) Connecting holes can be formed in a self-matching manner even in the highly integrated DRAM memory cell area, and the element isolating area at the bottom of each connecting hole can be prevented from over-etching as well.

(2) When connecting holes are formed in a self-matching manner and the element isolating area at the bottom of each connecting hole is prevented from over-etching, the treatment margin of the connecting holes can be improved.

(3) When connecting holes are formed in a self-matching manner and the element isolating area at the bottom of each connecting hole is prevented from over-etching, an increase in the number of processes can be suppressed.

(4) The integration degree of the semiconductor integrated circuitry is further improved, and the refreshing characteristics of the DRAM are improved to improve the transistor characteristics of the memory cell area as well.

According to the investigation of well-known examples carried out by the present inventor after the present invention was made, it was found that the technologies for forming connecting holes of one of the electrodes of a capacitor and forming bit line connecting holes in a self-matching manner with respect to word lines were disclosed in the public report of Unexamined Published Japanese Invention Application No. 4-342164.

The technology for providing a silicon nitride film to prevent the semiconductor substrate or the element isolating insulating film from over-etching during the opening of both connecting holes of a capacitor and connecting holes of bit lines of one of the electrodes with respect to an interlaminar insulating film is disclosed in the public reports of Unexamined Published Japanese Patent Application No. 8-264075 and No. 8-344906. In addition, the technology for providing a silicon nitride film when connecting holes are opened to a source or a drain with respect to an insulating film on an MOSFET is disclosed in the official report of Unexamined Published Japanese Patent Application No. 6-53162.

In addition, a method of manufacturing a semiconductor device having a double side wall film composed of a silicon nitride film and a silicon oxide film on side walls of each gate electrode is disclosed in the official reports of Unexamined Published Japanese Patent Application No. 3-276729 and No. 6-168955, as well as U.S. Pat. No. 5,364,804.

As described above, the semiconductor integrated circuitry and the method of manufacturing the circuitry of the present invention are suitable for fine treatment, high integration, and high reliability. Especially, the present invention is suitable for a DRAM, an electrically reloadable nonvolatile memory or a highly integrated semiconductor circuitry provided with a logic circuit, a DRAM, or an electrically reloadable nonvolatile memory.

What is claimed is:

1. A method for manufacturing a semiconductor integrated circuitry including a first MISFET and a second MISFET, comprising processes of:

(a) forming a gate insulating film on a main surface of a semiconductor substrate on which said first and second MISFETS are formed;

(b) forming plural gate electrodes and a cap insulating film on said gate insulating film;

(c) forming a low density semiconductor area for both said first and second MISFETs, respectively, in a self-matching manner with respect to said gate electrodes;

(d) forming first side wall spacers on side surfaces of said gate electrodes;

(e) forming second side wall spacers outside said first side wall spacers;

(f) forming a high density semiconductor area in a self-matching manner with respect to said second side wall spacers of said second MISFET;

(g) depositing an Interlaminar insulating film comprised of a silicon oxide film over said semiconductor substrate;

(h) etching said interlaminar insulating film and said second side wall spacers in a self-matching manner with respect to said first side wall spacers of said first MISFET to open connecting holes; and (i) forming a conductor in each of said connecting holes.

2. A method for manufacturing a semiconductor integrated circuitry including a first MISFET and a second MISFET, comprising processes of:

(a) forming a gate insulating film on a main surface of a semiconductor substrate on which said first and second MISFETS are formed;

(b) forming plural gate electrodes and a cap insulating film on said gate insulating film;

(c) forming a low density semiconductor area for both said first and second MISFETs, respectively;

(d) depositing a silicon nitride film over said semiconductor substrate including side surfaces of said gate electrodes;

(e) forming side wall spacers on side surfaces of said gate electrodes with said silicon nitride film therebetween;

(f) forming a high density semiconductor area in a self-matching manner with respect to said side wall spacers of said second MISFET;

(g) depositing an interlaminar insulating film comprised of a silicon oxide film over said semiconductor substrate;

(h) etching said interlaminar insulating film and said side wall spacers in a self-matching manner with respect to said silicon nitride film to form openings, and further etching said silicon nitride film at the bottom of each of said openings to open connecting holes; and (i) forming a conductor in each of said connecting holes.

3. A method for manufacturing a semiconductor integrated circuitry, as defined in claim 1, wherein in said process (c), phosphorus is implanted in the semiconductor area of said first MISFET and at least in one or more low density semiconductor areas of said second MISFET is implanted with arsenic.

4. A method for manufacturing a semiconductor integrated circuitry, as defined in claim 1, wherein in said process (a), the gate insulating films are formed for both said first MISFET and said second MISFET in the same process.

5. A method for manufacturing a semiconductor integrated circuitry, as defined in claim 1, wherein said process (a) for forming said gate insulating film includes: a process for forming a first gate insulating film in an area where said first and second MISFETs are formed; a process for removing said first gate insulating film selectively from the area where said second MISFET is formed; and a process for forming a second gate insulating film in an area where said second MISFET is formed.

6. A method for manufacturing a semiconductor integrated circuitry, as defined in claim 1, wherein said gate insulating film is a tunnel insulating film of a floating gate type MISFET comprising a nonvolatile memory and said process for forming said gate insulating film includes; a process for forming floating gate electrodes of said floating gate type MISFET; and a process for forming control electrodes of said floating gate type MISFET on said floating gate electrodes via an insulating film.

7. A method for manufacturing a semiconductor integrated circuitry, as defined in claim 6, wherein prior to said process (a) a process is provided for forming a tunnel insulating film of a floating gate type MISFET comprising a nonvolatile memory on the main surface of said semiconductor substrate and forming floating gate electrodes of said floating gate type MISFET on said tunnel insulating film.

8. A method for manufacturing a semiconductor integrated circuitry, as defined in claim 7, wherein gate electrodes formed in said process (b) are formed in the same process as a process for forming control gate electrodes of said floating gate type MISFET.

9. A method for manufacturing a semiconductor integrated circuitry, as defined in claim 7, wherein said tunnel insulating film is formed thicker than said gate insulating film formed in said process (a).

10. A method for manufacturing a semiconductor integrated circuitry, as defined in claim 1, wherein prior to said process (g), a process is provided for depositing a second silicon nitride film in an area where said second MISFET is formed, etching said interlaminar insulating film in an area where a conductor portion connecting said second MISFET to a member formed in the upper layer of said second MISFET is formed on conditions decided to take an etching selection ratio for said second silicon nitride film to form openings, further etching the second silicon nitride film at the bottom of each of said openings to open connecting holes, and forming said conductor portion.

11. A method for manufacturing a semiconductor integrated circuitry, as defined in claim 10, wherein said second silicon nitride film is formed in the same process as that of a silicon nitride film formed as said first insulating film.

* * * * *